(12) United States Patent
Yasumoto et al.

(10) Patent No.: US 10,388,875 B2
(45) Date of Patent: Aug. 20, 2019

(54) SEPARATION METHOD, LIGHT-EMITTING DEVICE, MODULE, AND ELECTRONIC DEVICE

(71) Applicant: Semiconductor Energy Laboratory Co., Ltd., Atsugi-shi, Kanagawa-ken (JP)

(72) Inventors: Seiji Yasumoto, Tochigi (JP);
Masataka Sato, Tochigi (JP);
Masafumi Nomura, Tochigi (JP);
Toshiyuki Miyamoto, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 0 days.

(21) Appl. No.: 15/728,575

(22) Filed: Oct. 10, 2017

(65) Prior Publication Data

US 2018/0047902 A1    Feb. 15, 2018

Related U.S. Application Data

(62) Division of application No. 14/801,331, filed on Jul. 16, 2015, now Pat. No. 9,799,829.

(30) Foreign Application Priority Data

Jul. 25, 2014    (JP) .................................. 2014-151486

(51) Int. Cl.
*H01L 27/12* (2006.01)
*H01L 51/00* (2006.01)

(52) U.S. Cl.
CPC .... *H01L 51/003* (2013.01); *H01L 2251/5338* (2013.01)

(58) Field of Classification Search
CPC ..................................................... H01L 27/1266
See application file for complete search history.

(56) References Cited

U.S. PATENT DOCUMENTS 4,954,867 A    9/1990 Hosaka
5,821,138 A    10/1998 Yamazaki et al.
(Continued)

FOREIGN PATENT DOCUMENTS

CN    102160178 A    8/2011
JP    10-125931 A    5/1998
(Continued)

*Primary Examiner* — Peniel M Gumedzoe
*Assistant Examiner* — Christopher A Johnson
(74) *Attorney, Agent, or Firm* — Fish & Richardson P.C.

(57) ABSTRACT

A method for manufacturing a flexible semiconductor device is disclosed. The method includes: forming a separation layer of a metal over a substrate; treating the separation layer with plasma under an atmosphere containing nitrogen, oxygen, silicon, and hydrogen; forming a layer over the plasma-treated separation layer, the layer being capable of supplying hydrogen and nitrogen to the separation layer; forming a functional layer over the separation layer; performing heat treatment to promote the release of hydrogen and nitrogen from the layer; and separating the substrate at the separation layer. The method allows the formation of an extremely thin oxide layer over the separation layer, which facilitates the separation, reduces the probability that the oxide layer remains under the layer, and contributes to the increase in efficiency of a device included in the functional layer.

14 Claims, 21 Drawing Sheets

(56) References Cited

U.S. PATENT DOCUMENTS

| | | |
|---|---|---|
| 5,854,123 A | 12/1998 | Sato et al. |
| 5,891,298 A | 4/1999 | Kuroda et al. |
| 6,072,239 A | 6/2000 | Yoneda et al. |
| 6,100,166 A | 8/2000 | Sakaguchi et al. |
| 6,127,199 A | 10/2000 | Inoue et al. |
| 6,265,328 B1 | 7/2001 | Henley et al. |
| 6,326,279 B1 | 12/2001 | Kakizaki et al. |
| 6,372,608 B1 | 4/2002 | Shimoda et al. |
| 6,391,220 B1 | 5/2002 | Zhang et al. |
| 6,452,091 B1 | 9/2002 | Nakagawa et al. |
| 6,509,282 B1 | 1/2003 | Ngo et al. |
| 6,544,430 B2 | 4/2003 | Mccormack et al. |
| 6,592,739 B1 | 7/2003 | Sonoda et al. |
| 6,645,830 B2 | 11/2003 | Shimoda et al. |
| 6,682,963 B2 | 1/2004 | Ishikawa |
| 6,818,530 B2 | 11/2004 | Shimoda et al. |
| 6,849,877 B2 | 2/2005 | Yamazaki et al. |
| 6,946,361 B2 | 9/2005 | Takayama et al. |
| 6,953,735 B2 | 10/2005 | Yamazaki et al. |
| 6,982,181 B2 | 1/2006 | Hideo |
| 7,015,075 B2 | 3/2006 | Fay et al. |
| 7,029,950 B2 | 4/2006 | Yonehara et al. |
| 7,060,153 B2 | 6/2006 | Yamazaki et al. |
| 7,060,591 B2 | 6/2006 | Yamazaki et al. |
| 7,067,392 B2 | 6/2006 | Yamazaki et al. |
| 7,094,665 B2 | 8/2006 | Shimoda et al. |
| 7,122,445 B2 | 10/2006 | Takayama et al. |
| 7,122,447 B2 | 10/2006 | Abe |
| 7,147,740 B2 | 12/2006 | Takayama et al. |
| 7,189,631 B2 | 3/2007 | Yamazaki et al. |
| 7,241,666 B2 | 7/2007 | Goto et al. |
| 7,245,331 B2 | 7/2007 | Yamazaki et al. |
| 7,262,088 B2 | 8/2007 | Kodaira et al. |
| 7,271,076 B2 | 9/2007 | Yamazaki et al. |
| 7,285,476 B2 | 10/2007 | Shimoda et al. |
| 7,332,381 B2 | 2/2008 | Maruyama et al. |
| 7,335,573 B2 | 2/2008 | Takayama et al. |
| 7,351,300 B2 | 4/2008 | Takayama et al. |
| 7,361,573 B2 | 4/2008 | Takayama et al. |
| 7,436,050 B2 | 10/2008 | Yamazaki et al. |
| 7,446,339 B2 | 11/2008 | Yamazaki et al. |
| 7,456,059 B2 | 11/2008 | Kodaira et al. |
| 7,465,674 B2 | 12/2008 | Tamura et al. |
| 7,482,248 B2 | 1/2009 | Tamura |
| 7,495,256 B2 | 2/2009 | Yamazaki et al. |
| 7,536,780 B2 | 5/2009 | Shimizu et al. |
| 7,540,079 B2 | 6/2009 | Okuyama et al. |
| 7,566,633 B2 | 7/2009 | Koyama et al. |
| 7,566,640 B2 | 7/2009 | Yamazaki et al. |
| 7,591,863 B2 | 9/2009 | Watanabe et al. |
| 7,601,236 B2 | 10/2009 | Yamashita et al. |
| 7,608,520 B2 | 10/2009 | Sugita et al. |
| 7,622,361 B2 | 11/2009 | Goto et al. |
| 7,648,862 B2 | 1/2010 | Maruyama et al. |
| 7,704,765 B2 | 4/2010 | Maruyama et al. |
| 7,714,950 B2 | 5/2010 | Yamazaki et al. |
| 7,723,209 B2 | 5/2010 | Maruyama et al. |
| 7,732,263 B2 | 6/2010 | Yamazaki et al. |
| 7,767,543 B2 | 8/2010 | Tateishi et al. |
| 7,820,526 B2 | 10/2010 | Yamada et al. |
| 7,825,002 B2 | 11/2010 | Takayama et al. |
| 7,855,153 B2 | 12/2010 | Ichijo et al. |
| 7,883,989 B2 | 2/2011 | Goto et al. |
| 7,906,784 B2 | 3/2011 | Koyama et al. |
| 7,927,971 B2 | 4/2011 | Tamura et al. |
| 7,968,428 B2 | 6/2011 | Abe |
| 7,994,506 B2 | 8/2011 | Maruyama et al. |
| 8,013,335 B2 | 9/2011 | Yamazaki et al. |
| 8,043,936 B2 | 10/2011 | Eguchi et al. |
| 8,048,770 B2 | 11/2011 | Eguchi et al. |
| 8,048,777 B2 | 11/2011 | Eguchi et al. |
| 8,058,145 B2 | 11/2011 | Tateishi et al. |
| 8,058,146 B2 | 11/2011 | Kuwabara |
| 8,134,153 B2 | 3/2012 | Yamazaki et al. |
| 8,137,417 B2 | 3/2012 | Eguchi et al. |
| 8,228,454 B2 | 7/2012 | Yamazaki et al. |
| 8,247,246 B2 | 8/2012 | Maruyama et al. |
| 8,324,699 B2 | 12/2012 | Ichijo et al. |
| 8,338,198 B2 | 12/2012 | Takayama et al. |
| 8,367,440 B2 | 2/2013 | Takayama et al. |
| 8,415,208 B2 | 4/2013 | Takayama et al. |
| 8,525,171 B2 | 9/2013 | Yamazaki et al. |
| 8,530,335 B2 | 9/2013 | Tamura et al. |
| 8,552,473 B2 | 10/2013 | Tateishi et al. |
| 8,822,996 B2 | 9/2014 | Abe et al. |
| 8,889,438 B2 | 11/2014 | Eguchi et al. |
| 9,054,141 B2 | 6/2015 | Eguchi et al. |
| 9,093,324 B2 | 7/2015 | Yamazaki et al. |
| 9,472,429 B2 | 10/2016 | Eguchi et al. |
| 9,735,163 B2 | 8/2017 | Abe et al. |
| 2003/0022403 A1 | 1/2003 | Shimoda et al. |
| 2003/0032210 A1 | 2/2003 | Takayama et al. |
| 2004/0209442 A1 | 10/2004 | Takakuwa et al. |
| 2004/0256618 A1 | 12/2004 | Imai et al. |
| 2005/0176180 A1 | 8/2005 | Fay et al. |
| 2005/0229370 A1 | 10/2005 | Kobayashi |
| 2005/0266591 A1 | 12/2005 | Hideo |
| 2006/0011288 A1 | 1/2006 | Watanabe et al. |
| 2006/0131069 A1 | 6/2006 | Shimizu et al. |
| 2006/0199382 A1 | 9/2006 | Sugiyama et al. |
| 2006/0216909 A1 | 9/2006 | Yamazaki et al. |
| 2007/0001167 A1 | 1/2007 | Nomura |
| 2007/0010067 A1 | 1/2007 | Shimoda et al. |
| 2007/0045621 A1 | 3/2007 | Suzuki et al. |
| 2007/0078228 A1 | 4/2007 | Tateishi et al. |
| 2007/0147129 A1 | 6/2007 | Kato |
| 2007/0181246 A1 | 8/2007 | Yamashita et al. |
| 2007/0196999 A1 | 8/2007 | Tamura et al. |
| 2007/0243352 A1 | 10/2007 | Takayama et al. |
| 2007/0262403 A1 | 11/2007 | Tsurume |
| 2008/0011420 A1 | 1/2008 | Yoshizawa et al. |
| 2008/0042168 A1 | 2/2008 | Watanabe et al. |
| 2008/0044940 A1 | 2/2008 | Watanabe et al. |
| 2008/0074273 A1 | 3/2008 | Endo et al. |
| 2008/0113486 A1 | 5/2008 | Eguchi et al. |
| 2008/0132033 A1 | 6/2008 | Eguchi et al. |
| 2008/0259575 A1 | 10/2008 | Tanimura et al. |
| 2009/0023251 A1 | 1/2009 | Eguchi et al. |
| 2009/0117716 A1* | 5/2009 | Shimomura ...... H01L 21/76254 438/487 |
| 2009/0203174 A1* | 8/2009 | Ichijo ................. C23C 16/02 438/151 |
| 2009/0321004 A1 | 12/2009 | Takayama et al. |
| 2010/0072474 A1 | 3/2010 | Abe et al. |
| 2010/1007261 | 3/2010 | Oikawa et al. |
| 2010/0096090 A1 | 4/2010 | Yoshioka et al. |
| 2010/0293782 A1 | 11/2010 | Yamazaki et al. |
| 2011/0175102 A1 | 7/2011 | Hatano |
| 2012/0217501 A1 | 8/2012 | Takayama et al. |
| 2012/0235137 A1 | 9/2012 | Koezuka et al. |
| 2012/0295375 A1 | 11/2012 | Yamazaki et al. |
| 2013/0029447 A1 | 1/2013 | Maruyama et al. |
| 2013/0214324 A1 | 8/2013 | Takayama et al. |
| 2013/0228774 A1 | 9/2013 | Okazaki et al. |
| 2013/0323912 A1 | 12/2013 | Tamura et al. |
| 2014/0234664 A1* | 8/2014 | Yasumoto ......... H01L 21/6836 428/698 |
| 2014/0347490 A1 | 11/2014 | Takayama et al. |
| 2015/0017751 A1 | 1/2015 | Eguchi et al. |
| 2015/0140713 A1 | 5/2015 | Eguchi et al. |

FOREIGN PATENT DOCUMENTS

| | | |
|---|---|---|
| JP | 2001-331120 A | 11/2001 |
| JP | 2003-174153 A | 6/2003 |
| JP | 2005-079553 A | 3/2005 |
| JP | 2006-135305 A | 5/2006 |
| JP | 2006-202820 A | 8/2006 |
| JP | 2006-216891 A | 8/2006 |
| JP | 2006-259095 A | 9/2006 |
| JP | 2007-013128 A | 1/2007 |
| JP | 2007-098565 A | 4/2007 |
| JP | 2009-117688 A | 5/2009 |
| JP | 2010-098297 A | 4/2010 |

(56) References Cited

FOREIGN PATENT DOCUMENTS

| | | |
|---|---|---|
| KR | 2005-0048517 A | 5/2005 |
| KR | 2011-0081983 A | 7/2011 |
| TW | 200830542 | 7/2008 |
| TW | 201021198 | 6/2010 |
| WO | WO-2010/032599 | 3/2010 |

\* cited by examiner

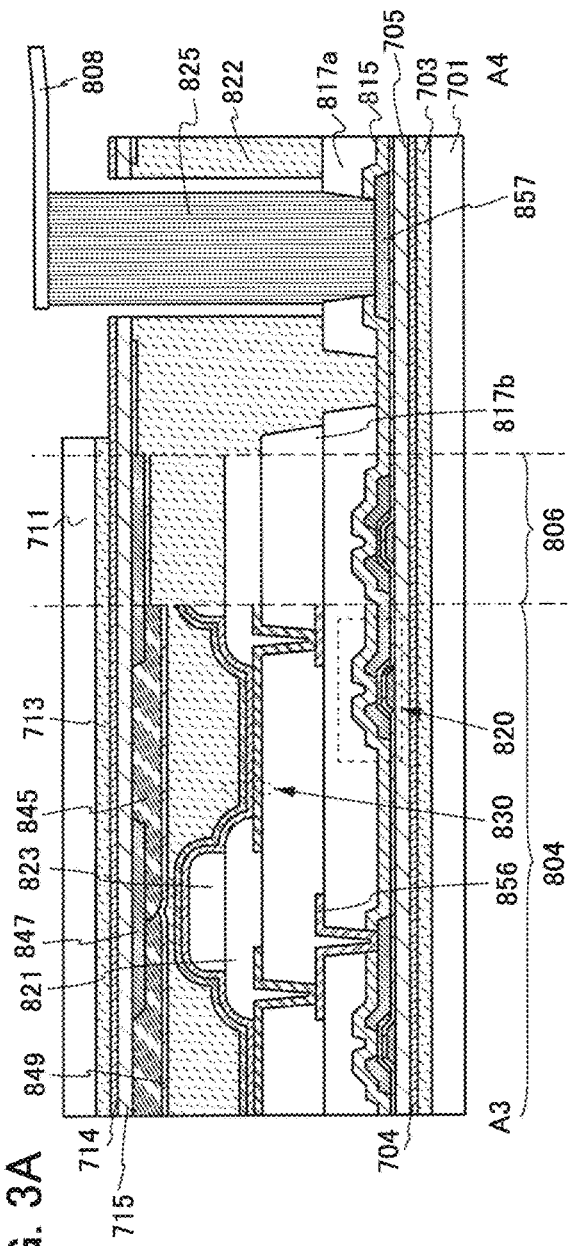
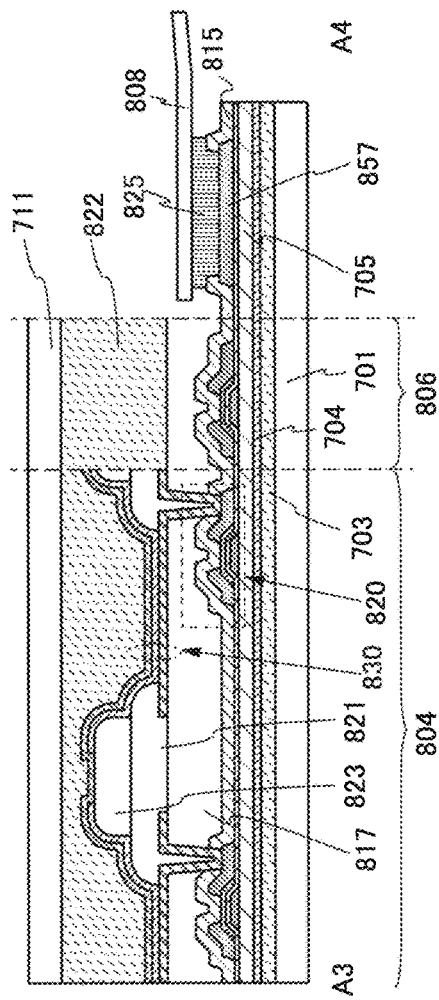
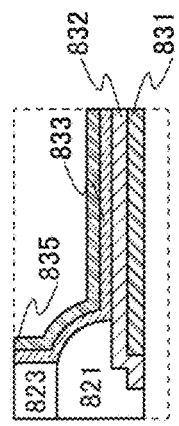
FIG. 3A
FIG. 3B
FIG. 3C

FIG. 11C1
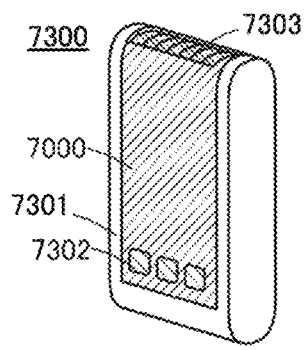
FIG. 11C2
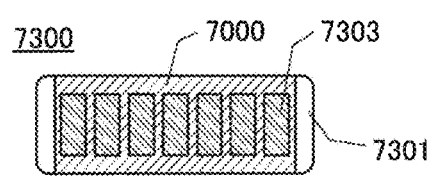
FIG. 11D
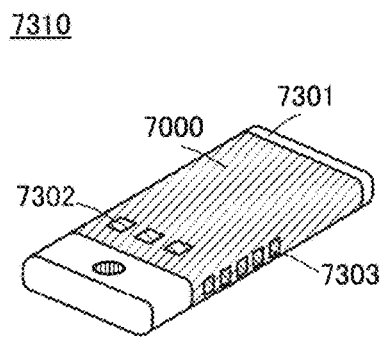
FIG. 11E
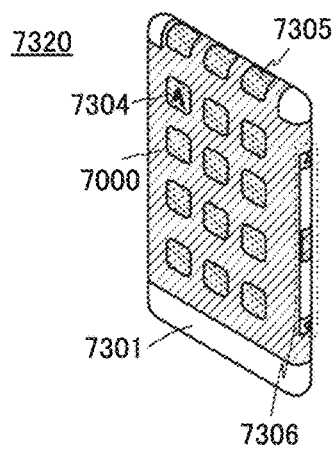
FIG. 11F
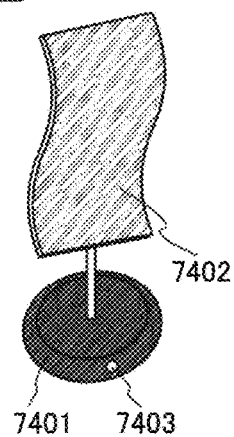
FIG. 11G
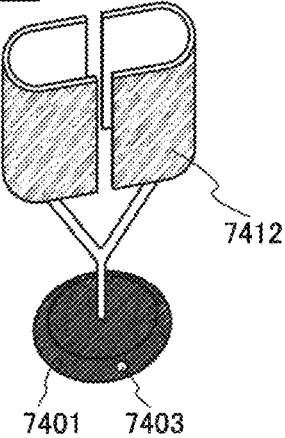
FIG. 11H
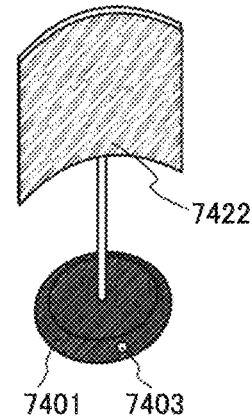

FIG. 12A1
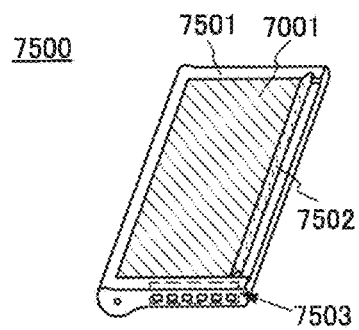
FIG. 12A2
FIG. 12B
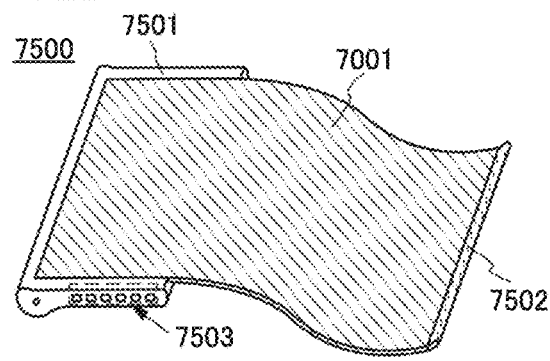
FIG. 12C
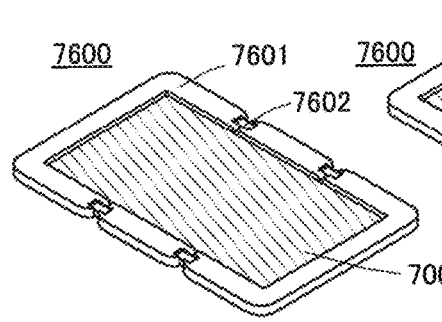
FIG. 12D
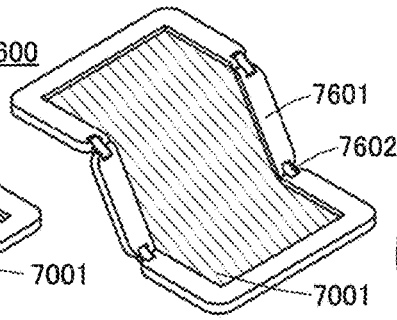
FIG. 12E
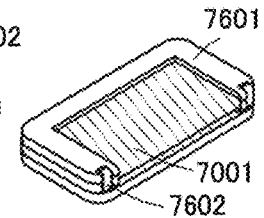

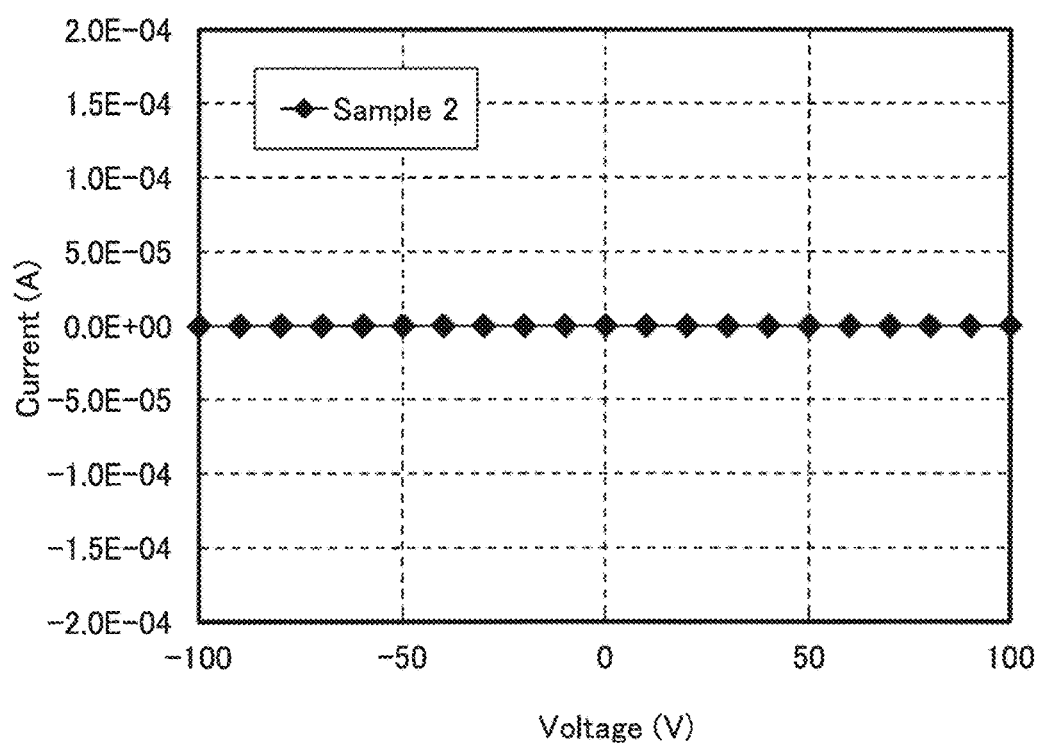

SEPARATION METHOD, LIGHT-EMITTING DEVICE, MODULE, AND ELECTRONIC DEVICE

CROSS-REFERENCE TO RELATED APPLICATIONS

This application is a divisional of U.S. application Ser. No. 14/801,331, filed Jul. 16, 2015, now allowed, which claims the benefit of a foreign priority application filed in Japan as Serial No. 2014-151486 on Jul. 25, 2014, both of which are incorporated by reference.

BACKGROUND OF THE INVENTION

1. Field of the Invention

One embodiment of the present invention relates to a separation method, a method for manufacturing a device including a separation process, a light-emitting device, an input-output device, a module, and an electronic device.

Note that one embodiment of the present invention is not limited to the above technical field. Specifically, examples of the technical field of one embodiment of the present invention disclosed in this specification include a semiconductor device, a display device, a light-emitting device, a power storage device, a storage device, an electronic device, a lighting device, an input device (e.g., a touch sensor), an input-output device (e.g., a touch panel), a driving method thereof, and a manufacturing method thereof.

2. Description of the Related Art

In recent years, a flexible device in which a functional element such as a semiconductor element, a display element, or a light-emitting element is provided over a substrate having flexibility (hereinafter referred to as a flexible substrate) has been developed. Typical examples of the flexible device include, as well as a lighting device and an image display device, a variety of semiconductor circuits including a semiconductor element such as a transistor.

As a method for fabricating a device including a flexible substrate, a technique has been developed in which a functional element such as a thin film transistor or an organic EL element is formed over a formation substrate (e.g., a glass substrate or a quartz substrate), and then the functional element is transferred to a flexible substrate. This technique needs a step of separating a layer including the functional element from the formation substrate (referred to as a separation step).

For example, Patent Document 1 discloses the following separation technique using laser ablation: a separation layer formed of amorphous silicon or the like is formed over a substrate, a layer to be separated that includes a thin film element is formed over the separation layer, and the layer to be separated is bonded to a transfer body with the use of an adhesive layer. The separation layer is ablated by laser light irradiation, so that separation is caused in the separation layer.

Patent Document 2 discloses a technique in which separation is conducted by physical force with human hands or the like. Patent Document 2 discloses the following separation technique: a metal layer is formed between a substrate and an oxide layer, and separation is caused at the interface between the oxide layer and the metal layer by utilizing a weak bond between the oxide layer and the metal layer, whereby a layer to be separated and the substrate are separated from each other.

REFERENCE

Patent Document

Patent Document 1: Japanese Published Patent Application No. H10-125931
Patent Document 2: Japanese Published Patent Application No. 2003-174153

SUMMARY OF THE INVENTION

When the separation does not readily take place in a separation process, it is necessary to apply high stress to a layer to be separated, so that a crack might be generated in a layer included in the layer to be separated and a functional element might be damaged.

One object of one embodiment of the present invention is to improve yield in a separation process.

Another object of one embodiment of the present invention is to improve the yield of a manufacturing process of a device such as a light-emitting device, a display device, a semiconductor device, an input-output device, an electronic device, or a lighting device. In particular, another object of one embodiment of the present invention is to improve yield in a manufacturing process of a device such as a light-emitting device, a display device, a semiconductor device, an input-output device, an electronic device, or a lighting device which is lightweight, thin, or flexible.

Another object of one embodiment of the present invention is to provide a separation method with high separability. Another object of one embodiment of the present invention is to provide a method for manufacturing a device with high productivity.

Another object of one embodiment of the present invention is to provide a highly reliable light-emitting device or the like. Another object of one embodiment of the present invention is to provide a light-emitting device or the like with high light extraction efficiency.

Note that the descriptions of these objects do not disturb the existence of other objects. In one embodiment of the present invention, there is no need to achieve all the objects. Other objects will be apparent from and can be derived from the description of the specification, the drawings, the claims, and the like.

One embodiment of the present invention is a separation method including a first step of forming a separation layer over a substrate, a second step of performing plasma treatment on a surface of the separation layer, a third step of forming a layer to be separated over the separation layer, a fourth step of heating the separation layer and the layer to be separated, and a fifth step of separating the separation layer and the layer to be separated from each other. The plasma treatment is performed under an atmosphere containing nitrogen, oxygen, silicon, and hydrogen.

In the above method, the plasma treatment is preferably performed under an atmosphere containing nitrous oxide and silane.

In the above method, the plasma treatment is preferably performed under an atmosphere containing nitrous oxide, silane, and ammonia.

In each of the above methods, an oxide layer is preferably formed on the surface of the separation layer by plasma treatment in the second step. For example, the separation layer may be formed using tungsten in the first step, and an oxide layer containing tungsten and oxygen may be formed by the plasma treatment in the second step.

One embodiment of the present invention is a light-emitting device including a first substrate, a first bonding layer, a first oxide layer, a first insulating layer, and an element layer, which are stacked in this order. The first substrate is flexible. The element layer contains a light-emitting element. The stack of the first substrate, the first bonding layer, the first oxide layer, and the first insulating layer has an average transmittance of 70% or more and 100% or less with respect to light in a wavelength range of 450 nm to 700 nm. The average transmittance is preferably 80% or more.

In the above structure, the intensity of a first peak attributed to a W 4f orbital measured by X-ray photoelectron spectroscopy performed on a surface of the first oxide layer on the first bonding layer side is preferably 0.60 times or more and the 1.0 time or less the intensity of a second peak attributed to the W 4f orbital, more preferably 0.70 times or more the intensity of the second peak, still more preferably 0.75 times or more the intensity of the second peak attributed to the W 4f orbital. Note that the first peak preferably has the highest intensity among the peaks derived from tungsten oxide $WO_x$ ($2 \leq x < 3$) and tungsten nitride. The second peak has the highest intensity among the peaks derived from tungsten(VI) oxide (also referred to as tungsten trioxide or $WO_3$). As $WO_x$ ($2 \leq x < 3$), $WO_2$, $W_2O_5$, $W_4O_{11}$, and the like are given.

In the above structure, the intensity of a third peak attributed to the W 4f orbital measured by the X-ray photoelectron spectroscopy performed on the surface of the first oxide layer on the first bonding layer side is preferably higher than a fourth peak attributed to the W 4f orbital, more preferably 1.30 times or more and 2.0 times or less the intensity of the fourth peak. Note that the third peak has the highest intensity among the peaks derived from tungsten oxide $WO_x$ ($2 \leq x < 3$) and tungsten nitride. The fourth peak has the second highest intensity among the peaks derived from tungsten(VI) oxide.

In each of the above structures, a thickness of the first oxide layer may be greater than or equal to 1 nm and less than 5 nm.

In each of the above structures, a resistivity of the first oxide layer may be greater than or equal to $1.0 \times 10^4$ $\Omega \cdot m$ and less than or equal to $1.0 \times 10^{15}$ $\Omega \cdot m$.

In each of the above structures, the first insulating layer may include a region with a hydrogen concentration of greater than or equal to $1.0 \times 10^{20}$ atoms/cm$^3$ and less than or equal to $1.0 \times 10^{22}$ atoms/cm$^3$, which is measured by secondary ion mass spectrometry (SIMS).

In each of the above structures, the first insulating layer may include a region with a nitrogen concentration of greater than or equal to $5.0 \times 10^{20}$ atoms/cm$^3$ and less than or equal to $1.0 \times 10^{23}$ atoms/cm$^3$, which is measured by SIMS.

In each of the above structures, the light-emitting device may include a second substrate, a second bonding layer, a second oxide layer, and a second insulating layer, which are stacked in this order. The second substrate is flexible. The element layer is provided between the first insulating layer and the second insulating layer. The second insulating layer is provided between the second oxide layer and the element layer. The stack of the second substrate, the second bonding layer, the second oxide layer, and the second insulating layer may have an average transmittance of 70% or more and 100% or less with respect to light in the wavelength range of 450 nm to 700 nm. The average transmittance is preferably 80% or more.

Furthermore, in the above structure, the intensity of a fifth peak attributed to the W 4f orbital measured by the X-ray photoelectron spectroscopy performed on a surface of the second oxide layer on the second bonding layer side may be 0.60 times or more and 1.0 times or less the intensity of a sixth peak attributed to the W 4f orbital, preferably 0.70 times or more the intensity of the sixth peak, more preferably 0.75 times or more the intensity of the sixth peak. Note that the fifth peak has the highest intensity among peaks derived from tungsten oxide ($WO_x$ ($2 \leq x < 3$)) and tungsten nitride. The sixth peak has the highest intensity among peaks derived from tungsten(VI) oxide.

In the above structure, the intensity of a seventh peak attributed to the W 4f orbital measured by the X-ray photoelectron spectroscopy performed on a surface of the second oxide layer on the second bonding layer side may be higher than an eighth peak attributed to the W 4f orbital, preferably 1.30 times or more and 2.0 times or less the intensity of the eighth peak. Note that the seventh peak has the highest intensity among peaks derived from tungsten oxide ($WO_x$ ($2 \leq x < 3$)) and tungsten nitride. The eighth peak has the second highest intensity among peaks derived from tungsten(VI) oxide.

In each of the above structures, a thickness of the second oxide layer may be greater than or equal to 1 nm and less than 5 nm.

In each of the above structures, a resistivity of the second oxide layer may be greater than or equal to $1.0 \times 10^4$ $\Omega \cdot m$ and less than or equal to $1.0 \times 10^{15}$ $\Omega \cdot m$.

In each of the above structures, the second insulating layer may include a region with a hydrogen concentration of greater than or equal to $1.0 \times 10^{20}$ atoms/cm$^3$ and less than or equal to $1.0 \times 10^{22}$ atoms/cm$^3$, which is measured by SIMS.

In each of the above structures, the second insulating layer may include a region with a nitrogen concentration of greater than or equal to $5.0 \times 10^{20}$ atoms/cm$^3$ and less than or equal to $1.0 \times 10^{23}$ atoms/cm$^3$, which is measured by SIMS.

One embodiment of the present invention also includes devices such as a display device, a semiconductor device, and an input-output device to which any of the above structures is applied. These devices include different functional elements in functional layers. For example, the display device of one embodiment of the present invention includes a display element as the functional element. The semiconductor device of one embodiment of the present invention includes a semiconductor element as the functional element. The input-output device of one embodiment of the present invention includes a light-emitting element or a display element, and a sensor element or a touch sensor as the functional elements.

One embodiment of the present invention is a module including a light-emitting device, a display device, a semiconductor device, or an input-output device to which any of the above structures is applied and to which a connector such as a flexible printed circuit (FPC) and a tape carrier package (TCP) is provided or an IC is mounted with a chip on glass (COG) method and the like.

One embodiment of the present invention is an electronic device or a lighting device including the above module. For example, one embodiment of the present invention is an electronic device including the module and any of an antenna, a battery, a housing, a speaker, a microphone, an operation switch, and an operation button.

One embodiment of the present invention can improve the yield of a separation process.

One embodiment of the present invention can improve the yield of a manufacturing process of a light-emitting device, a display device, a semiconductor device, an input-output device, an electronic device, a lighting device, or the like. In particular, the yield of a manufacturing process of a device such as a light-emitting device, a display device, a semiconductor device, an input-output device, an electronic device, or a lighting device which is lightweight, thin, or flexible can be improved.

One embodiment of the present invention can provide a separation method of high separability. One embodiment of the present invention can provide a method for manufacturing a device with high productivity.

One embodiment of the present invention can provide a highly reliable light-emitting device or the like. One embodiment of the present invention can provide a light-emitting device or the like with high light extraction efficiency.

Note that the description of these effects does not disturb the existence of other effects. One embodiment of the present invention does not necessarily achieve all the objects listed above. Other effects will be apparent from and can be derived from the description of the specification, the drawings, and the claims.

BRIEF DESCRIPTION OF THE DRAWINGS

FIGS. 3A to 3C illustrate an example of a light-emitting device.
FIGS. 11A, 11B, 11C1, 11C2, 11D, 11E, 11F, 11G, and 11H illustrate examples of electronic devices and lighting devices.
FIGS. 12A1, 12A2, 12B, 12C, 12D, 12E, 12F, 12G, 12H, and 12I illustrate examples of electronic devices.
FIG. 18 shows current-voltage characteristics of samples according to Example 1.

DETAILED DESCRIPTION OF THE INVENTION

Figure 1A:
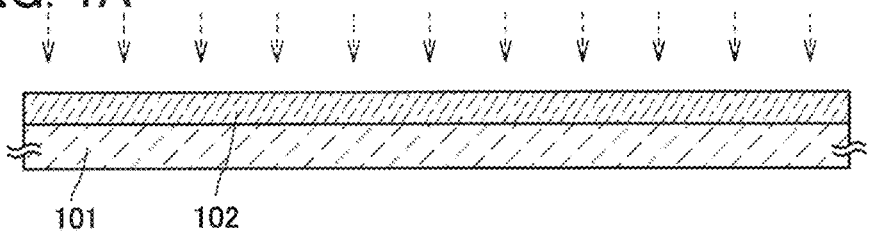
FIGS. 1A to 1E illustrate an example of a separation method.

Embodiments will be described in detail with reference to the accompanying drawings. Note that the present invention is not limited to the description below, and it is easily understood by those skilled in the art that various changes and modifications can be made without departing from the spirit and scope of the present invention. Therefore, the present invention should not be construed as being limited to the description in the following embodiments.

Note that in the structures of the invention described below, the same portions or portions having similar functions are denoted by the same reference numerals in different drawings, and description of such portions is not repeated. The same hatching pattern is applied to portions having similar functions, and the portions are not especially denoted by reference numerals in some cases.

The position, size, range, or the like of each structure illustrated in drawings is not accurately represented in some cases for easy understanding. Therefore, the disclosed invention is not necessarily limited to the position, the size, the range, or the like disclosed in the drawings.

The terms "film" and "layer" can be interchanged with each other depending on the case or circumstances. For example, the term "conductive layer" can be changed into the term "conductive film". Also, the term "insulating film" can be changed into the term "insulating layer".

(Embodiment 1)

In this embodiment, a separation method of one embodiment of the present invention will be described.

In one embodiment of the present invention, a separation layer is formed over a formation substrate. A surface of the separation layer is subjected to plasma treatment, and a layer to be separated is formed over the separation layer to which the plasma treatment has been subjected. Then, the separation layer and the layer to be separated are heated, and the separation layer and the layer to be separated are separated from each other.

In one embodiment of the present invention, the plasma treatment is performed under an atmosphere containing nitrous oxide ($N_2O$) and silane ($SiH_4$). By performing plasma treatment under the atmosphere containing nitrous oxide, the surface of the separation layer is oxidized, so that an oxide layer is formed. The oxide layer includes an oxide of a material contained in the separation layer. In the case where tungsten is included in the separation layer, an oxide layer containing tungsten oxide is formed.

After the separation layer and the layer to be separated are separated from each other, part of the oxide layer including a metal oxide such as tungsten oxide could remain on the separated layer. In the case where the oxide layer has a low transmitting property with respect to visible light, light extraction efficiency of a light-emitting device or a display device is decreased. Additionally, an oxide having conductivity might generate parasitic capacitance to affect characteristics of the semiconductor element.

Therefore, in one embodiment of the present invention, the plasma treatment is performed under an atmosphere containing not only nitrous oxide but also silane. By using silane, the oxidation of the surface of the separation layer with nitrous oxide can be controlled. Thus, the thickness of the oxide layer formed on the surface of the separation layer can be decreased. Note that the oxide layer may be formed in a thin film such that the cross section thereof cannot be easily observed with an electron microscope or the like. When the oxide layer is very thin, decrease in light extraction of the light-emitting device or the display device can be suppressed. Alternatively, variation in the characteristics of the semiconductor element can be suppressed.

When plasma treatment is performed under the atmosphere containing nitrous oxide and silane, a film (e.g., a silicon oxynitride film or a silicon nitride oxide film) is formed over the separation layer by silane at the same as the surface of the separation layer is oxidized by nitrous oxide. A film is formed over the separation layer, whereby oxidization of the separation layer is controlled. In that case, the oxide layer with a small thickness can be formed on the surface of the separation layer.

The layer to be separated preferably includes a first layer over the separation layer and a second layer over the first layer.

The first layer can release hydrogen in a heating step. Hydrogen is released from the first layer by heat treatment, whereby hydrogen is supplied to the oxide layer.

The first layer may release not only hydrogen but also nitrogen in the heating step. When nitrogen is released from the first layer by heat treatment, nitrogen is supplied to the oxide layer.

The second layer can block hydrogen. The second layer may block hydrogen and nitrogen. The second layer prevents the hydrogen (and nitrogen) released from the first layer from being supplied to the layer to be separated. Simultaneously, the hydrogen (and nitrogen) can be supplied to the oxide layer efficiently.

The oxide in the oxide layer is reduced by hydrogen supplied to the oxide layer, so that plural kinds of oxides with different proportions of oxygen are mixed in the oxide layer. For example, in the case where tungsten is included in the separation layer, $WO_3$ formed by plasma treatment is reduced to generate $WO_x$ ($2<x<3$) and $WO_2$ with proportion of oxygen lower than that of $WO_3$, leading to a state where $WO_3$ and the oxides with lower proportions of oxygen are mixed. The crystal structure of such a mixed metal oxide depends on the proportion of oxygen; thus, the mechanical strength of the oxide layer is reduced. As a result, the oxide layer is likely to be damaged inside, so that the separability in a later separation step can be improved.

In addition, a compound containing nitrogen and a material in the separation layer is generated by supplying nitrogen to the oxide layer. Such a compound further reduces the mechanical strength of the oxide layer, so that the separability can be improved. In the case where a metal is included in the separation layer, a compound (a metal nitride) containing the metal and nitrogen is generated in the oxide layer. For example, in the case where tungsten is included in the separation layer, tungsten nitride is generated in the oxide layer.

As the amount of hydrogen supplied to the oxide layer is larger, $WO_3$ is more likely to be reduced, which facilitates the formation of the state where plural kinds of oxides with different proportions of oxygen are mixed in the oxide layer. Therefore, the force required for the separation can be reduced. As the amount of nitrogen supplied to the oxide layer is larger, the mechanical strength of the oxide layer can be reduced and the force required for the separation can be reduced. The thickness of the first layer is preferably large for increase in the amount of released hydrogen (and nitrogen). On the other hand, it is preferred that the first layer has a small thickness because the productivity is increases.

Hence, in one embodiment of the present invention, plasma treatment is preferably performed under an atmosphere containing not only nitrous oxide and silane but also ammonia ($NH_3$). In that case, the amount of hydrogen and that of nitrogen required to be supplied from the first layer can be reduced, so that the thickness of the first layer can be reduced. Thus, productivity and separability are both improved. This is probably because hydrogen and nitrogen are supplied to the oxide layer when plasma treatment is performed under the atmosphere containing nitrous oxide, silane, and ammonia.

After the separation layer and the layer to be separated are separated from each other, an analysis using X-ray photoelectron spectroscopy (XPS) or the like is performed on the surface of the exposed surfaces of the separation layer and the separated layer, whereby the existence of oxide and nitrogen can be confirmed. That is, even if the oxide layer cannot be easily found in the cross section observed with an electron microscope or the like, the oxide layer can be observed by XPS or the like.

For example, when XPS analysis is performed on the surface of the separated layer, three peaks (peaks A, B, and C) attributed to the W 4f orbital are observed. The peak A has the highest intensity and is derived from $WO_3$. The peak B has the second highest intensity among the peaks derived from $WO_3$. The peak B appears on the higher energy side than the peak A (by 5 eV or less). The peak C has the highest intensity among peaks derived from $WO_x$ ($2<x<3$), $WO_2$, and tungsten nitride. The peak C is located on the lower energy side than the peak A (by 4 eV or less).

Specifically, a peak in the range of greater than or equal to 34.5 eV and less than or equal to 36.5 eV (corresponding to the peak A) and a peak in the range of greater than or equal to 37.5 eV and less than or equal to 39.5 eV (corresponding to the peak B) are derived from $WO_3$. A peak in the range of greater than or equal to 32.5 eV and less than 34.5 eV (corresponding to the peak C) is derived from $WO_x$ ($2<x<3$), $WO_2$, or tungsten nitride.

The intensity of the peak C is preferably 0.60 times or more the intensity of the peak A. The peak C more preferably has 0.70 or more times the intensity of the peak A, still more preferably 0.75 or more times the intensity of the peak A. In the case where the peak C has lower intensity than the peak A, a decrease in intensity between peaks A and C leads to a reduction in the force required for the separation. The peak C may have higher intensity than the peak A.

Alternatively, the peak C preferably has higher intensity than the peak B. This is because the force required for the separation is reduced.

When the resistance of the exposed surface of the separated layer is measured after the separation of the separation layer and the layer to be separated, a sufficient insulating property can be observed. For example, as will be described later in Example 1, a pair of electrodes is formed over the exposed separated layer and the current-voltage characteristics between a pair of electrodes are obtained, whereby the resistance of the surface of the separated layer can be obtained. The resistance of the surface of the separated layer is preferably greater than or equal to $1.0 \times 10^{10} \Omega$ and less than or equal to $1.0 \times 10^{14} \Omega$, and more preferably greater than or equal to $1.0 \times 10^{12} \Omega$ and less than or equal to $1.0 \times 10^{14} \Omega$. Note that the resistance may be greater than $1.0 \times 10^{14} \Omega$.

The resistivity of the oxide layer is greater than or equal to $1.0 \times 10^4$ $\Omega \cdot m$ and less than or equal to $1.0 \times 10^{15}$ $\Omega \cdot m$, preferably greater than or equal to $1.0 \times 10^6$ $\Omega \cdot m$ and less than or equal to $1.0 \times 10^{15}$ $\Omega \cdot m$. Note that the resistivity of the oxide layer may be greater than $1.0 \times 10^{15}$ $\Omega \cdot m$.

Hereinafter, the separation method of one embodiment of the present invention is described in more detail using FIGS. 1A to 1E. Note that although the oxide layer is illustrated in drawings used for the explanation in each embodiment (see an oxide layer 111 illustrated in FIG. 1B or the like, and an oxide layer 704 and an oxide layer 714 illustrated in FIG. 2C or the like), the oxide layer formed in one embodiment of the present invention is extremely thin as described above.

Therefore, the oxide layer cannot be easily found by visual recognition or a cross-sectional observation in some cases.

[First Step]

First, a separation layer 102 is formed over a formation substrate 101 (see FIG. 1A).

As the formation substrate 101, a substrate having at least heat resistance high enough to withstand process temperature in a fabrication process is used. As the formation substrate 101, for example, a glass substrate, a quartz substrate, a sapphire substrate, a semiconductor substrate, a ceramic substrate, a metal substrate, or a plastic substrate can be used.

It is preferable to use a large-sized glass substrate as the formation substrate 101 in terms of productivity. For example, a glass substrate having a size greater than or equal to the 3rd generation (550 mm×650 mm) and less than or equal to the 10th generation (2950 mm×3400 mm) or a glass substrate having a larger size than the 10th generation is preferably used.

In the case where a glass substrate is used as the formation substrate 101, a base film is preferably formed between the formation substrate 101 and the separation layer 102 because contamination from the glass substrate can be prevented. Examples of the base film include insulating films such as a silicon oxide film, a silicon oxynitride film, a silicon nitride film, and a silicon nitride oxide film.

As the separation layer 102, an inorganic material can be used. Examples of the inorganic material include a metal, an alloy, a compound, and the like that contain any of the following elements: tungsten, molybdenum, titanium, tantalum, niobium, nickel, cobalt, zirconium, zinc, ruthenium, rhodium, palladium, osmium, iridium, and silicon. A crystal structure of a layer containing silicon may be amorphous, microcrystal, or polycrystal.

The separation layer 102 is preferably formed using a high-melting point metal such as tungsten, titanium, or molybdenum, in which case the degree of freedom of the process for forming the layer to be separated can be increased.

In the case where the separation layer 102 has a single-layer structure, a tungsten layer, a molybdenum layer, or a layer containing a mixture of tungsten and molybdenum is preferably formed. A mixture of tungsten and molybdenum is an alloy of tungsten and molybdenum, for example. For example, an alloy film of molybdenum and tungsten with an atomic ratio of Mo:W=3:1, 1:1, or 1:3 may be used. The alloy film of molybdenum and tungsten can be formed by a sputtering method using a metal target with a composition of Mo:W=49:51, 61:39, or 14.8:85.2 (wt %), for example.

The separation layer 102 can be formed by, for example, a sputtering method, a chemical vapor deposition (CVD) method (e.g., a plasma CVD method, a thermal CVD method, or a metal organic CVD (MOCVD) method), an atomic layer deposition (ALD) method, a coating method (e.g., a spin coating method, a droplet discharge method, or a dispensing method), a printing method, or an evaporation method.

The thickness of the separation layer 102 is greater than or equal to 1 nm and less than or equal to 1000 nm, preferably greater than or equal to 10 nm and less than or equal to 200 nm, more preferably greater than or equal to 10 nm and less than or equal to 100 nm.

In this embodiment, the separation layer 102 is formed using tungsten.

[Second Step]

Next, plasma treatment is performed on a surface of the separation layer 102 (see the arrows indicated by dotted lines in FIG. 1A).

The adhesion between the separation layer 102 and the layer to be separated which is formed later can be controlled by changing the state of the surface of the separation layer 102.

As described above, in one embodiment of the present invention, the plasma treatment is performed under the atmosphere containing nitrous oxide and silane. Thus, the oxide layer 111 of a material included in the separation layer 102 can be formed on the surface of the separation layer 102. By this method, a very thin oxide layer 111 can be formed.

The plasma treatment is preferably performed under an atmosphere containing nitrous oxide, silane, and ammonia. In that case, the force required for separating the separation layer 102 and a layer 110 to be separated from each other in a fifth step can be reduced, improving the yield of the process.

Figure 1B:
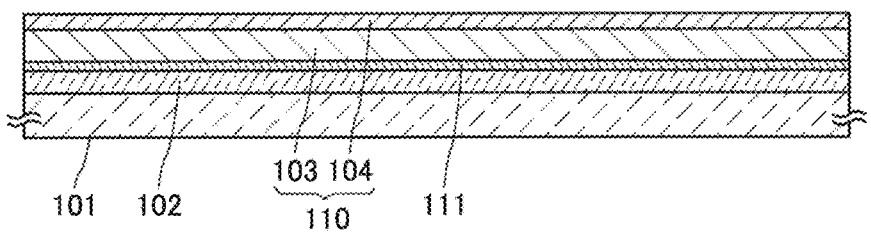

The surface of the separation layer 102 is oxidized by the plasma treatment, whereby the oxide layer 111 is formed (see FIG. 1B).

The oxide layer 111 contains an oxide of the material contained in the separation layer. In the case where a metal is included in the separation layer 102, the oxide layer 111 contains an oxide of the metal contained in the separation layer 102. The oxide layer 111 preferably contains tungsten oxide, titanium oxide, or molybdenum oxide.

Tungsten oxide is generally represented by $WO_x$ ($2 \leq x < 3$) and can exist as a non-stoichiometric compound which can have a variety of compositions, typically $WO_3$, $W_2O_5$, $W_4O_{11}$, and $WO_2$. Titanium oxide and molybdenum oxide are also capable of existing as non-stoichiometric compounds.

In this embodiment, the oxide layer 111 contains tungsten oxide.

The thickness of the oxide layer 111 is greater than or equal to 1 nm and less than 5 nm, preferably greater than or equal to 1 nm and less than or equal to 3 nm. The thickness of the oxide layer 111 may be less than 1 nm. As described above, the oxide layer 111 with an extremely small thickness is not easily observed in a cross-sectional image.

The oxide layer 111 at this stage preferably contains a large amount of oxygen. For example, in the case where tungsten is used for the separation layer 102, the oxide layer 111 is preferably a tungsten oxide layer containing $WO_3$ as its main component.

Since the oxide layer 111 is formed by the plasma treatment in one embodiment of the present invention, the thickness of the oxide layer 111 can vary depending on the conditions for the plasma treatment. Note that in one embodiment of the present invention, disilane or trisilane may be used instead of silane.

[Third Step]

Next, the layer 110 to be separated is formed over the separation layer 102 (and the oxide layer 111). Specifically, a first layer 103 is formed over the separation layer 102 (and the oxide layer 111), and a second layer 104 is formed over the first layer 103 (see FIG. 1B).

The first layer 103 can be formed using a silicon oxide film, a silicon nitride film, a silicon oxynitride film, or a silicon nitride oxide film, for example. The first layer 103 preferably contains oxygen, nitrogen, and silicon.

Note that in this specification and the like, "silicon oxynitride" contains more oxygen than nitrogen, meanwhile "silicon nitride oxide" contains more nitrogen than oxygen.

It is preferred that the first layer 103 further contain hydrogen. As described above, the first layer 103 has a function of releasing hydrogen in a later heating step. The first layer 103 may further have a function of releasing hydrogen and nitrogen in the later heating step. Note that the oxide layer 111 and the first layer 103 are not necessarily in contact with each other, and another layer may be provided between the oxide layer 111 and the first layer 103.

The first layer 103 preferably includes a region where a hydrogen concentration, which is measured by SIMS, is $1.0 \times 10^{20}$ atoms/cm$^3$ or more and $1.0 \times 10^{22}$ atoms/cm$^3$ or less, preferably $5.0 \times 10^{20}$ atoms/cm$^3$ or more and $5.0 \times 10^{21}$ atoms/cm$^3$ or less.

The first layer 103 includes a region where a nitrogen concentration, which is measured by SIMS, is $5.0 \times 10^{20}$ atoms/cm$^3$ or more and $1.0 \times 10^{23}$ atoms/cm$^3$ or less, preferably $1.0 \times 10^{21}$ atoms/cm$^3$ or more and $5.0 \times 10^{22}$ atoms/cm$^3$ or less.

The first layer 103 can be formed by a sputtering method, a plasma CVD method, or the like. In particular, the silicon oxynitride film included in the first layer 103 is preferably formed by a plasma CVD method using a deposition gas containing a silane gas and a nitrous oxide gas, in which case a large amount of hydrogen and nitrogen can be contained in the film. In addition, the proportion of the silane gas in the deposition gas is preferably higher, in which case the amount of hydrogen released from the film in a later heating step is increased.

The thickness of the first layer 103 is preferably large for increase in the amount of released hydrogen and nitrogen; however, the thickness is preferably determined in consideration of productivity. In one embodiment of the present invention, the amounts of hydrogen and nitrogen supplied from the first layer 103 to the separation layer 102 can be reduced by performing the plasma treatment on the separation layer 102 under the atmosphere containing ammonia. Therefore, the thickness of the first layer 103 can be reduced, and the productivity can be increased. The thickness of the first layer 103 is preferably greater than or equal to 1 nm and less than or equal to 1 μm, more preferably greater than or equal to 50 nm and less than or equal to 800 nm, still more preferably greater than or equal to 100 nm and less than or equal to 400 nm, particularly preferably greater than or equal to 100 nm and less than or equal to 200 nm.

The second layer 104 preferably contains nitrogen and silicon. The second layer 104 can be formed using a silicon nitride film, a silicon oxynitride film, or a silicon nitride oxide film, for example. In particular, a silicon nitride film or a silicon nitride oxide film is preferably used.

As described above, the second layer 104 has a function of blocking the hydrogen (and nitrogen) released from the first layer 103 in a later heating step. Another layer may be provided between the first layer 103 and the second layer 104.

The second layer 104 can be formed by a sputtering method, a plasma CVD method, or the like. For example, a silicon nitride film included in the second layer 104 is formed by a plasma CVD method using a deposition gas containing a silane gas, a nitrogen gas, and an ammonia gas.

The thickness of the second layer 104 is not particularly limited. It is preferable that the thickness be, for example, greater than or equal to 50 nm and less than or equal to 600 nm, more preferably greater than or equal to 100 nm and less than or equal to 300 nm.

The layer 110 to be separated may have a functional element. The functional element can be formed over the first layer 103. The functional element may be formed over the second layer 104. In the case where one embodiment of the present invention is applied to, for example, a flexible device including a transistor, the transistor may be formed over the second layer 104.

[Fourth Step]

Next, the separation layer 102 (and the oxide layer 111) and the layer 110 to be separated are heated.

By the heat treatment, hydrogen (and nitrogen) is released from the first layer 103 to be supplied to the oxide layer 111. At this time, the second layer 104 blocks the released hydrogen (and nitrogen); thus, hydrogen (and nitrogen) can be efficiently supplied to the oxide layer 111.

The heat treatment may be performed at a temperature higher than or equal to the temperature at which hydrogen (and nitrogen) is released from the first layer 103 and lower than or equal to the temperature at which the formation substrate 101 is softened. The heat treatment is preferably performed at a temperature greater than or equal to the temperature at which the reduction of the metal oxide in the oxide layer 111 with hydrogen occurs. Increase in temperature of the heat treatment increases the amount of the released hydrogen (and nitrogen) from the first layer 103, leading to improved separability. Note that depending on heating temperature and heating time, the separability is unnecessarily increased so that separation occurs at an unintended timing. Thus, in the case where tungsten is used for the separation layer 102, the heating temperature is higher than or equal to 300° C. and less than 700° C., preferably higher than or equal to 400° C. and less than 650° C., more preferably higher than or equal to 400° C. and less than or equal to 500° C.

The atmosphere in which the heat treatment is performed is not particularly limited and may be an air atmosphere, and it is preferably performed in an inert gas atmosphere such as a nitrogen atmosphere or a rare gas atmosphere.

Hydrogen and nitrogen released from the layer 110 to be separated by the heat treatment are trapped between the first layer 103 and the separation layer 102. As a result, a region with a high hydrogen concentration and a high nitrogen concentration is formed in the oxide layer 111. For example, a region in which a hydrogen concentration measured by SIMS is higher than that of the first layer 103 is formed in the oxide layer 111. Alternatively, a region in which the nitrogen concentration measured by SIMS is higher than that of the first layer 103 is formed in the oxide layer 111.

Figure 1C:
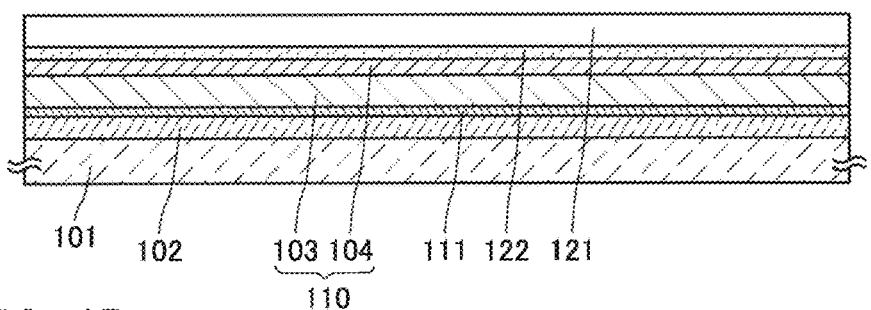

Next, the formation substrate 101 and a substrate 121 are bonded to each other by a bonding layer 122 (see FIG. 1C).

As the substrate 121, various substrates that can be used as the formation substrate 101 can be used. Alternatively, a flexible substrate may be used. Alternatively, as the substrate 121, a substrate provided with a functional element such as a semiconductor element (e.g., a transistor), a light-emitting element (e.g., an organic EL element), a liquid crystal element, or a sensor element, a color filter, and the like in advance may be used.

As the bonding layer 122, a variety of curable adhesives such as a photo curable adhesive such as an ultraviolet curable adhesive, a reactive curable adhesive, a thermosetting adhesive, and an anaerobic adhesive can be used. Alternatively, as the bonding layer 122, an adhesive with which the substrate 121 and the layer 110 to be separated can be separated when necessary, such as a water-soluble resin, a resin soluble in an organic solvent, a resin which is capable of being plasticized upon irradiation with UV light, or the like may be used.

[Fifth Step]

Figure 1D:
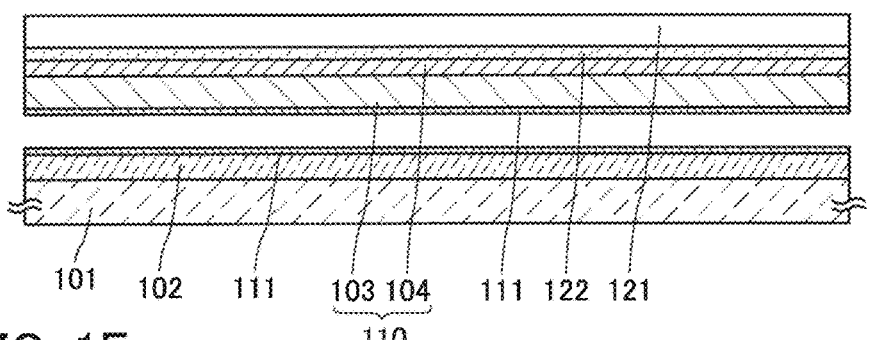

Then, the separation layer 102 and the layer 110 to be separated are separated from each other (see FIG. 1D).

For the separation, for example, the formation substrate 101 or the substrate 121 is fixed to a suction stage and a separation starting point is formed between the separation layer 102 and the layer 110 to be separated. The separation starting point may be formed by, for example, inserting a sharp instrument such as a knife between the layers. Alternatively, the separation starting point may be formed by irradiating part of the separation layer 102 with laser light to melt the part of the separation layer 102. Further alternatively, the separation starting point may be formed by dripping liquid (e.g., alcohol, water, or water containing carbon dioxide) onto an end portion of, for example, the separation layer 102 or the layer 110 to be separated so that the liquid penetrates into an interface between the separation layer 102 and the layer 110 to be separated by using capillary action.

Then, physical force (a separation process with a human hand or with a gripper, a separation process by rotation of a roller, or the like) is gently applied to the area where the separation starting point is formed in a direction substantially perpendicular to the bonded surfaces, so that separation can be caused without damage to the layer 110 to be separated. For example, separation may be caused by attaching tape or the like to the formation substrate 101 or the substrate 121 and pulling the tape in the aforementioned direction, or separation may be caused by pulling an end portion of the formation substrate 101 or the substrate 121 with a hook-like member. Alternatively, separation may be caused by pulling an adhesive member or a member capable of vacuum suction attached to the back side of the formation substrate 101 or the substrate 121.

Here, separation is performed in such a manner that liquid containing water such as water or an aqueous solution is added to the separation interface and the liquid penetrates into the separation interface, so that the separability can be improved. Furthermore, an adverse effect on the functional element included in the layer 110 to be separated due to static electricity caused at separation (e.g., a phenomenon in which a semiconductor element is damaged by static electricity) can be suppressed.

The separation is mainly caused inside the oxide layer 111 and at the interface between the oxide layer 111 and the separation layer 102. Thus, as illustrated in FIG. 1D, part of the oxide layer 111 could be attached to each of the surfaces of the separation layer 102 and the first layer 103 after the separation. Note that the thickness of the oxide layer 111 left on the surface of the separation layer 102 may be different from that left on the surface of the first layer 103. Since separation is easily caused at the interface between the oxide layer 111 and the separation layer 102, the thickness of the oxide layer 111 left on the first layer 103 side is usually larger than that left on the separation layer 102 side. Since a very thin oxide layer is formed in one embodiment of the present invention, decrease in light extraction efficiency of a light-emitting device or a display device can be suppressed even when part of the oxide layer 111 remains on the surface of the first layer 103 after the separation. Alternatively, a change in characteristics of the semiconductor element can be suppressed.

By the above method, the layer 110 to be separated can be separated from the formation substrate 101 with a high yield.

Figure 1E:
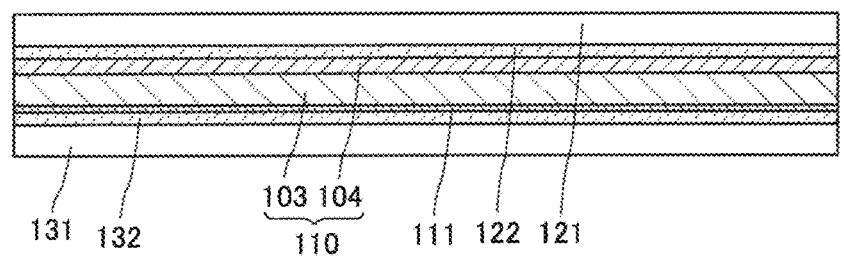

Then, a substrate 131 may be bonded to the separation surface of the separated layer 110 with a bonding layer 132 interposed therebetween (see FIG. 1E). The bonding layer 132 can be formed using a material for the bonding layer 122. The substrate 131 can be formed using a material for the substrate 121.

By using flexible substrates as the substrates 121 and 131, a flexible stack can be formed. Note that in the case where the substrate 121 functions as a temporary supporting substrate, the substrate 121 and the layer 110 to be separated are separated from each other, and the separated layer 110 may be bonded to another substrate (for example, a flexible substrate).

Here, in the case where a material having a transmitting property with respect to visible light is used for the substrate 131 and the bonding layer 132, an average transmittance with respect to visible light in the wavelength range of 450 nm to 700 nm of a stuck including the substrate 131, the bonding layer 132, the oxide layer 111, the first layer 103, and the second layer 104 is greater than or equal to 70% or greater than or equal to 80%. Note that another insulating layer included in the layer 110 to be separated may be included in the stack.

As described above, in the separation method of one embodiment of the present invention, the plasma treatment is performed under the atmosphere containing nitrous oxide and silane, whereby a very thin oxide layer can be formed over the separation layer. Thus, a light emitting device or a display device with high light extraction efficiency can be manufactured. Alternatively, a highly reliable semiconductor device or the like can be manufactured. Furthermore, in the separation method of one embodiment of the present invention, by performing the plasma treatment under the atmosphere containing nitrous oxide, silane, and ammonia, the thickness of the layer which can release hydrogen and nitrogen by the heat treatment can be reduced. Therefore, both separability and productivity can be improved. In addition, the yield of the separation process can be improved by improving the separability.

In the separation method of one embodiment of the present invention, separation is performed after the functional element is formed over a formation substrate, so that flexibility can be obtained; thus, there is almost no limitation on the temperature in formation steps of a functional element. Thus, a functional element with extremely high reliability which is manufactured through a high-temperature process can be manufactured over a flexible substrate with poor heat resistance with a high yield.

This embodiment can be combined with any other embodiment as appropriate.

(Embodiment 2)

In this embodiment, a light-emitting device of one embodiment of the present invention will be described with reference to FIGS. 2A to 2C.

Although a light-emitting device mainly including an organic EL element is described in this embodiment as an example, one embodiment of the present invention is not limited to this example. A light-emitting device or a display device including another light-emitting element or display element which will be described later in this embodiment as an example is also one embodiment of the present invention. Moreover, one embodiment of the present invention is not limited to the light-emitting device or the display device and can be applied to a variety of devices such as a semiconductor device and an input-output device.

<Specific Example 1>

Figure 2A:
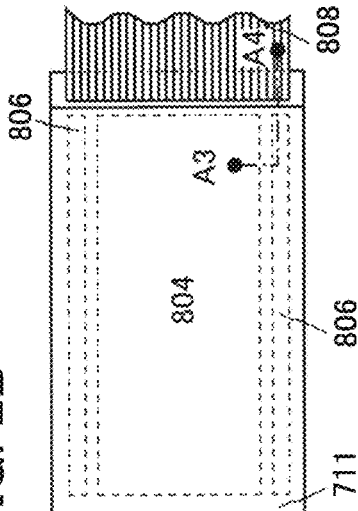
FIGS. 2A to 2C illustrate an example of a light-emitting device.
Figure 2B:
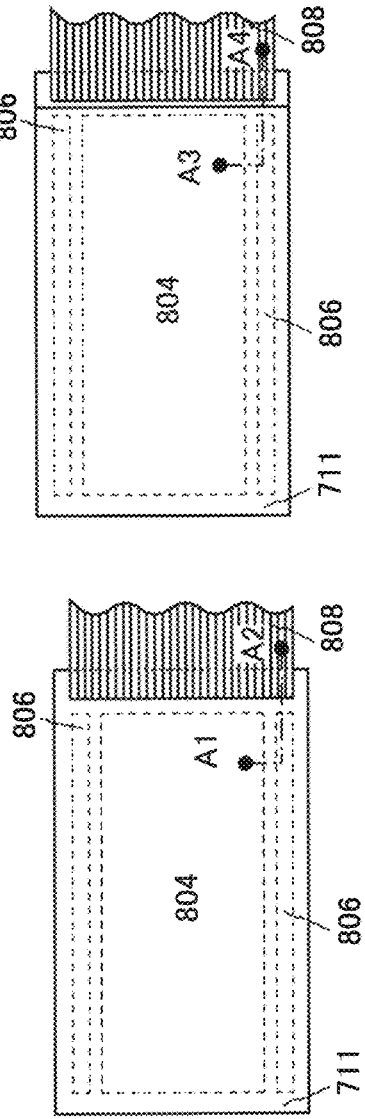
Figure 2C:
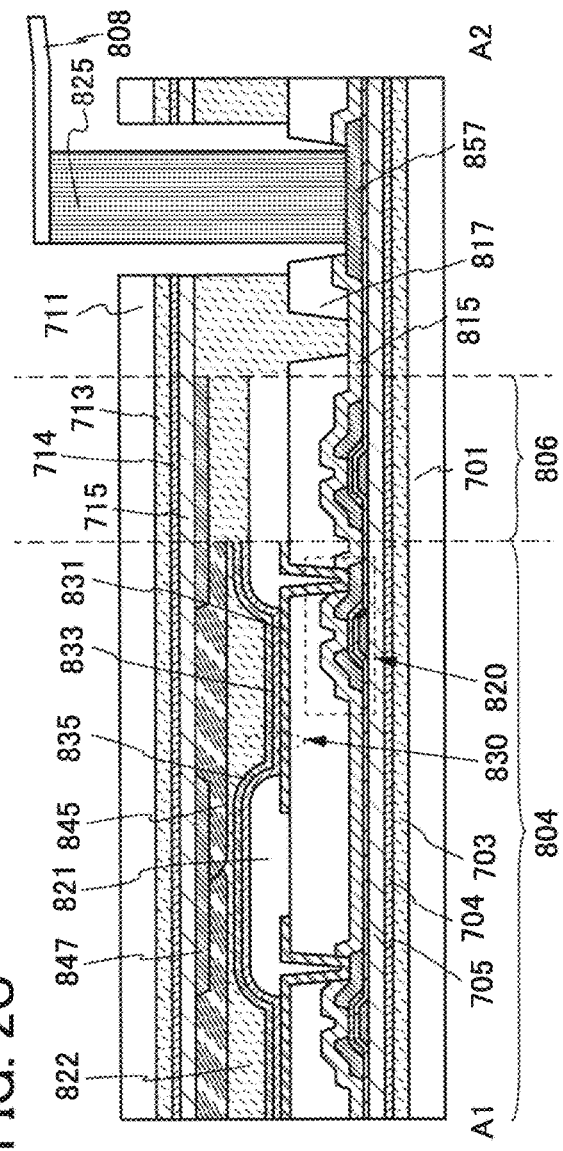

FIG. 2A is a plan view of the light-emitting device, and FIG. 2C is an example of a cross-sectional view taken along the dashed-dotted line A1-A2 in FIG. 2A. The light-emitting device in Specific Example 1 is atop-emission light-emitting device using a color filter method. In this embodiment, the light-emitting device can have a structure in which subpixels of three colors of red (R), green (G), and blue (B), for example, express one color; a structure in which subpixels of four colors of R, G, B, and white (W) express one color; a structure in which subpixels of four colors of R, G, B, and yellow (Y) express one color; or the like. There is no particular limitation on color elements, and colors other than R, G, B, W, and Y may be used. For example, cyan or magenta, or the like may be used.

The light-emitting device illustrated in FIG. 2A includes a light-emitting portion 804, a driver circuit portion 806, and an FPC 808.

The light-emitting device in FIG. 2C includes a substrate 701, a bonding layer 703, an oxide layer 704, an insulating layer 705, a plurality of transistors, a conductive layer 857, an insulating layer 815, an insulating layer 817, a plurality of light-emitting elements, an insulating layer 821, a bonding layer 822, a coloring layer 845, a light-blocking layer 847, an insulating layer 715, an oxide layer 714, a bonding layer 713, and a substrate 711. The bonding layer 822, the insulating layer 715, the oxide layer 714, the bonding layer 713, and the substrate 711 transmit visible light. Light-emitting elements and transistors included in the light-emitting portion 804 and the driver circuit portion 806 are sealed with the substrate 701, the substrate 711, and the bonding layer 822.

It is preferred that, in an XPS analysis performed on a surface of the oxide layer 704 on the bonding layer 703 side or a surface of the oxide layer 714 on the bonding layer 713 side, a peak having the highest intensity among peaks derived from the W 4f orbitals of $WO_x$ ($2 \le x < 3$) and tungsten nitride has 0.60 times or more the intensity of a peak having the highest intensity among peaks derived from the W 4f orbitals of $WO_3$. Furthermore, it is preferred that the peak having the highest intensity among the peaks derived from the W 4f orbitals of $WO_x$ ($2 \le x < 3$) and tungsten nitride has higher intensity than a peak having the second highest intensity among the peaks derived from the W 4f orbitals of $WO_3$.

To provide a light-emitting device with high light extraction efficiency, an average transmittance with respect to light in the wavelength range of 450 nm to 700 nm of the stack of the substrate 711, the bonding layer 713, the oxide layer 714, and the insulating layer 715 is preferably 70% or more, more preferably 80% or more.

The thickness of the oxide layer 704 is, for example, greater than or equal to 1 nm and less than 5 nm. The thickness of the oxide layer 714 is, for example, greater than or equal to 1 nm and less than 5 nm.

The oxide layer 704 preferably has a sufficient insulating property so as to suppress fluctuation in characteristics of the transistor 820 or the like. The resistivity of the oxide layer 704 is greater than or equal to $1.0 \times 10^4$ Ω·m and less than or equal to $1.0 \times 10^{15}$ Ω·m, for example.

The insulating layer 705 preferably includes a first layer and a second layer, which are stacked in this order from the oxide layer 704 side. The insulating layer 715 preferably includes a first layer and a second layer stacked in this order from the oxide layer 714 side. Embodiment 1 can be referred to for the structure of the first layer and the second layer.

The insulating layer 705 may include a region with a hydrogen concentration of greater than or equal to $1.0 \times 10^{20}$ atoms/cm$^3$ and less than or equal to $1.0 \times 10^{22}$ atoms/cm$^3$, which is measured by SIMS. The insulating layer 705 may include a region with a nitrogen concentration of greater than or equal to $5.0 \times 10^{20}$ atoms/cm$^3$ and less than or equal to $1.0 \times 10^{23}$ atoms/cm$^3$, which is measured by SIMS.

The insulating layer 715 may include a region with a hydrogen concentration of greater than or equal to $1.0 \times 10^{20}$ atoms/cm$^3$ and less than or equal to $1.0 \times 10^{22}$ atoms/cm$^3$, which is measured by SIMS. The insulating layer 715 may include a region with a nitrogen concentration of greater than or equal to $5.0 \times 10^{20}$ atoms/cm$^3$ and less than or equal to $1.0 \times 10^{23}$ atoms/cm$^3$, which is measured by SIMS.

The light-emitting portion 804 includes the transistor 820 and a light-emitting element 830 over the substrate 701 with the bonding layer 703, the oxide layer 704, and the insulating layer 705 provided therebetween. The light-emitting element 830 includes a lower electrode 831 over the insulating layer 817, an EL layer 833 over the lower electrode 831, and an upper electrode 835 over the EL layer 833. The lower electrode 831 is electrically connected to a source electrode or a drain electrode of the transistor 820. An end portion of the lower electrode 831 is covered with the insulating layer 821. The lower electrode 831 preferably reflects visible light. The upper electrode 835 transmits visible light.

The light-emitting portion 804 includes the coloring layer 845 overlapping with the light-emitting element 830 and the light-blocking layer 847 overlapping with the insulating layer 821. The space between the light-emitting element 830 and the coloring layer 845 is filled with the bonding layer 822.

The insulating layer 815 has an effect of inhibiting diffusion of impurities to a semiconductor included in the transistor. As the insulating layer 817, an insulating layer having a planarization function is preferably selected in order to reduce surface unevenness due to the transistor.

The driver circuit portion 806 includes a plurality of transistors over the substrate 701 with the bonding layer 703 and the insulating layer 705 provided therebetween. In FIG. 2C, one of the transistors included in the driver circuit portion 806 is illustrated.

The insulating layer 705 and the substrate 701 are attached to each other with the bonding layer 703. The insulating layer 715 and the substrate 711 are attached to each other with the bonding layer 713. The insulating layer 705 and the insulating layer 715 are preferably highly resistant to moisture, in which case impurities such as water can be prevented from entering the light-emitting element 830 or the transistor 820, leading to higher reliability of the light-emitting device.

The conductive layer 857 is electrically connected to an external input terminal through which a signal (e.g., a video signal, a clock signal, a start signal, or a reset signal) or a potential from the outside is transmitted to the driver circuit portion 806. Here, an example in which the FPC 808 is provided as the external input terminal is described. To prevent an increase in the number of manufacturing steps, the conductive layer 857 is preferably formed using the same material and the same step(s) as those of the electrode or the wiring in the light-emitting portion or the driver circuit portion. Here, an example is described in which the conductive layer 857 is formed using the same material and the same step(s) as those of the electrodes of the transistor 820.

In the light-emitting device in FIG. 2C, the FPC 808 is positioned over the substrate 711. The connector 825 is connected to the conductive layer 857 through an opening provided in the substrate 711, the bonding layer 713, the oxide layer 714, the insulating layer 715, the bonding layer 822, the insulating layer 817, and the insulating layer 815.

The connector 825 is also connected to the FPC 808. The FPC 808 and the conductive layer 857 are electrically connected to each other via the connector 825. When the conductive layer 857 and the substrate 711 overlap with each other, an opening is formed in the substrate 711 (or a substrate with an opening portion is used) so that the conductive layer 857, the connector 825, and the FPC 808 can be electrically connected to each other.

<Specific Example 2>

FIG. 2B is a plan view of the light-emitting device, and FIG. 3A is an example of a cross-sectional view taken along the dashed-dotted line A3-A4 in FIG. 2B. The light-emitting device in Specific Example 2 is a top-emission light-emitting device using a color filter method, which differs from the light-emitting device in Specific Example 1. Here, only different points from those of Specific Example 1 are described and the description of the same points as Specific Example 1 is omitted.

The light-emitting device illustrated in FIG. 3A differs from the light-emitting device in FIG. 2C in the following points.

The light-emitting device illustrated in FIG. 3A includes insulating layers 817a and 817b and a conductive layer 856 over the insulating layer 817a. The source electrode or the drain electrode of the transistor 820 and the lower electrode of the light-emitting element 830 are electrically connected to each other through the conductive layer 856.

The light-emitting device in FIG. 3A includes a spacer 823 over the insulating layer 821. The spacer 823 can adjust the distance between the substrate 701 and the substrate 711.

The light-emitting device in FIG. 3A includes an overcoat 849 covering the coloring layer 845 and the light-blocking layer 847. The space between the light-emitting element 830 and the overcoat 849 is filled with the bonding layer 822.

In addition, in the light-emitting device in FIG. 3A, the substrate 701 differs from the substrate 711 in size. The FPC 808 is located over the insulating layer 715 and does not overlap with the substrate 711. The connector 825 is connected to the conductive layer 857 through an opening provided in the oxide layer 714, the insulating layer 715, the bonding layer 822, the insulating layer 817a, and the insulating layer 815. Since no opening needs to be provided in the substrate 711, there is no limitation on the material of the substrate 711.

Note that as illustrated in FIG. 3B, the light-emitting element 830 may include an optical adjustment layer 832 between the lower electrode 831 and the EL layer 833. It is preferable to use a conductive material having a light-transmitting property for the optical adjustment layer 832. Owing to the combination of a color filter (the coloring layer) and a microcavity structure (the optical adjustment layer), light with high color purity can be extracted from the light-emitting device of one embodiment of the present invention. The thickness of the optical adjustment layer may be varied depending on the emission color of the sub-pixel.

<Specific Example 3>

FIG. 2B is a plan view of the light-emitting device, and FIG. 3C is an example of a cross-sectional view taken along the dashed-dotted line A3-A4 in FIG. 2B. The light-emitting device in Specific Example 3 is a top-emission light-emitting device using a separate coloring method.

The light-emitting device in FIG. 3C includes the substrate 701, the bonding layer 703, the oxide layer 704, the insulating layer 705, a plurality of transistors, the conductive layer 857, the insulating layer 815, the insulating layer 817, a plurality of light-emitting elements, the insulating layer 821, the spacer 823, the bonding layer 822, and the substrate 711. The bonding layer 822 and the substrate 711 transmit visible light.

Similarly to Specific Example 1, it is preferred that, in an XPS analysis performed on a surface of the oxide layer 704 on the bonding layer 703 side, a peak having the highest intensity among peaks derived from the W 4f orbitals of $WO_x$ ($2 \leq x < 3$) and tungsten nitride has 0.60 times or more the intensity of a peak having the highest intensity among peaks derived from the W 4f orbitals of $WO_3$. Furthermore, it is preferable the peak having the highest intensity among the peaks derived from the W 4f orbitals of $WO_x$ ($2 \leq x < 3$) and tungsten nitride has higher intensity than a peak having the second highest intensity among the peaks derived from the W 4f orbitals of $WO_3$.

The thickness of the oxide layer 704 is, for example, greater than or equal to 1 nm and less than 5 nm.

The oxide layer 704 preferably has a sufficient insulating property so as to suppress fluctuation in characteristics of the transistor 820 or the like. The resistivity of the oxide layer 704 is greater than or equal to $1.0 \times 10^4$ Ω·m and less than or equal to $1.0 \times 10^{15}$ Ω·m.

The insulating layer 705 preferably includes a first layer and a second layer, which are stacked in this order from the oxide layer 704 side.

The insulating layer 705 may include a region with a concentration of hydrogen detected by secondary ion mass spectrometry of greater than or equal to $1.0 \times 10^{20}$ atoms/cm$^3$ and less than or equal to $1.0 \times 10^{22}$ atoms/cm$^3$. The insulating layer 705 may include a region with a concentration of nitrogen detected by SIMS of greater than or equal to $5.0 \times 10^{20}$ atoms/cm$^3$ and less than or equal to $1.0 \times 10^{23}$ atoms/cm$^3$.

In the light-emitting device in FIG. 3C, the connector 825 is positioned over the insulating layer 815. The connector 825 is connected to the conductive layer 857 through an opening provided in the insulating layer 815. Moreover, the connector 825 is connected to the FPC 808. The FPC 808 and the conductive layer 857 are electrically connected to each other with the connector 825 provided therebetween.

<Specific Example 4>

Figure 4A:
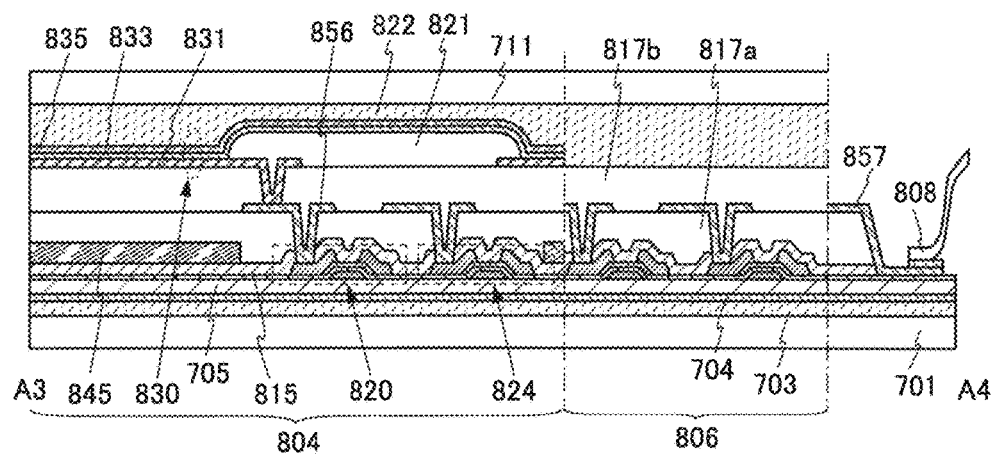
FIGS. 4A and 4B each illustrate an example of a light-emitting device.

FIG. 2B is a plan view of the light-emitting device, and FIG. 4A is an example of a cross-sectional view taken along the dashed-dotted line A3-A4 in FIG. 2B. The light-emitting device in Specific Example 4 is a bottom-emission light-emitting device using a color filter method.

The light-emitting device in FIG. 4A includes the substrate 701, the bonding layer 703, the oxide layer 704, the insulating layer 705, a plurality of transistors, the conductive layer 857, the insulating layer 815, the coloring layer 845, the insulating layer 817a, the insulating layer 817b, the conductive layer 856, a plurality of light-emitting elements, the insulating layer 821, the bonding layer 822, and the substrate 711. The substrate 701, the bonding layer 703, the oxide layer 704, the insulating layer 705, the insulating layer 815, the insulating layer 817a, and the insulating layer 817b transmit visible light.

It is preferred that, in an XPS analysis performed on a surface of the oxide layer 704 on the bonding layer 703 side, a peak having the highest intensity among the peaks derived from the W 4f orbitals of $WO_x$ ($2 \leq x < 3$) and tungsten nitride has 0.60 times or more the intensity of a peak having the highest intensity among peaks derived from the W 4f orbitals of $WO_3$. Furthermore, it is preferable that the peak having the highest intensity among the peaks derived from the W 4f orbitals of $WO_x$ ($2 \leq x < 3$) and tungsten nitride has higher intensity than a peak having the second highest intensity among the peaks derived from the W 4f orbitals of $WO_3$.

To provide a light-emitting device with high light extraction efficiency, an average transmittance with respect to light in the wavelength range of 450 nm to 700 nm of the stack of the substrate 701, the bonding layer 703, the oxide layer 704, and the insulating layer 705 is 70% or more, more preferably 80% or more.

The thickness of the oxide layer 704 is, for example, greater than or equal to 1 nm and less than 5 nm.

The oxide layer 704 preferably has a sufficient insulating property so as to suppress fluctuation in characteristics of the transistor 820 or the like. The resistivity of the oxide layer 704 is greater than or equal to $1.0 \times 10^4$ Ω·m and less than or equal to $1.0 \times 10^{15}$ Ω·m.

The insulating layer 705 preferably includes a first layer and a second layer, which are stacked in this order from the oxide layer 704 side. The insulating layer 705 may include a region with a hydrogen concentration of greater than or equal to $1.0 \times 10^{20}$ atoms/cm$^3$ and less than or equal to $1.0 \times 10^{22}$ atoms/cm$^3$, which is measured by SIMS. The insulating layer 705 may include a region with a nitrogen concentration of greater than or equal to $5.0 \times 10^{20}$ atoms/cm$^3$ and less than or equal to $1.0 \times 10^{23}$ atoms/cm$^3$, which is measured by SIMS.

The light-emitting portion 804 includes the transistor 820, the transistor 824, and the light-emitting element 830 over the substrate 701 with the bonding layer 703, the oxide layer 704, and the insulating layer 705 provided therebetween. The light-emitting element 830 includes the lower electrode 831 over the insulating layer 817b, the EL layer 833 over the lower electrode 831, and the upper electrode 835 over the EL layer 833. The lower electrode 831 is electrically connected to a source electrode or a drain electrode of the transistor 820. An end portion of the lower electrode 831 is covered with the insulating layer 821. The upper electrode 835 preferably reflects visible light. The lower electrode 831 transmits visible light. The coloring layer 845 that overlaps with the light-emitting element 830 can be provided anywhere; for example, the coloring layer 845 may be provided between the insulating layers 817a and 817b or between the insulating layers 815 and 817a.

The driver circuit portion 806 includes a plurality of transistors over the substrate 701 with the bonding layer 703 and the insulating layer 705 provided therebetween. In FIG. 4A, two of the transistors included in the driver circuit portion 806 are illustrated.

The insulating layer 705 and the substrate 701 are attached to each other with the bonding layer 703. The insulating layer 705 is preferably highly resistant to moisture, in which case impurities such as water can be prevented from entering the light-emitting element 830, the transistor 820, or the transistor 824 leading to higher reliability of the light-emitting device.

The conductive layer 857 is electrically connected to an external input terminal through which a signal or a potential from the outside is transmitted to the driver circuit portion 806. Here, an example in which the FPC 808 is provided as the external input terminal is described and in which the conductive layer 857 is formed using the same material and the same step(s) as those of the conductive layer 856. ps
<Specific Example 5>

Figure 4B:
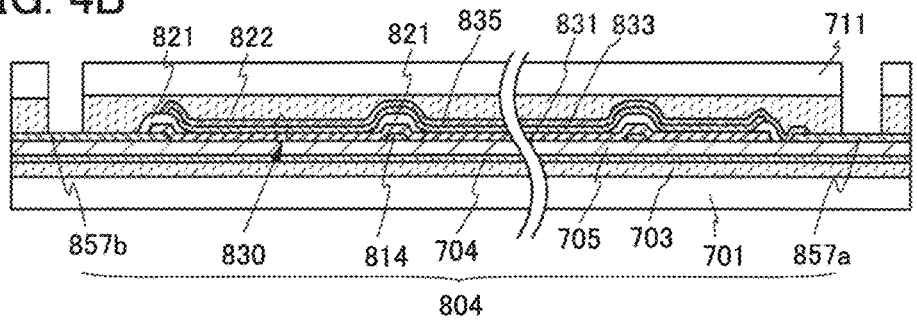

FIG. 4B shows an example of a light-emitting device different from those of Specific Examples 1 to 4.

A light-emitting device in FIG. 4B includes the substrate 701, the bonding layer 703, the oxide layer 704, the insulating layer 705, a conductive layer 814, a conductive layer 857a, a conductive layer 857b, the light-emitting element 830, the insulating layer 821, the bonding layer 822, and the substrate 711.

The conductive layer 857a and the conductive layer 857b, which are external connection electrodes of the light-emitting device, can each be electrically connected to an FPC or the like.

The light-emitting element 830 includes the lower electrode 831, the EL layer 833, and the upper electrode 835. The end portion of the lower electrode 831 is covered with the insulating layer 821. The light-emitting element 830 has a bottom emission structure, a top emission structure, or a dual emission structure. The electrode, the substrate, the insulating layer, and the like through each of which light is extracted transmit visible light. The conductive layer 814 is electrically connected to the lower electrode 831.

In FIG. 4B, the case where the light emitting element 830 has a bottom emission structure is described as an example. The preferable structures of the insulating layer 705 and the oxide layer 704 are the same as those in Specific Example 4.

The substrate through which light is extracted may have, as a light extraction structure, a hemispherical lens, a micro lens array, a film provided with an uneven surface structure, a light diffusing film, or the like. For example, a substrate having the light extraction structure can be formed by bonding the above lens or film to a resin substrate with an adhesive or the like having substantially the same refractive index as the substrate or the lens or film.

The conductive layer 814 is preferably, though not necessarily, provided because voltage drop due to the resistance of the lower electrode 831 can be inhibited. In addition, for a similar purpose, a conductive layer electrically connected to the upper electrode 835 may be provided over the insulating layer 821, the EL layer 833, the upper electrode 835, or the like.

The conductive layer 814 can be formed to have a single-layer structure or a stacked-layer structure using a material selected from copper, titanium, tantalum, tungsten, molybdenum, chromium, neodymium, scandium, nickel, or aluminum, an alloy material containing any of these materials as its main component, and the like. The thickness of the conductive layer 814 can be greater than or equal to 0.1 μm and less than or equal to 3 μm, preferably greater than or equal to 0.1 μm and less than or equal to 0.5 μm, for example.
<Examples of Materials>

Next, materials that can be used for a light-emitting device are described. Note that description on the components already described in this specification and the like is omitted in some cases.

For each of the substrates, a material such as glass, quartz, an organic resin, a metal, or an alloy can be used. The substrate on the side from which light from the light-emitting element is extracted is formed using a material which transmits the light.

In particular, a flexible substrate is preferably used. For example, an organic resin; or glass, a metal, or an alloy that is thin enough to have flexibility can be used.

An organic resin, which has a specific gravity smaller than that of glass, is preferably used for the flexible substrate, in which case the light-emitting device can be lightweight as compared with the case where glass is used.

The substrate is preferably formed using a material with high toughness. In that case, a light-emitting device with high impact resistance that is less likely to be broken can be provided. For example, when an organic resin substrate or a thin metal or alloy substrate is used, the light-emitting device can be lightweight and unlikely to be broken as compared with the case where a glass substrate is used.

A metal material and an alloy material, which have high thermal conductivity, are preferable because they can easily conduct heat to the whole substrate and accordingly can prevent a local temperature rise in the light-emitting device. The thickness of a substrate using a metal material or an alloy material is preferably greater than or equal to 10 μm and less than or equal to 200 μm, further preferably greater than or equal to 20 μm and less than or equal to 50 μm.

There is no particular limitation on a material of the metal substrate or the alloy substrate, but it is preferable to use, for example, aluminum, copper, nickel, or a metal alloy such as an aluminum alloy or stainless steel.

When a material with high thermal emissivity is used for the substrate, the surface temperature of the light-emitting device can be prevented from rising, leading to inhibition of breakage or a decrease in reliability of the light-emitting device. For example, the substrate may have a stacked-layer structure of a metal substrate and a layer with high thermal emissivity (the layer can be formed using a metal oxide or a ceramic material, for example).

Examples of such a material having flexibility and a light-transmitting property include polyester resins such as poly(ethylene terephthalate) (PET) and poly(ethylene naphthalate) (PEN), a polyacrylonitrile resin, a polyimide resin, a poly(methyl methacrylate) resin, a polycarbonate (PC) resin, a polyethersulfone (PES) resin, a polyamide resin (e.g., nylon or aramid), a polycycloolefin resin, a polystyrene resin, a poly(amide imide) resin, a poly(vinyl chloride) resin, a polytetrafluoroethylene (PTFE) resin, or the like. In particular, a material having a low coefficient of linear expansion is preferable, and for example, a poly(amide imide) resin, a polyimide resin, a polyamide resin, or PET can be suitably used. A substrate in which a fibrous body is impregnated with a resin (also referred to as prepreg) or a substrate whose linear thermal expansion coefficient is reduced by mixing an inorganic filler with an organic resin can also be used.

The flexible substrate may have a stacked-layer structure in which a hard coat layer (e.g., a silicon nitride layer) by which a surface of the light-emitting device is protected from damage, a layer which can disperse pressure (e.g., an aramid resin layer), or the like is stacked over a layer of any of the above-mentioned materials.

The flexible substrate may be formed by stacking a plurality of layers. When a glass layer is used, a barrier property against water and oxygen can be improved and thus a highly reliable light-emitting device can be provided.

For example, a flexible substrate in which a glass layer, a bonding layer, and an organic resin layer are stacked from the side closer to a light-emitting element can be used. The thickness of the glass layer is greater than or equal to 20 μm and less than or equal to 200 μm, preferably greater than or equal to 25 μm and less than or equal to 100 μm. With such a thickness, the glass layer can have both a high barrier property against water and oxygen and high flexibility. The thickness of the organic resin layer is greater than or equal to 10 μm and less than or equal to 200 μm, preferably greater than or equal to 20 μm and less than or equal to 50 μm. By providing such an organic resin layer outside the glass layer, a crack or a break in the glass layer can be inhibited and mechanical strength can be improved. With the substrate that includes such a composite material of a glass material and an organic resin, a highly reliable flexible light-emitting device can be provided.

As the bonding layer, a variety of curable adhesives such as a reactive curable adhesive, a thermosetting adhesive, an anaerobic adhesive, and a photo curable adhesive such as an ultraviolet curable adhesive can be used. Examples of such adhesives include an epoxy resin, an acrylic resin, a silicone resin, a phenol resin, a polyimide resin, an imide resin, a poly(vinyl chloride) (PVC) resin, a poly(vinyl butyral) (PVB) resin, an ethylene vinyl acetate (EVA) resin, and the like. In particular, a material with low moisture permeability, such as an epoxy resin, is preferable. Alternatively, a two-component-mixture-type resin may be used. Further alternatively, a bonding sheet or the like may be used.

Furthermore, the resin may include a drying agent. For example, a substance which adsorbs moisture by chemical adsorption, such as an oxide of an alkaline earth metal (e.g., calcium oxide or barium oxide), can be used. Alternatively, a substance that adsorbs moisture by physical adsorption, such as zeolite or silica gel, may be used. The drying agent is preferably included, in which case entry of impurities such as moisture into the functional element can be inhibited and the reliability of the light-emitting device can be improved.

In addition, a filler with a high refractive index or a light scattering member is mixed into the resin, in which case the efficiency of light extraction from the light-emitting element can be improved. For example, titanium oxide, barium oxide, zeolite, zirconium, or the like can be used.

It is preferred that the insulating layer 705 and the insulating layer 715 also have a function of preventing diffusion of impurities to a light-emitting element. For example, they are preferred to have high resistance to moisture.

As an insulating film having an excellent moisture-proof property, in addition to a film containing nitrogen and silicon (e.g., a silicon nitride film, a silicon nitride oxide film, or a silicon oxynitride film) and silicon oxide film, which are described in Embodiment 1, a film containing nitrogen and aluminum (e.g., an aluminum nitride film), aluminum oxide film, or the like can be used.

For example, the water vapor permeability is lower than or equal to $1\times10^{-5}$ [g/m$^2$·day], preferably lower than or equal to $1\times10^{-6}$ [g/m$^2$·day], further preferably lower than or equal to $1\times10^{-7}$ [g/m$^2$·day], still further preferably lower than or equal to $1\times10^{-8}$ [g/m$^2$·day].

In the light-emitting device, it is necessary that at least one of the insulating layers 705 and 715 transmit light emitted from the light-emitting element included. One of the insulating layers 705 and 715, which transmits light emitted from the light-emitting element, preferably has higher average transmittance of light having a wavelength of greater than or equal to 400 nm and less than or equal to 800 nm than the other.

The insulating layers 705 and 715 each preferably include oxygen, nitrogen, and silicon. The insulating layers 705 and 715 each preferably include, for example, silicon oxynitride. Moreover, the insulating layers 705 and 715 each preferably include silicon nitride or silicon nitride oxide. It is preferable that the insulating layers 705 and 715 have a stacked structure having a silicon oxynitride film and a silicon nitride film, which are in contact with each other. The silicon oxynitride film and the silicon nitride film are alternately stacked so that antiphase interference occurs more often in a visible region, whereby the stack can have higher transmittance of light in the visible region.

There is no particular limitation on the structure of the transistor in the light-emitting device. For example, a forward staggered transistor or an inverted staggered transistor may be used. Furthermore, a top-gate transistor or a bottom-gate transistor may be used. A semiconductor material used for the transistors is not particularly limited, and for example, silicon, germanium, or an organic semiconductor can be used. Alternatively, an oxide semiconductor containing at least one of indium, gallium, and zinc, such as an In—Ga—Zn-based metal oxide, may be used.

There is no particular limitation on the crystallinity of a semiconductor material used for the transistors, and an amorphous semiconductor or a semiconductor having crystallinity (a microcrystalline semiconductor, a polycrystalline semiconductor, a single-crystal semiconductor, or a semiconductor partly including crystal regions) may be used. It is preferable that a semiconductor having crystallinity be used, in which case deterioration of the transistor characteristics can be inhibited.

For stable characteristics of the transistor, a base film is preferably provided. The base film can be formed to have a single-layer structure or a stacked-layer structure using an inorganic insulating film such as a silicon oxide film, a silicon nitride film, a silicon oxynitride film, or a silicon nitride oxide film. The base film can be formed by a sputtering method, a chemical vapor deposition (CVD) method (e.g., a plasma CVD method, a thermal CVD method, or a metal organic CVD (MOCVD) method), an atomic layer deposition (ALD) method, a coating method, a printing method, or the like. Note that the base film is not necessarily provided, in which the insulating layer 705 can serve as a base film of the transistor.

As the light-emitting element, a self-luminous element can be used, and an element whose luminance is controlled by current or voltage is included in the category of the light-emitting element. For example, a light-emitting diode (LED), an organic EL element, an inorganic EL element, or the like can be used.

The light-emitting element may have any of a top emission structure, a bottom emission structure, and a dual emission structure. A conductive film that transmits visible light is used as the electrode through which light is extracted. A conductive film that reflects visible light is preferably used as the electrode through which light is not extracted.

The conductive film that transmits visible light can be formed using, for example, indium oxide, indium tin oxide (ITO), indium zinc oxide, zinc oxide (ZnO), or zinc oxide to which gallium is added. Alternatively, a film of a metal material such as gold, silver, platinum, magnesium, nickel, tungsten, chromium, molybdenum, iron, cobalt, copper, palladium, or titanium; an alloy containing any of these metal materials; a nitride of any of these metal materials (e.g., titanium nitride); or the like can be formed thin so as to have a light-transmitting property. Alternatively, a stacked film of any of the above materials can be used as the conductive layer. For example, a stacked film of ITO and an alloy of silver and magnesium is preferably used, in which case conductivity can be increased. Further alternatively, graphene or the like may be used.

For the conductive film that reflects visible light, for example, a metal material, such as aluminum, gold, platinum, silver, nickel, tungsten, chromium, molybdenum, iron, cobalt, copper, or palladium or an alloy including any of these metal materials can be used. Lanthanum, neodymium, germanium, or the like may be added to the metal material or the alloy. Furthermore, an alloy containing aluminum (an aluminum alloy) such as an alloy of aluminum and titanium, an alloy of aluminum and nickel, an alloy of aluminum and neodymium, or an alloy of aluminum, nickel, and lanthanum (Al—Ni—La), or an alloy containing silver such as an alloy of silver and copper, an alloy of silver, palladium, and copper (Ag—Pd—Cu, also referred to as APC), or an alloy of silver and magnesium can be used for the conductive film. An alloy of silver and copper is preferable because of its high heat resistance. Moreover, a metal film or a metal oxide film is stacked on an aluminum alloy film, whereby oxidation of the aluminum alloy film can be suppressed. Examples of a material for the metal film or the metal oxide film are titanium and titanium oxide. Alternatively, the conductive film having a property of transmitting visible light and a film containing any of the above metal materials may be stacked. For example, a stacked film of silver and ITO or a stacked film of an alloy of silver and magnesium and ITO can be used.

The electrodes may be formed separately by an evaporation method or a sputtering method. Alternatively, a discharging method such as an ink-jet method, a printing method such as a screen printing method, or a plating method may be used.

When a voltage higher than the threshold voltage of the light-emitting element is applied between the lower electrode 831 and the upper electrode 835, holes are injected to the EL layer 833 from the anode side and electrons are injected to the EL layer 833 from the cathode side. The injected electrons and holes are recombined in the EL layer 833 and a light-emitting substance contained in the EL layer 833 emits light.

The EL layer 833 includes at least a light-emitting layer. In addition to the light-emitting layer, the EL layer 833 may further include one or more layers containing any of a substance with a high hole-injection property, a substance with a high hole-transport property, a hole-blocking material, a substance with a high electron-transport property, a substance with a high electron-injection property, a substance with a bipolar property (a substance with a high electron- and hole-transport property), and the like.

For the EL layer 833, either a low molecular compound or a high molecular compound can be used, and an inorganic compound may also be used. Each of the layers included in the EL layer 833 can be formed by any of the following methods: an evaporation method (including a vacuum evaporation method), a transfer method, a printing method, an inkjet method, a coating method, and the like.

The light-emitting element 830 may contain two or more kinds of light-emitting substances. Thus, for example, a light-emitting element that emits white light can be achieved. For example, a white emission can be obtained by selecting light-emitting substances so that two or more kinds of light-emitting substances emit light of complementary colors. A light-emitting substance that emits red (R) light, green (G) light, blue (B) light, yellow (Y) light, or orange (O) light or a light-emitting substance that emits light containing spectral components of two or more of R light, G light, and B light can be used, for example. A light-emitting substance that emits blue light and a light-emitting substance that emits yellow light may be used, for example. At this time, the emission spectrum of the light-emitting substance that emits yellow light preferably contains spectral components of G light and R light. The emission spectrum of the light-emitting element 830 preferably has two or more peaks in the visible region (e.g., greater than or equal to 350 nm and less than or equal to 750 nm or greater than or equal to 400 nm and less than or equal to 800 nm).

The EL layer 833 may include a plurality of light-emitting layers. In the EL layer 833, the plurality of light-emitting layers may be stacked in contact with one another or may be stacked with a separation layer provided therebetween. The separation layer may be provided between a fluorescent layer and a phosphorescent layer, for example.

The separation layer can be provided, for example, to prevent energy transfer by the Dexter mechanism (particularly triplet energy transfer) from a phosphorescent material in an excited state which is generated in the phosphorescent layer to a fluorescent material in the fluorescent layer. The thickness of the separation layer may be several nanometers. Specifically, the thickness of the separation layer may be greater than or equal to 0.1 nm and less than or equal to 20 nm, greater than or equal to 1 nm and less than or equal to 10 nm, or greater than or equal to 1 nm and less than or equal to 5 nm. The separation layer contains a single material (preferably, a bipolar substance) or a plurality of materials (preferably, a hole-transport material and an electron-transport material).

The separation layer may be formed using a material contained in a light-emitting layer in contact with the separation layer. This facilitates the manufacture of the light-emitting element and reduces the drive voltage. For example, in the case where the phosphorescent layer includes a host material, an assist material, and a phosphorescent material (guest material), the separation layer may be formed using the host material and the assist material. In other words, the separation layer includes a region not containing the phosphorescent material and the phosphorescent layer includes a region containing the phosphorescent material in the above structure. Accordingly, the separation layer and the phosphorescent layer can be evaporatively deposited separately depending on whether a phosphorescent material is used or not. With such a structure, the separation layer and the phosphorescent layer can be formed in the same chamber. Thus, the manufacturing costs can be reduced.

Moreover, the light-emitting element 830 may be a single element including one EL layer or a tandem element in which EL layers are stacked with a charge generation layer provided therebetween.

The light-emitting element is preferably provided between a pair of insulating films having an excellent moisture-proof property. In that case, entry of an impurity such as moisture into the light-emitting element can be inhibited, leading to inhibition of a decrease in the reliability of the light-emitting device. Specifically, the use of an insulating film having high resistance to moisture for the insulating layer 705 and the insulating layer 715 allows the light-emitting element to be located between a pair of insulating films having high resistance to moisture, by which decrease in reliability of the light-emitting device can be prevented.

As the insulating layer 815, for example, an inorganic insulating film such as a silicon oxide film, a silicon oxynitride film, or an aluminum oxide film can be used. As the insulating layer 817, the insulating layer 817a, and the insulating layer 817b, an organic material such as a polyimide, an acrylic resin, a polyamide, a poly(imide amide), or a benzocyclobutene-based resin can be used, for example. Alternatively, a low-dielectric constant material (a low-k material) or the like can be used. Furthermore, each insulating layer may be formed by stacking a plurality of insulating films.

The insulating layer 821 is formed using an organic insulating material or an inorganic insulating material. As the resin, for example, a polyimide resin, a polyamide resin, an acrylic resin, a siloxane resin, an epoxy resin, or a phenol resin can be used. It is particularly preferable that the insulating layer 821 be formed to have an opening over the lower electrode 831 and an inclined side wall with curvature, using a photosensitive resin material.

There is no particular limitation on the method for forming the insulating layer 821; a photolithography method, a sputtering method, an evaporation method, a droplet discharging method (e.g., an inkjet method), a printing method (e.g., a screen printing method or an off-set printing method), or the like may be used.

The spacer 823 can be formed using an inorganic insulating material, an organic insulating material, a metal material, or the like. As the inorganic insulating material and the organic insulating material, for example, a variety of materials that can be used for the aforementioned insulating layers can be used. As the metal material, titanium, aluminum, or the like can be used. When the spacer 823 containing a conductive material is electrically connected to the upper electrode 835, a potential drop due to the resistance of the upper electrode 835 can be inhibited. The spacer 823 may have either a tapered shape or an inverse tapered shape.

For example, a conductive layer functioning as an electrode or a wiring of the transistor, an auxiliary electrode of the light-emitting element, or the like, which is used for the light-emitting device, can be formed to have a single-layer structure or a stacked-layer structure using any of metal materials such as molybdenum, titanium, chromium, tantalum, tungsten, aluminum, copper, neodymium, and scandium, and an alloy material containing any of these elements. Alternatively, the conductive layer may be formed using a conductive metal oxide. As the conductive metal oxide, indium oxide (e.g., $In_2O_3$), tin oxide (e.g., $SnO_2$), ZnO, ITO, indium zinc oxide (e.g., $In_2O_3$—ZnO), or any of these metal oxide materials in which silicon oxide is contained can be used.

The coloring layer is a colored layer that transmits light in a specific wavelength range. For example, a color filter for transmitting light in a red, green, blue, or yellow wavelength range can be used. Each coloring layer is formed in a desired position with any of various materials by a printing method, an inkjet method, an etching method using a photolithography method, or the like. In a white sub-pixel, a resin such as a transparent resin may be provided so as to overlap with the light-emitting element.

The light-blocking layer is provided between the adjacent coloring layers. The light-blocking layer blocks light emitted from an adjacent light-emitting element to inhibit color mixture between adjacent light-emitting elements. Here, the coloring layer is provided such that its end portion overlaps with the light-blocking layer, whereby light leakage can be reduced. As the light-blocking layer, a material that can block light from the light-emitting element can be used; for example, a black matrix is formed using a resin material containing a metal material, pigment, or dye. Note that it is preferable to provide the light-blocking layer in a region other than the light-emitting portion, such as a driver circuit portion, in which case undesired leakage of guided light or the like can be inhibited.

The overcoat can prevent an impurity and the like contained in the coloring layer from being diffused into the light-emitting element. The overcoat is formed with a material that transmits light emitted from the light-emitting element; for example, an inorganic insulating film such as a silicon nitride film or a silicon oxide film, an organic insulating film such as an acrylic film or a polyimide film can be used, and further, a stacked-layer structure of an organic insulating film and an inorganic insulating film may be employed.

In the case where upper surfaces of the coloring layer and the light-blocking layer are coated with a material of the bonding layer, a material which has high wettability with respect to the material of the bonding layer is preferably used as the material of the overcoat. For example, an oxide conductive film such as an ITO film or a metal film such as an Ag film which is thin enough to transmit light is preferably used as the overcoat.

As the connector, any of a variety of anisotropic conductive films (ACF), anisotropic conductive pastes (ACP), and the like can be used.

As described above, one embodiment of the present invention can be applied to a variety of devices such as a light-emitting device, a display device, and a lighting device.

Note that the light-emitting device of one embodiment of the present invention may be used as a display device or as a lighting device. For example, it may be used as a light source such as a backlight or a front light, that is, a lighting device for a display panel.

As described in this embodiment, since one embodiment of the present invention includes an oxide layer with an extremely small thickness, a light-emitting device and a display device having high light extraction efficiency can be manufactured with a high yield. Alternatively, since one embodiment of the present invention includes an oxide layer with an extremely small thickness, a highly reliable semiconductor device or the like in which a change in characteristics of semiconductor elements or the like is suppressed can be manufactured with a high yield.

This embodiment can be combined with any other embodiment as appropriate.

(Embodiment 3)

In this embodiment, an input-output device of one embodiment of the present invention will be described with reference to drawings. Note that the above description can be referred to for the components of an input-output device, which are similar to those of the light-emitting device described in Embodiment 2. Although an input-output device including a light-emitting element is described as an example in this embodiment, one embodiment of the present invention is not limited thereto. The input-output device described in this embodiment is also a touch panel.

Since an oxide layer with an extremely small thickness is included in one embodiment of the present invention, an input-output device having high light extraction efficiency can be manufactured with a high yield. Alternatively, since an oxide layer with an extremely small thickness is included in one embodiment of the present invention, a highly reliable input-output device in which a change in characteristics of a semiconductor element, a touch sensor, or the like are suppressed can be manufactured with a high yield.

(Structure Example 1)

Figure 5A:
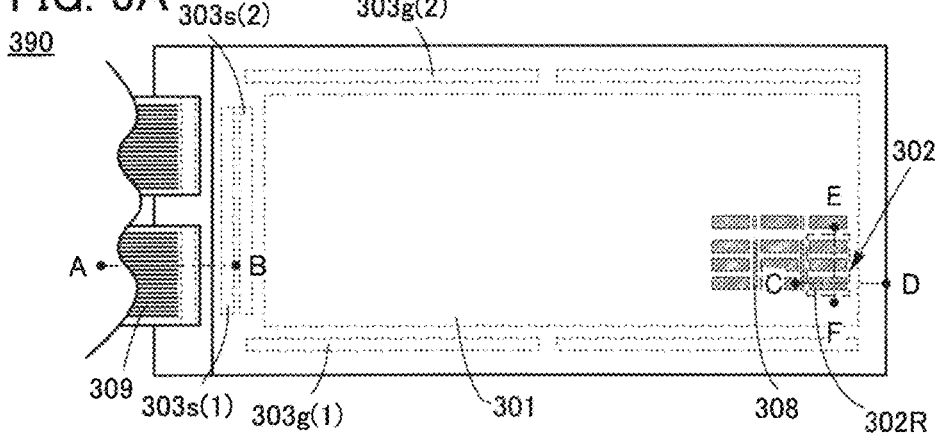
FIGS. 5A to 5C illustrate an example of an input-output device.
Figure 5B:
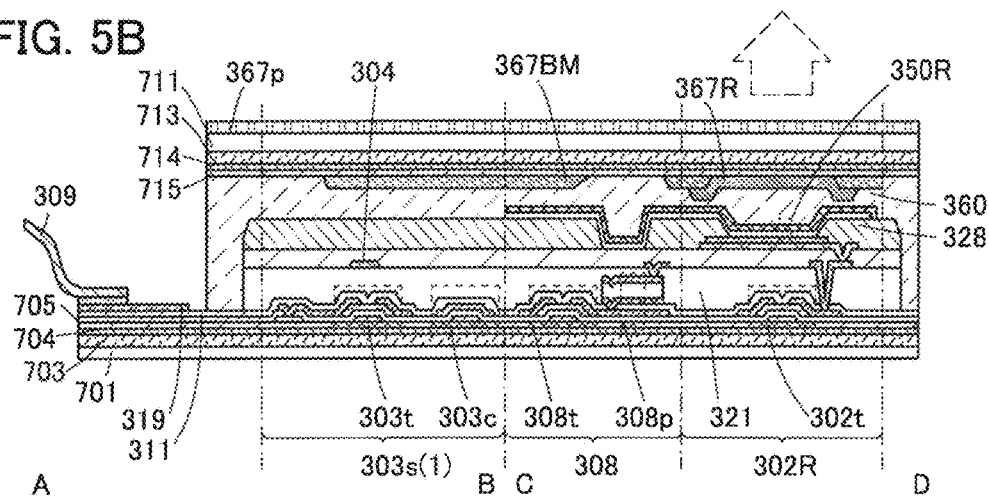
Figure 5C:
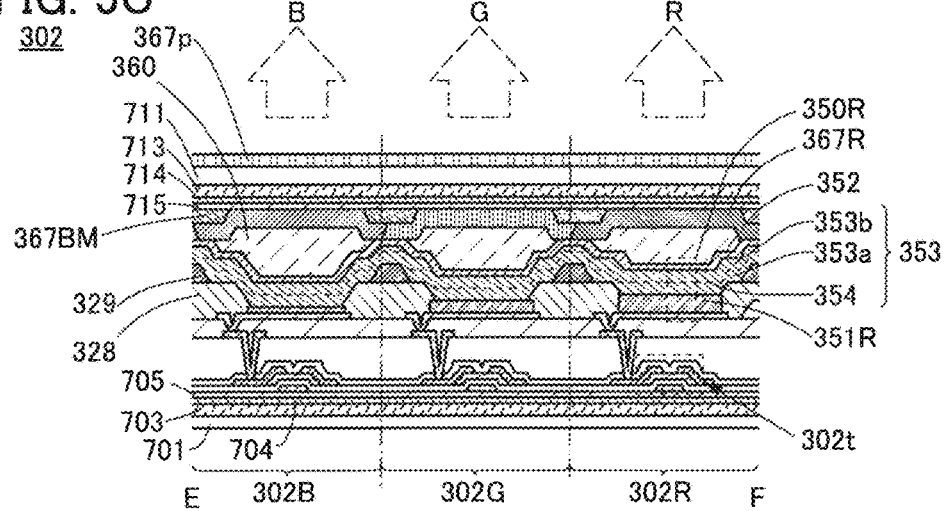

FIG. 5A is a top view of the input-output device. FIG. 5B is a cross-sectional view taken along the dashed-dotted line A-B and dashed-dotted line C-D in FIG. 5A. FIG. 5C is a cross-sectional view taken along the dashed-dotted line E-F in FIG. 5A.

An input-output device 390 illustrated in FIG. 5A includes a display portion 301 (serving also as an input portion), a scan line driver circuit 303g(1), an imaging pixel driver circuit 303g(2), an image signal line driver circuit 303s(1), and an imaging signal line driver circuit 303s(2).

The display portion 301 includes a plurality of pixels 302 and a plurality of imaging pixels 308.

The pixel 302 includes a plurality of sub-pixels. Each sub-pixel includes a light-emitting element and a pixel circuit.

The pixel circuits can supply electric power for driving the light-emitting element. The pixel circuits are electrically connected to wirings through which selection signals are supplied. The pixel circuits are also electrically connected to wirings through which image signals are supplied.

The scan line driver circuit 303g(1) can supply selection signals to the pixels 302.

The image signal line driver circuit 303s(1) can supply image signals to the pixels 302.

A touch sensor can be formed using the imaging pixels 308. Specifically, the imaging pixels 308 can sense a touch of a finger or the like on the display portion 301.

The imaging pixels 308 include photoelectric conversion elements and imaging pixel circuits.

The imaging pixel circuits can drive photoelectric conversion elements. The imaging pixel circuits are electrically connected to wirings through which control signals are supplied. The imaging pixel circuits are also electrically connected to wirings through which power supply potentials are supplied.

Examples of the control signal include a signal for selecting an imaging pixel circuit from which a recorded imaging signal is read, a signal for initializing an imaging pixel circuit, and a signal for determining the time for an imaging pixel circuit to sense light.

The imaging pixel driver circuit 303g(2) can supply control signals to the imaging pixels 308.

The imaging signal line driver circuit 303s(2) can read out imaging signals.

As illustrated in FIGS. 5B and 5C, the input-output device 390 includes the substrate 701, the bonding layer 703, the oxide layer 704, the insulating layer 705, the substrate 711, the bonding layer 713, the oxide layer 714, and the insulating layer 715. The substrates 701 and 711 are attached to each other with a bonding layer 360.

The substrate 701 and the oxide layer 704 are attached to each other with the bonding layer 703. The substrate 711 and the oxide layer 714 are attached to each other with the bonding layer 713.

Embodiment 2 can be referred to for materials used for the substrates, the bonding layers, the oxide layers, and the insulating layers.

Each of the pixels 302 includes the sub-pixel 302R, a sub-pixel 302G, and a sub-pixel 302B (see FIG. 5C).

For example, the sub-pixel 302R includes the light-emitting element 350R and the pixel circuit. The pixel circuit includes a transistor 302t that can supply electric power to the light-emitting element 350R. The sub-pixel 302R further includes an optical element (e.g., a coloring layer 367R that transmits red light).

The light-emitting element 350R includes a lower electrode 351R, an EL layer 353, and an upper electrode 352, which are stacked in this order (see FIG. 5C).

The EL layer 353 includes a first EL layer 353a, an intermediate layer 354, and a second EL layer 353b, which are stacked in this order.

Note that a microcavity structure can be provided for the light-emitting element 350R so that light with a specific wavelength can be efficiently extracted. Specifically, an EL layer may be provided between a film that reflects visible light and a film that partly reflects and partly transmits visible light, which are provided so that light with a specific wavelength can be efficiently extracted.

The sub-pixel 302R includes the bonding layer 360 that is in contact with the light-emitting element 350R and the coloring layer 367R.

The coloring layer 367R is positioned in a region overlapping with the light-emitting element 350R. Accordingly, part of light emitted from the light-emitting element 350R passes through the bonding layer 360 and through the coloring layer 367R and is emitted to the outside of the sub-pixel 302R as indicated by an arrow in FIG. 5B or 5C.

The input-output device 390 includes a light-blocking layer 367BM. The light-blocking layer 367BM is provided so as to surround the coloring layer (e.g., the coloring layer 367R).

The input-output device 390 includes an anti-reflective layer 367p positioned in a region overlapping with the display portion 301. As the anti-reflective layer 367p, a circular polarizing plate can be used, for example.

The input-output device 390 includes an insulating layer 321. The insulating layer 321 covers the transistor 302t and the like. Note that the insulating layer 321 can be used as a layer for planarizing unevenness caused by the pixel circuits and the imaging pixel circuits. An insulating layer that can inhibit diffusion of impurities to the transistor 302t and the like can be used as the insulating layer 321.

The input-output device 390 includes a partition 328 that overlaps with an end portion of the lower electrode 351R. A spacer 329 that controls the distance between the substrate 701 and the substrate 711 is provided on the partition 328.

The image signal line driver circuit 303s(1) includes a transistor 303t and a capacitor 303c. Note that the driver circuit can be formed in the same process and over the same substrate as those of the pixel circuits. As illustrated in FIG. 5B, the transistor 303t may include a second gate 304 over the insulating layer 321. The second gate 304 may be electrically connected to a gate of the transistor 303t, or different potentials may be supplied to these gates. Alternatively, if necessary, the second gate 304 may be provided for a transistor 308t, the transistor 302t, or the like.

The imaging pixels 308 each include a photoelectric conversion element 308p and an imaging pixel circuit. The imaging pixel circuit can sense light received by the photoelectric conversion element 308p. The imaging pixel circuit includes the transistor 308t.

For example, a PIN photodiode can be used as the photoelectric conversion element 308p.

The input-output device 390 includes a wiring 311 through which a signal is supplied. The wiring 311 is provided with a terminal 319. An FPC 309 through which a signal such as an image signal or a synchronization signal is supplied is electrically connected to the terminal 319. A printed wiring board (PWB) may be attached to the FPC 309.

Note that transistors such as the transistors 302t, 303t, and 308t can be formed in the same process. Alternatively, the transistors may be formed in different processes.

<Structure Example 2>

Figure 6A:
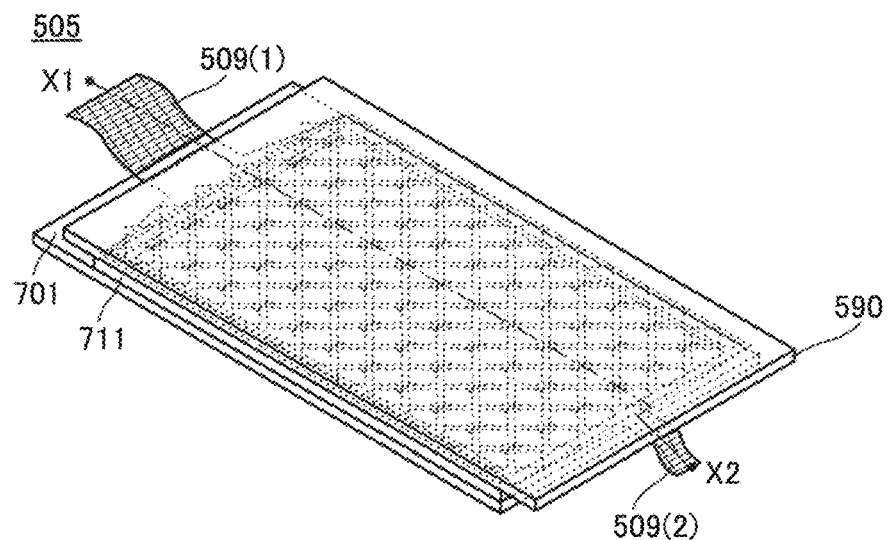
FIGS. 6A and 6B illustrate an example of an input-output device.
Figure 6B:
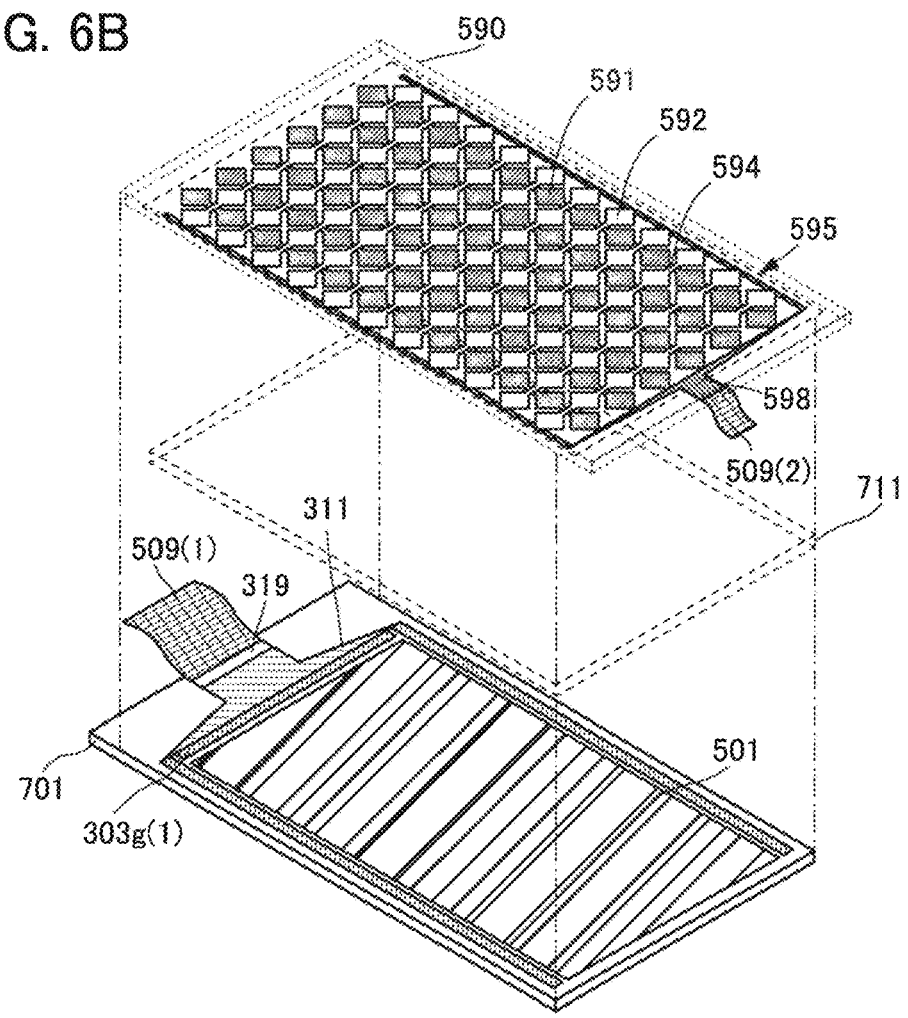
Figure 7A:
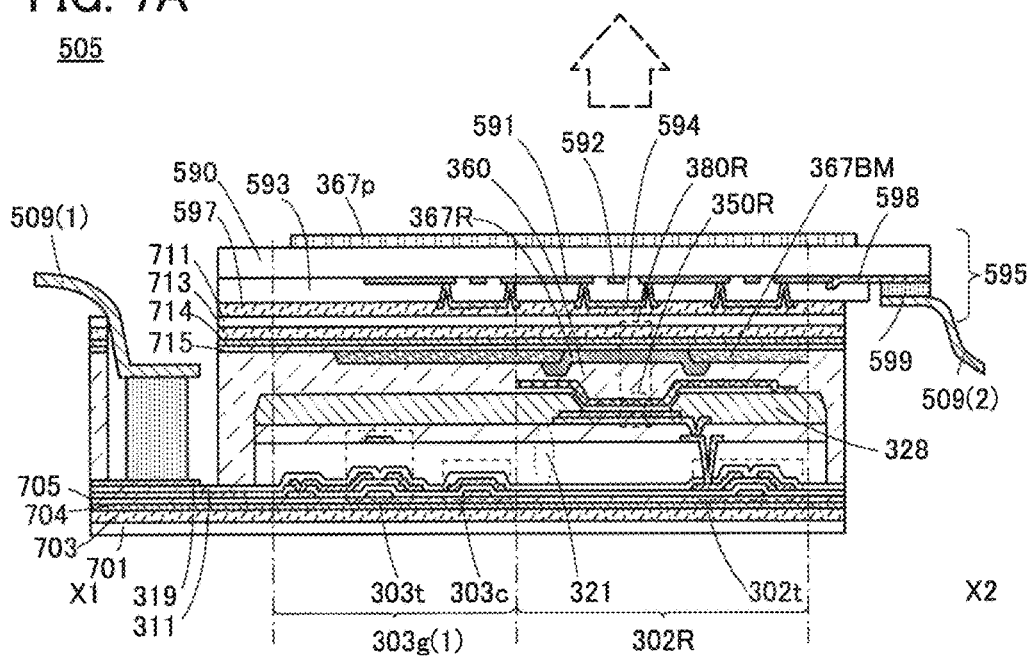
FIGS. 7A to 7C illustrate an example of an input-output device.
Figure 7B:
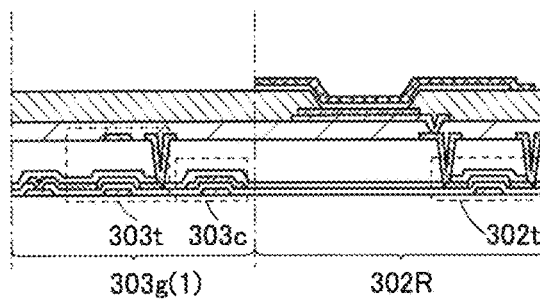
Figure 7C:
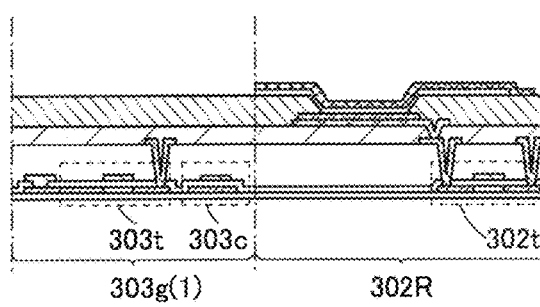

FIGS. 6A and 6B are perspective views of an input-output device 505. FIGS. 6A and 6B illustrate only main components for simplicity. FIGS. 7A to 7C are each a cross-sectional view taken along the dashed-dotted line X1-X2 in FIG. 6A.

As illustrated in FIGS. 6A and 6B, the input-output device 505 includes a display portion 501, the scan line driver circuit 303g(1), a touch sensor 595, and the like. Furthermore, the input-output device 505 includes the substrate 701, the substrate 711, and a substrate 590.

The input-output device 505 includes a plurality of pixels and a plurality of wirings 311. The plurality of wirings 311 can supply signals to the pixels. The plurality of wirings 311 are arranged to a peripheral portion of the substrate 701, and part of the plurality of wirings 311 form the terminal 319. The terminal 319 is electrically connected to an FPC 509(1).

The input-output device 505 includes the touch sensor 595 and a plurality of wirings 598. The plurality of wirings 598 are electrically connected to the touch sensor 595. The plurality of wirings 598 are arranged to a peripheral portion of the substrate 590, and part of the plurality of wirings 598 form a terminal. The terminal is electrically connected to an FPC 509(2). Note that in FIG. 6B, electrodes, wirings, and the like of the touch sensor 595 provided on the back side of the substrate 590 (the side facing the substrate 701) are indicated by solid lines for clarity.

As the touch sensor 595, for example, a capacitive touch sensor can be used. Examples of the capacitive touch sensor include a surface capacitive touch sensor and a projected capacitive touch sensor. An example of using a projected capacitive touch sensor is described here.

Examples of the projected capacitive touch sensor include a self-capacitive touch sensor and a mutual capacitive touch sensor. The use of a mutual capacitive type is preferred because multiple points can be sensed simultaneously.

Note that a variety of sensors that can sense the closeness or the contact of a sensing target such as a finger can be used as the touch sensor 595.

The projected capacitive touch sensor 595 includes electrodes 591 and electrodes 592. The electrodes 591 are electrically connected to any of the plurality of wirings 598, and the electrodes 592 are electrically connected to any of the other wirings 598.

The electrodes 592 each have a shape of a plurality of quadrangles arranged in one direction with one corner of a quadrangle connected to one corner of another quadrangle as illustrated in FIGS. 6A and 6B.

The electrodes 591 each have a quadrangular shape and are arranged in a direction intersecting with the direction in which the electrodes 592 extend. Note that the plurality of electrodes 591 is not necessarily arranged in the direction orthogonal to one electrode 592 and may be arranged to intersect with one electrode 592 at an angle of less than 90 degrees.

The wiring 594 intersects with the electrode 592. The wiring 594 electrically connects two electrodes 591 between which one of the electrodes 592 is positioned. The intersecting area of the electrode 592 and the wiring 594 is preferably as small as possible. Such a structure allows a reduction in the area of a region where the electrodes are not provided, reducing unevenness in transmittance. As a result, unevenness in luminance of light emitted through the touch sensor 595 can be reduced.

Note that the shapes of the electrodes 591 and the electrodes 592 are not limited to the above-mentioned shapes and can be any of a variety of shapes. For example, a plurality of first electrodes each having a stripe shape may be provided so that space between two adjacent first electrodes are reduced as much as possible, and a plurality of second electrodes each having a stripe shape may be provided so as to intersect the first electrodes with an insulating layer sandwiched between the first electrodes and the second electrodes. In that case, two adjacent second electrodes may be spaced apart from each other. In that case, between two adjacent second electrodes, it is preferable to provide a dummy electrode which is electrically insulated from these electrodes, whereby the area of a region having a different transmittance can be reduced.

As illustrated in FIG. 7A, the input-output device 505 includes the substrate 701, the bonding layer 703, the oxide layer 704, the insulating layer 705, the substrate 711, the bonding layer 713, the oxide layer 714 and the insulating layer 715. The substrates 701 and 711 are attached to each other with the bonding layer 360.

A bonding layer 597 attaches the substrate 590 to the substrate 711 so that the touch sensor 595 overlaps with the display portion 501. The bonding layer 597 has a light-transmitting property.

The electrodes 591 and the electrodes 592 are formed using a light-transmitting conductive material. As a light-transmitting conductive material, a conductive oxide such as indium oxide, ITO, indium zinc oxide, ZnO, or zinc oxide to which gallium is added can be used. A film including graphene may be used as well. The film including graphene can be formed, for example, by reducing a film including graphene oxide. As a reducing method, heating or the like can be employed.

The resistance of a material used for conductive films such as the electrodes 591, the electrodes 592, and the wiring 594, i.e., a wiring and an electrode in the touch panel, is preferably low. Examples of the material include ITO, indium zinc oxide, ZnO, silver, copper, aluminum, a carbon nanotube, and graphene. Alternatively, a metal nanowire including a number of conductors with an extremely small width (for example, a diameter of several nanometers) may be used. Examples of such a metal nanowire include an Ag nanowire, a Cu nanowire, and an Al nanowire. In the case of using an Ag nanowire, light transmittance of 89% or more and a sheet resistance of 40 ohm/square or more and 100 ohm/square or less can be achieved. Note that a metal nanowire, a carbon nanotube, graphene, or the like may be used for an electrode of the display element, e.g., a pixel electrode or a common electrode because of its high transmittance.

The electrodes 591 and the electrodes 592 may be formed by depositing a light-transmitting conductive material on the substrate 590 by a sputtering method and then removing an unnecessary portion by a variety of patterning technique such as photolithography.

The electrodes 591 and the electrodes 592 are covered with an insulating layer 593. Openings reaching the electrodes 591 are formed in the insulating layer 593, and the wiring 594 electrically connects the adjacent electrodes 591. A light-transmitting conductive material can be favorably used as the wiring 594 because the aperture ratio of the input-output device can be increased. Moreover, a material with higher conductivity than the conductivities of the electrodes 591 and the electrodes 592 can be favorably used for the wiring 594 because electric resistance can be reduced.

Note that an insulating layer covering the insulating layer 593 and the wiring 594 may be provided to protect the touch sensor 595.

A connection layer 599 electrically connects the wirings 598 to the FPC 509(2).

The display portion 501 includes a plurality of pixels arranged in a matrix. Each pixel has the same structure as Structure Example 1; thus, description is omitted.

Any of various kinds of transistors can be used in the input-output device. A structure in the case of using bottom-gate transistors is illustrated in FIGS. 7A and 7B.

For example, a semiconductor layer containing an oxide semiconductor, amorphous silicon, or the like can be used in the transistor 302*t* and the transistor 303*t* illustrated in FIG. 7A.

For example, a semiconductor layer containing polycrystalline silicon that is obtained by crystallization process such as laser annealing can be used in the transistor 302*t* and the transistor 303*t* illustrated in FIG. 7B.

A structure in the case of using top-gate transistors is illustrated in FIG. 7C.

For example, a semiconductor layer including polycrystalline silicon, a single crystal silicon film that is transferred from a single crystal silicon substrate, or the like can be used in the transistor 302*t* and the transistor 303*t* illustrated in FIG. 7C.

(Structure Example 3)

Figure 8A:
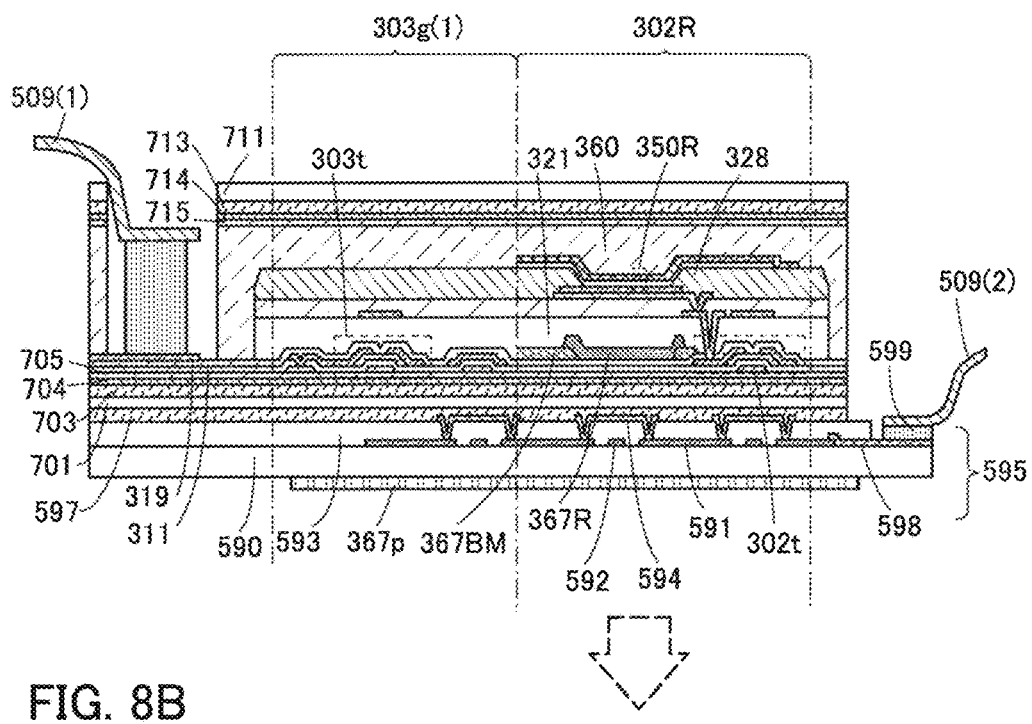
FIGS. 8A to 8C illustrate an example of an input-output device.
Figure 8B:
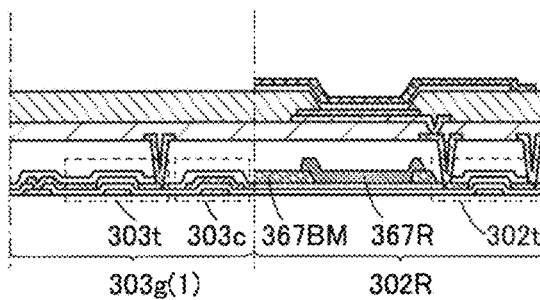
Figure 8C:
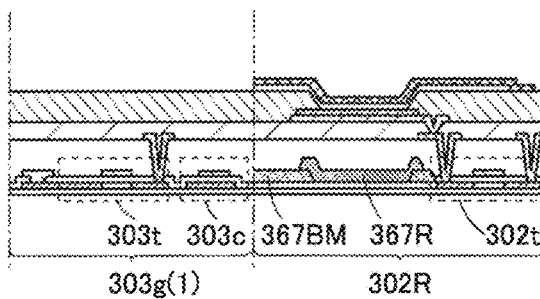

FIGS. 8A to 8C are cross-sectional views of an input-output device 505B. The input-output device 505B described in this embodiment is different from the input-output device 505 in Structure Example 2 in that received image data is displayed on the side where the transistors are provided and that the touch sensor is provided on the substrate 701 side of the display portion. Different structures will be described in detail below, and the above description is referred to for the other similar structures.

The coloring layer 367R is positioned in a region overlapping with the light-emitting element 350R. The light-emitting element 350R illustrated in FIG. 8A emits light to the side where the transistor 302*t* is provided. Accordingly, part of light emitted from the light-emitting element 350R passes through the coloring layer 367R and is emitted to the outside of the input-output device 505B as indicated by an arrow in FIG. 8A.

The input-output device 505B includes the light-blocking layer 367BM on the light extraction side. The light-blocking layer 367BM is provided so as to surround the coloring layer (e.g., the coloring layer 367R).

The touch sensor 595 is provided not on the substrate 711 side but on the substrate 701 side (see FIG. 8A).

The bonding layer 597 attaches the substrate 590 to the substrate 701 so that the touch sensor 595 overlaps with the display portion. The bonding layer 597 has a light-transmitting property.

Note that a structure in the case of using bottom-gate transistors in the display portion 501 is illustrated in FIGS. 8A and 8B.

For example, a semiconductor layer containing an oxide semiconductor, amorphous silicon, or the like can be used in the transistor 302*t* and the transistor 303*t* illustrated in FIG. 8A.

For example, a semiconductor layer containing polycrystalline silicon can be used in the transistor 302*t* and the transistor 303*t* illustrated in FIG. 8B.

A structure in the case of using top-gate transistors is illustrated in FIG. 8C.

For example, a semiconductor layer containing polycrystalline silicon, a single crystal silicon film that is transferred from a single crystal silicon substrate, or the like can be used in the transistor 302*t* and the transistor 303*t* illustrated in FIG. 8C.

(Structure Example 4)

Figure 9:
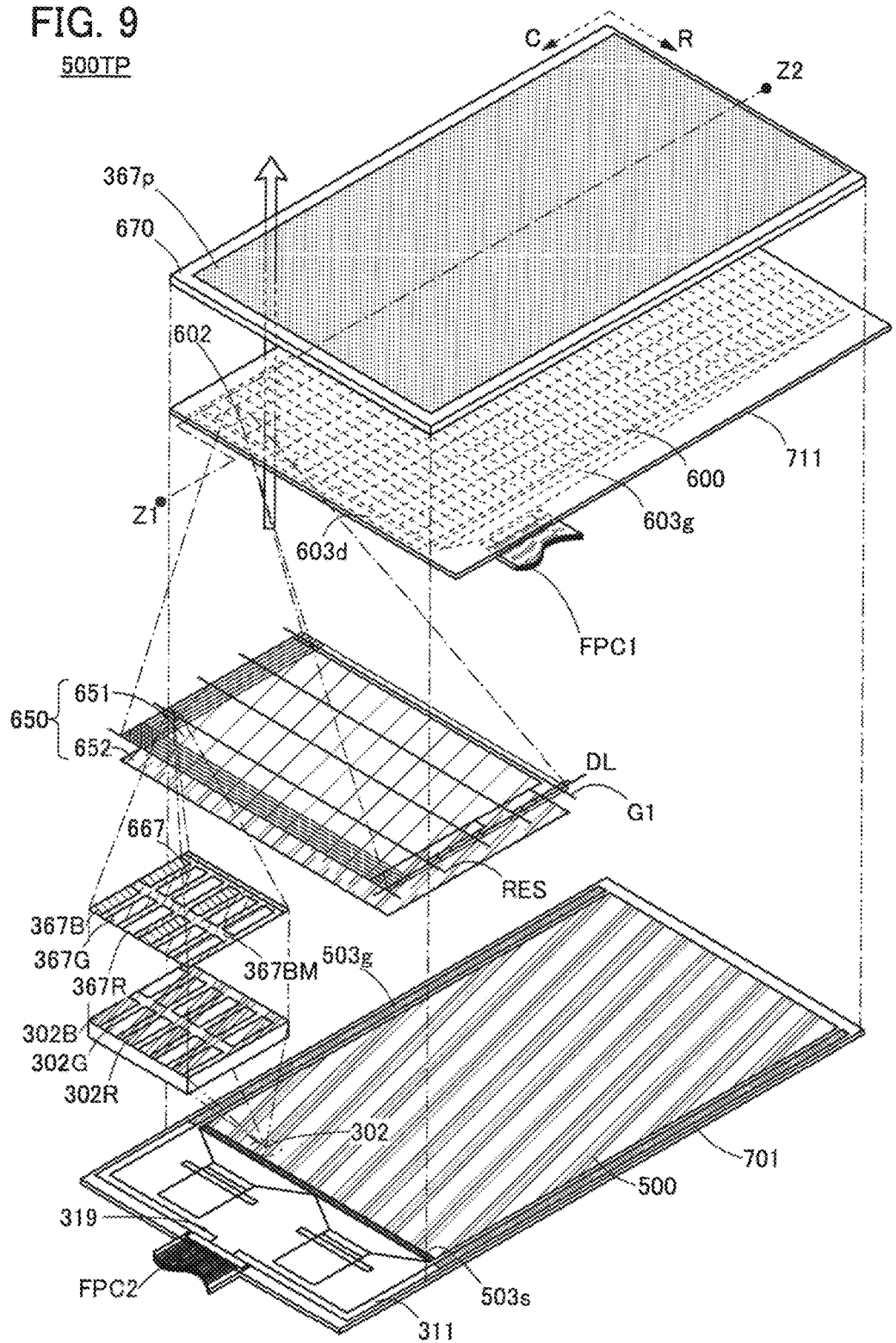
FIG. 9 illustrates an example of an input-output device.
Figure 10:
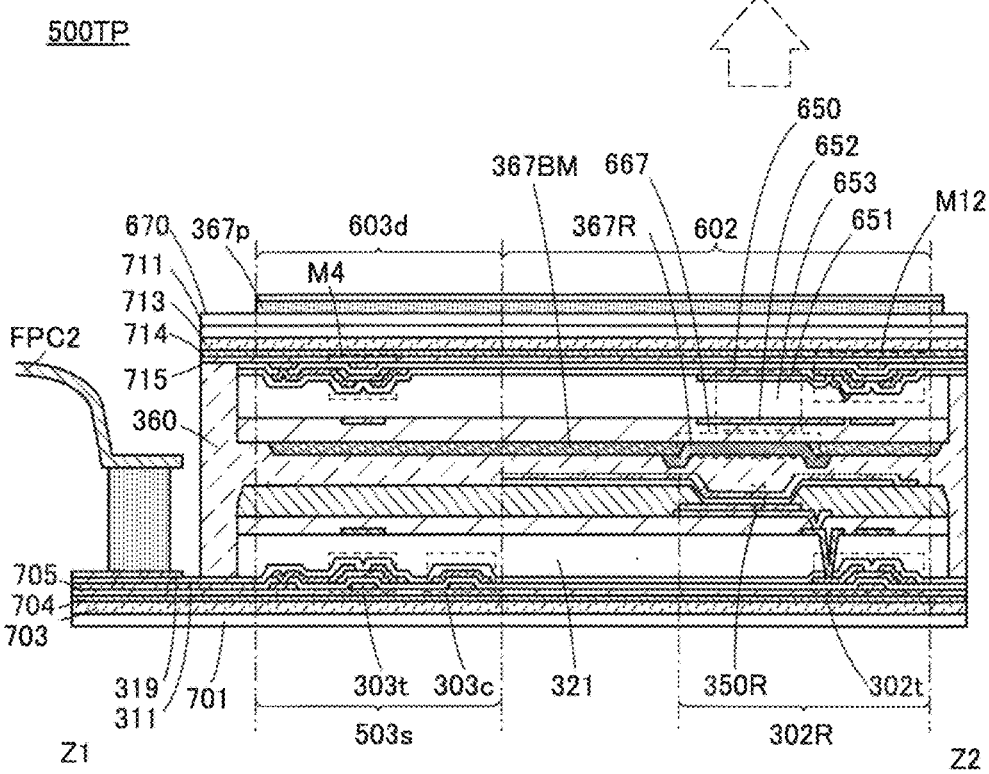
FIG. 10 illustrates an example of an input-output device.

As illustrated in FIG. 9, an input-output device 500TP includes a display portion 500 and an input portion 600 that overlap each other. FIG. 10 is a cross-sectional view taken along the dashed-dotted line Z1-Z2 in FIG. 9.

Individual components included in the input-output device 500TP are described below. Note that these units cannot be clearly distinguished and one unit also serves as another unit or include part of another unit in some cases. Note that the input-output device 500TP in which the input portion 600 overlaps with the display portion 500 is also a touch panel.

The input portion 600 includes a plurality of sensing units 602 arranged in a matrix. The input portion 600 also includes a selection signal line G1, a control line RES, a signal line DL, and the like.

The selection signal line G1 and the control line RES are electrically connected to the plurality of sensing units 602 that are arranged in the row direction (indicated by the arrow R in FIG. 9). The signal line DL is electrically connected to the plurality of sensing units 602 that are arranged in the column direction (indicated by the arrow C in FIG. 9).

The sensing unit 602 senses an object that is close thereto or in contact therewith and supplies a sensing signal. For example, the sensing unit 602 senses, for example, capacitance, illuminance, magnetic force, electric waves, or pressure and supplies data based on the sensed physical quantity. Specifically, a capacitor, a photoelectric conversion element, a magnetic sensing element, a piezoelectric element, a resonator, or the like can be used as the sensing element.

The sensing unit 602 senses, for example, a change in capacitance between the sensing unit 602 and an object close thereto or an object in contact therewith.

Note that when an object having a dielectric constant higher than that of the air, such as a finger, comes close to a conductive film in the air, the capacitance between the finger and the conductive film changes. The sensing unit 602 can sense the capacitance change and supply sensing data.

For example, distribution of charge occurs between the conductive film and the capacitor owing to the change in the electrostatic capacitance, so that the voltage across the capacitor is changed. This voltage change can be used as the sensing signal.

The sensing unit 602 is provided with a sensor circuit. The sensor circuit is electrically connected to the selection signal line G1, the control line RES, the signal line DL, or the like.

The sensor circuit includes a transistor, a sensor element, and/or the like. For example, a conductive film and a capacitor electrically connected to the conductive film can be used for the sensor circuit. A capacitor and a transistor electrically connected to the capacitor can also be used for the sensor circuit.

For example, a capacitor 650 including an insulating layer 653, and a first electrode 651 and a second electrode 652 between which the insulating layer 653 is provided can be used for the sensor circuit (see FIG. 10A). Specifically, the voltage between the electrodes of the capacitor 650 changes when an object approaches the conductive film which is electrically connected to one electrode of the capacitor 650.

The sensing unit 602 includes a switch that can be turned on or off in accordance with a control signal. For example, a transistor M12 can be used as the switch.

A transistor which amplifies a sensing signal can be used in the sensor unit 602.

Transistors manufactured through the same process can be used as the transistor that amplifies a sensing signal and the switch. This allows the input portion 600 to be provided through a simplified process.

The sensing unit includes a plurality of window portions 667 arranged in a matrix. The window portions 667 transmit visible light. A light-blocking layer BM may be provided between the window portions 667.

A coloring layer is provided in a position overlapping with the window portion 667 in the input-output device 500TP. The coloring layer transmits light of a predetermined color. Note that the coloring layer can be referred to as a color filter. For example, a coloring layer 367B transmitting blue light, a coloring layer 367G transmitting green light, and a coloring layer 367R transmitting red light can be used. Alternatively, a coloring layer transmitting yellow light or white light may be used.

The display portion 500 includes the plurality of pixels 302 arranged in a matrix. The pixel 302 is positioned so as to overlap with the window portions 667 of the input portion 600. The pixels 302 may be arranged at higher resolution than the sensing units 602. Each pixel has the same structure as Structure Example 1; thus, description is omitted.

The input-output device 500TP includes the input portion 600 that includes the plurality of sensing units 602 arranged in a matrix and the window portions 667 transmitting visible light, the display portion 500 that includes the plurality of pixels 302 overlapping with the window portions 667, and the coloring layers between the window portions 667 and the pixels 302. Each of the sensing units includes a switch that can reduce interference in another sensing unit.

Thus, sensing data obtained by each sensor unit can be supplied together with the positional information of the sensor unit. Sensing data can be supplied in relation to the positional data of the pixel for displaying an image. The sensor unit which does not supply the sensing data is not electrically connected to a signal line, whereby interference with the sensor unit which supplies a sensing signal can be reduced. Consequently, the input-output device 500TP that is highly convenient or highly reliable can be provided. Specifically, a user of the input-output device 500TP can make a variety of input operations (e.g., tap, drag, swipe, and pinch-in operation) using his/her finger or the like on the input portion 600.

An arithmetic unit determines whether or not supplied data satisfies a predetermined condition on the basis of a program or the like and executes an instruction associated with a predetermined gesture.

Thus, a user of the input portion 600 can make the predetermined gesture with his/her finger or the like and make the arithmetic unit execute an instruction associated with the predetermined gesture.

For example, first, the input portion 600 of the input-output device 500TP selects one sensing unit X from the plurality of sensing units that can supply sensing data to one signal line. Then, electrical continuity is disconnected between the signal line and the sensing units other than the sensing unit X. This can reduce interference of the other sensing units in the sensing unit X.

Thus, the input-output device 500TP can drive the sensing unit and supply sensing data independently of its size. The input-output device 500TP can have a variety of sizes, for example, ranging from a size for a hand-held device to a size for an electronic blackboard.

The input-output device 500TP can be folded and unfolded. Even in the case where interference of the other sensing units in the sensing unit X is different between the folded state and the unfolded state, the sensing unit can be driven and sensing data can be supplied without dependence on the state of the input-output device 500TP.

The display portion 500 of the input-output device 500TP can be supplied with display data. For example, an arithmetic unit can supply the display data.

In addition to the above structure, the input-output device 500TP can have the following structure.

The input-output device 500TP may include a driver circuit 603g or a driver circuit 603d. In addition, the input-output device 500TP (or driver circuit) may be electrically connected to an FPC1.

The driver circuit 603g can supply selection signals at predetermined timings, for example. Specifically, the driver circuit 603g supplies selection signals to the selection signal lines G1 row by row in a predetermined order. Any of a variety of circuits can be used as the driver circuit 603g. For example, a shift register, a flip flop circuit, a combination circuit, or the like can be used.

The driver circuit 603d supplies sensing data on the basis of a sensing signal supplied from the sensing unit 602. Any of a variety of circuits can be used as the driver circuit 603d. For example, a circuit that can form a source follower circuit or a current mirror circuit by being electrically connected to the sensing circuit in the sensing unit can be used as the driver circuit 603d. An analog-to-digital converter circuit that converts a sensing signal into a digital signal may be provided in the driver circuit 603d.

The FPC1 supplies a timing signal, a power supply potential, or the like and is supplied with a sensing signal.

The input-output device 500TP may include a driver circuit 503g, a driver circuit 503s, a wiring 311, and a terminal 319. The input-output device 500TP (or driver circuit) may be electrically connected to an FPC2.

A protective layer 670 that prevents damage and protects the input-output device 500TP may be provided. For example, a ceramic coat layer or a hard coat layer can be used as the protective layer 670. Specifically, a layer containing aluminum oxide or a UV curable resin can be used.

This embodiment can be combined with any other embodiment as appropriate.

(Embodiment 4)

In this embodiment, electronic devices and lighting devices of one embodiment of the present invention will be described with reference to drawings.

A light-emitting device, a display device, a semiconductor device, or the like that can be used for an electronic appliance or a lighting device can be fabricated with a high yield by employing the separation method of one embodiment of the present invention. An electronic device or a lighting device having a curved surface or flexibility can be manufactured with a high yield by employing the separation method of one embodiment of the present invention.

Examples of electronic devices include a television set (also referred to as a television or a television receiver), a monitor of a computer or the like, a digital camera, a digital video camera, a digital photo frame, a mobile phone (also referred to as a mobile phone device), a portable game machine, a portable information terminal, an audio reproducing device, a stationary game machine such as a pinball machine, and the like.

The electronic device or the lighting device of one embodiment of the present invention has flexibility and therefore can be incorporated along a curved inside-outside wall surface of a house or a building or a curved interior/exterior surface of a car.

Furthermore, the electronic device of one embodiment of the present invention may include a secondary battery. It is preferable that the secondary battery be capable of being charged by non-contact power transmission.

Examples of the secondary battery include a lithium ion secondary battery such as a lithium polymer battery using a gel electrolyte (lithium ion polymer battery), a nickel-hydride battery, a nickel-cadmium battery, an organic radical battery, a lead-acid battery, an air secondary battery, a nickel-zinc battery, and a silver-zinc battery.

The electronic device of one embodiment of the present invention may include an antenna. When a signal is received by the antenna, the electronic device can display an image, data, or the like on a display portion. When the electronic device includes a secondary battery, the antenna may be used for contactless power transmission.

FIGS. 11A, 11B, 11C1, 11C2, 11D, and 11E illustrate an example of an electronic device including a display portion 7000 with a curved surface. The display surface of the display portion 7000 is bent, and images can be displayed on the bent display surface. The display portion 7000 may be flexible.

The display portion 7000 of each of the electronic devices illustrated in FIGS. 11A, 11B, 11C1, 11C2, 11D, and 11E can be formed using the light-emitting device, the display device, the input-output device, or the like of one embodiment of the present invention.

One embodiment of the present invention makes it possible to provide an electronic device having a curved display portion with a high yield.

Figure 11A:
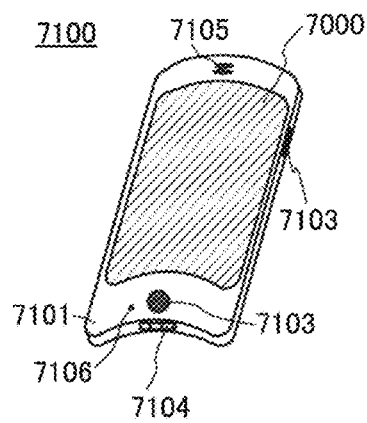

FIG. 11A illustrates an example of a mobile phone. A mobile phone 7100 includes a housing 7101, the display portion 7000, operation buttons 7103, an external connection port 7104, a speaker 7105, a microphone 7106, and the like.

The mobile phone 7100 illustrated in FIG. 11A includes a touch sensor in the display portion 7000. Moreover, operations such as making a call and inputting a letter can be performed by touch on the display portion 7000 with a finger, a stylus, or the like.

With the operation buttons 7103, power ON or OFF can be switched. In addition, types of images displayed on the display portion 7000 can be switched; switching images from a mail creation screen to a main menu screen, for example.

Figure 11B:
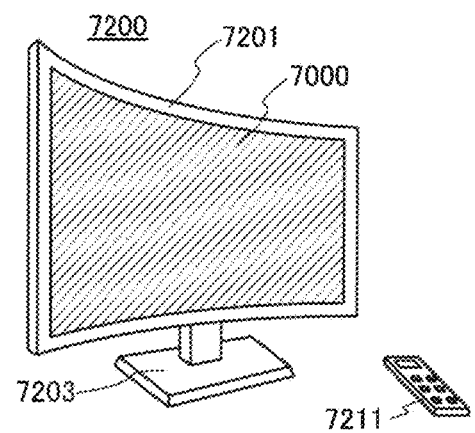

FIG. 11B illustrates an example of a television set. In the television device 7200, the display portion 7000 is incorporated into the housing 7201. Here, the housing 7201 is supported by a stand 7203.

The television set 7200 illustrated in FIG. 11B can be operated with an operation switch of the housing 7201 or a separate remote controller 7211. The display portion 7000 may include a touch sensor. The display portion 7000 can be operated by touching the display portion with a finger or the like. The remote controller 7211 may be provided with a display portion for displaying data output from the remote controller 7211. With operation keys or a touch panel of the remote controller 7211, channels and volume can be controlled and images displayed on the display portion 7000 can be controlled.

The television set 7200 is provided with a receiver, a modem, and the like. A general television broadcast can be received with the receiver. When the television set is connected to a communication network with or without wires via the modem, one-way (from a transmitter to a receiver) or two-way (between a transmitter and a receiver or between receivers) data communication can be performed.

FIGS. 11C1, 11C2, 11D, and 11E illustrate an example of a portable information terminal. Each of the portable information terminals includes a housing 7301 and the display portion 7000. Each of the portable information terminals may also include an operation button, an external connection port, a speaker, a microphone, an antenna, a battery, or the like. The display portion 7000 is provided with a touch sensor. An operation of the portable information terminal can be performed by touching the display portion 7000 with a finger, a stylus, or the like.

FIG. 11C1 is a perspective view of a portable information terminal 7300. FIG. 11C2 is a top view of the portable information terminal 7300. FIG. 11D is a perspective view of a portable information terminal 7310. FIG. 11E is a perspective view of a portable information terminal 7320.

Each of the portable information terminals functions as, for example, one or more of a telephone set, a notebook, and an information browsing system. Specifically, each of the portable information terminals can be used as a smartphone. Each of the portable information terminals is capable of executing a variety of applications such as mobile phone calls, e-mailing, reading and editing texts, music reproduction, Internet communication, and a computer game, for example.

The portable information terminals 7300, 7310, and 7320 can display characters and image information on its plurality of surfaces. For example, as illustrated in FIGS. 11C1 and 11D, three operation buttons 7302 can be displayed on one surface, and information 7303 indicated by a rectangle can be displayed on another surface. FIG. 11C2 illustrates an example in which information 7303 is displayed at the top of the portable information terminal. FIG. 11D illustrates an example in which information 7303 is displayed on the side of the portable information terminal. Information may be displayed on three or more surfaces of the portable information terminal. FIG. 11E illustrates an example where information 7304, information 7305, and information 7306 are displayed on different surfaces.

Examples of the information include notification from a social networking service (SNS), display indicating reception of an e-mail or an incoming call, the title of an e-mail, the sender of an e-mail, the date, the time, remaining battery, the reception strength of an antenna, and the like. Alternatively, the operation button, an icon, or the like may be displayed instead of the information.

For example, a user of the portable information terminal 7300 can see the display (here, the information 7303) with the portable information terminal 7300 put in a breast pocket of his/her clothes.

Specifically, a caller's phone number, name, or the like of an incoming call is displayed in a position that can be seen from above the portable information terminal 7300. Thus, the user can see the display without taking out the portable information terminal 7300 from the pocket and decide whether to answer the call.

FIGS. 11F to 11H each illustrate an example of a lighting device having a curved light-emitting portion.

The light-emitting portion included in each of the lighting devices illustrated in FIGS. 11F to 11H can be manufactured using the light-emitting device or the like of one embodiment of the present invention.

One embodiment of the present invention makes it possible to provide a lighting device having a curved light-emitting portion with a high yield.

A lighting device 7400 illustrated in FIG. 11F includes a light-emitting portion 7402 having a wave-shaped light-emitting surface, which is a good-design lighting device.

A light-emitting portion 7412 included in the lighting device 7410 illustrated in FIG. 11G has two convex-curved light-emitting portions symmetrically placed. Thus, all directions can be illuminated with the lighting device 7410 as a center.

A lighting device 7420 illustrated in FIG. 11H includes a concave-curved light-emitting portion 7422. This is suitable for illuminating a specific range because light emitted from the concave-curved light-emitting portion 7422 is collected to the front of the lighting device 7420. In addition, with this structure, a shadow is less likely to be produced.

The light-emitting portion included in each of the lighting devices 7400, 7410 and 7420 may be flexible. The light-emitting portion may be fixed on a plastic member, a movable frame, or the like so that an emission surface of the light-emitting portion can be bent freely depending on the intended use.

The lighting devices 7400, 7410, and 7420 each include a stage 7401 provided with an operation switch 7403 and a light-emitting portion supported by the stage 7401.

Note that although the lighting device in which the light-emitting portion is supported by the stage is described as an example here, a housing provided with a light-emitting portion can be fixed on a ceiling or suspended from a ceiling. Since the light-emitting surface can be curved, the light-emitting surface can be deformed to have a depressed shape, whereby a particular region can be brightly illuminated, or the light-emitting surface is deformed to have a projecting shape, whereby a whole room can be brightly illuminated.

FIGS. 12A1, 12A2, 12B, 12C, 12D, 12E, 12F, 12G, 12H, and 12I each illustrate an example of a portable information terminal including a display portion 7001 having flexibility.

The display portion 7001 included in each of the portable information terminals is manufactured using the light-emitting device, the display device, the input-output device, or the like of one embodiment of the present invention. For example, a light-emitting device, a display device, or an input-output device that can be bent with a radius of curvature of greater than or equal to 0.01 mm and less than or equal to 150 mm can be used. The display portion 7001 may include a touch sensor so that the portable information terminal can be operated by touching the display portion 7001 with a finger or the like.

One embodiment of the present invention makes it possible to provide an electronic device including a display portion having flexibility with a high yield.

FIGS. 12A1 and 12A2 are a perspective view and a cross-sectional view illustrating an example of the portable information terminal. A portable information terminal 7500 includes a housing 7501, the display portion 7001, a display portion tab 7502, operation buttons 7503, or the like.

The portable information terminal 7500 includes a rolled flexible display portion 7001 in the housing 7501.

The portable information terminal 7500 can receive a video signal with a control portion incorporated therein and can display the received video on the display portion 7001. The portable information terminal 7500 incorporates a battery. A terminal portion for connecting a connector may be included in the housing 7501 so that a video signal or power can be directly supplied from the outside with a wiring.

By pressing the operation buttons 7503, power ON/OFF, switching of displayed videos, and the like can be performed. Although FIGS. 12A1, 12A2, and 12B illustrate an example where the operation buttons 7503 are positioned on a side surface of the portable information terminal 7500, one embodiment of the present invention is not limited thereto. The operation buttons 7503 may be placed on a display surface (a front surface) or a rear surface of the portable information terminal 7500.

FIG. 12B illustrates the portable information terminal 7500 in a state where the display portion 7001 is pulled out with the display portion tab 7502. Videos can be displayed on the display portion 7001 in this state. In addition, the portable information terminal 7500 may perform different displays in the state where part of the display portion 7001 is rolled as shown in FIG. 12A1 and in the state where the display portion 7001 is pulled out as shown in FIG. 12B. For example, in the state shown in FIG. 12A1, the rolled portion of the display portion 7001 is put in a non-display state, which results in a reduction in power consumption of the portable information terminal 7500.

A reinforcement frame may be provided for a side portion of the display portion 7001 so that the display portion 7001 has a flat display surface when pulled out.

Note that in addition to this structure, a speaker may be provided for the housing so that sound is output with an audio signal received together with a video signal.

FIGS. 12C to 12E illustrate an example of a foldable portable information terminal. FIG. 12C illustrates a portable information terminal 7600 that is opened. FIG. 12D illustrates the portable information terminal 7600 that is being opened or being folded. FIG. 12E illustrates the portable information terminal 7600 that is folded. The portable information terminal 7600 is highly portable when folded, and is highly browsable when opened because of a seamless large display area.

A display portion 7001 is supported by three housings 7601 joined together by hinges 7602. By folding the portable information terminal 7600 at a connection portion between two housings 7601 with the hinges 7602, the portable information terminal 7600 can be reversibly changed in shape from an opened state to a folded state.

Figure 12F:
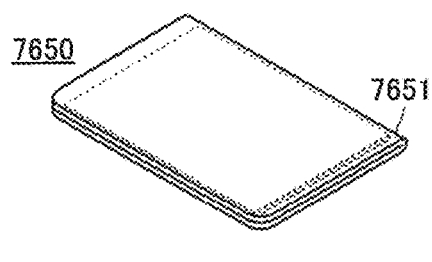
Figure 12G:
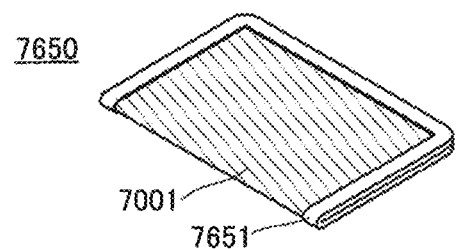

FIGS. 12F and 12G illustrate an example of a foldable portable information terminal. FIG. 12F illustrates a portable information terminal 7650 that is folded so that the display portion 7001 is on the inside. FIG. 12G illustrates the portable information terminal 7650 that is folded so that the display portion 7001 is on the outside. The portable information terminal 7650 includes the display portion 7001 and a non-display portion 7651. When the portable information terminal 7650 is not used, the portable information terminal 7650 is folded so that the display portion 7001 is on the inside, whereby the display portion 7001 can be prevented from being contaminated or damaged.

Figure 12H:
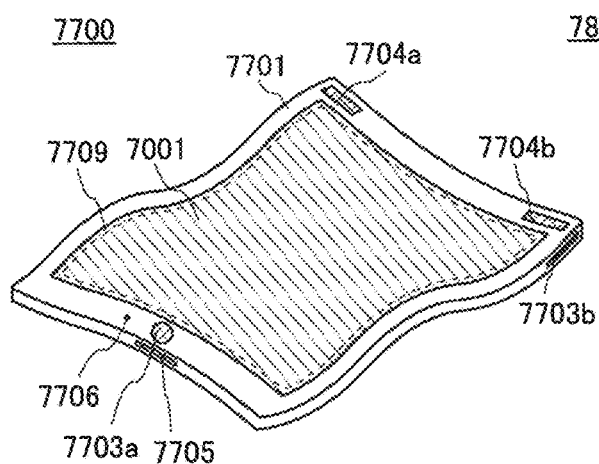

FIG. 12H illustrates an example of a flexible portable information terminal. A portable information terminal 7700 includes a housing 7701 and the display portion 7001. The portable information terminal 7700 may include buttons 7703a and 7703b which serve as input means, speakers 7704a and 7704b which serve as sound output means, an external connection port 7705, a microphone 7706, or the like. A flexible battery 7709 can be mounted on the portable information terminal 7700. The battery 7709 may be arranged to overlap with the display portion 7001, for example.

The housing 7701, the display portion 7001, the battery 7709 are flexible. Thus, it is easy to curve the portable information terminal 7700 into a desired shape or to twist the portable information terminal 7700. For example, the portable information terminal 7700 can be curved so that the display portion 7001 is on the inside or in the outside. The portable information terminal 7700 can be used in a rolled state. Since the housing 7701 and the display portion 7001 can be transformed freely in this manner, the portable information terminal 7700 is less likely to be broken even when the portable information terminal 7700 falls down or external stress is applied to the portable information terminal 7700.

The portable information terminal 7700 can be used effectively in various situations because the portable information terminal 7700 is lightweight. For example, the portable information terminal 7700 can be used in the state where the upper portion of the housing 7701 is suspended by a clip or the like, or in the state where the housing 7701 is fixed to a wall by magnets or the like.

Figure 12I:
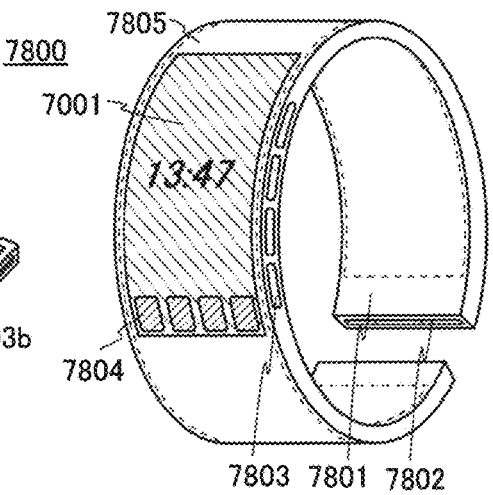

FIG. 12I illustrates an example of a wrist-watch-type portable information terminal. The portable information terminal 7800 includes a band 7801, the display portion 7001, an input-output terminal 7802, operation buttons 7803, or the like. The band 7801 has a function of a housing. A flexible battery 7805 can be mounted on the portable information terminal 7800. The battery 7805 may overlap with the display portion 7001 and the band 7801, for example.

The band 7801, the display portion 7001, and the battery 7805 have flexibility. Thus, the portable information terminal 7800 can be easily curved to have a desired shape.

With the operation buttons 7803, a variety of functions such as time setting, ON/OFF of the power, ON/OFF of wireless communication, setting and cancellation of manner mode, and setting and cancellation of power saving mode can be performed. For example, the functions of the operation button 7803 can be set freely by the operating system incorporated in the portable information terminal 7800.

By touching an icon 7804 displayed on the display portion 7001 with a finger or the like, application can be started.

The portable information terminal 7800 can employ near field communication that is a communication method based on an existing communication standard. In that case, for example, mutual communication between the portable information terminal 7800 and a headset capable of wireless communication can be performed, and thus hands-free calling is possible.

In the case where the input-output terminal 7802 is included in the portable information terminal 7800, data can be directly transmitted to and received from another information terminal via a connector. Charging through the input-output terminal 7802 is also possible. Note that charging of the portable information terminal described as an example in this embodiment can be performed by non-contact power transmission without using the input-output terminal.

This embodiment can be combined with any other embodiment as appropriate.

[Example 1]

In this example, results of an effect of plasma treatment which is performed on the separation layer are described.

First, a method for manufacturing samples is described with reference to FIGS. 1A to 1E. Four samples (Samples 1 and 2, and Comparative Samples 1 and 2) were prepared, and plasma treatments under respective conditions were performed on the respective separation layers.

[First Step]

First, the separation layer 102 was formed over the formation substrate 101.

A glass substrate was used as the formation substrate 101. A 30-nm-thick tungsten film was formed as the separation layer 102. The tungsten film was formed by a sputtering method under the following conditions: the flow rate of an Ar gas was 100 sccm, the power supply was 60 kW, the pressure was 2 Pa, and the substrate temperature was 100° C.

[Second Step]

Next, plasma treatment was performed on the surface of the separation layer 102 (see the arrows indicated by dotted lines in FIG. 1A).

Plasma treatment was performed on Sample 1 under an atmosphere containing an $N_2O$ gas and an $SiH_4$ gas. The plasma treatment was performed for 300 seconds under the following conditions: the flow rate of the $N_2O$ gas was 1200 sccm, the flow rate of the $SiH_4$ gas was 5 sccm, the power supply was 120 W, the pressure was 70 Pa, and the substrate temperature was 330° C.

Plasma treatment was performed on Sample 2 under an atmosphere containing an $N_2O$ gas, an $SiH_4$ gas, and an $NH_3$ gas. The plasma treatment was performed for 300 seconds under the following conditions: the flow rate of $N_2O$ gas was 1200 sccm, the flow rate of the $SiH_4$ gas was 5 sccm, the flow rate of the $NH_3$ gas was 250 sccm, the power supply was 500 W, the pressure was 70 Pa, and the substrate temperature was 330° C.

Plasma treatment was performed on the Comparative Sample 1 under an atmosphere containing an $N_2O$ gas. The plasma treatment was performed for 240 seconds under the following conditions: the flow rate of an $N_2O$ gas was 100 sccm, the power supply was 500 W, the pressure was 100 Pa, and the substrate temperature was 330° C.

Plasma treatment was performed on Comparative Sample 2 under an atmosphere containing an $N_2O$ gas and an $NH_3$ gas. The plasma treatment was performed for 240 seconds under the following conditions: the flow rate of the $N_2O$ gas was 1200 sccm, the flow rate of the $NH_3$ gas was 250 sccm, the power supply was 500 W, the pressure was 70 Pa, and the substrate temperature was 330° C.

Next, the layer 110 to be separated was formed over the separation layer 102 (see FIG. 1B). The structure of the layer 110 to be separated was a stack in which a first silicon oxynitride film (corresponding to the first layer 103), a silicon nitride film (corresponding to the second layer 104), a second silicon oxynitride film, a silicon nitride oxide film, and a third silicon oxynitride film were stacked in this order from the separation layer 102 side.

As the layer 110 to be separated, first, the first silicon oxynitride film was formed to a thickness of approximately 600 nm over the separation layer 102. The first silicon oxynitride film was formed by a plasma CVD method under the following conditions: the flow rates of an $SiH_4$ gas and an $N_2O$ gas were 75 sccm and 1200 sccm, respectively, the power supply was 120 W, the pressure was 70 Pa, and the substrate temperature was 330° C.

Next, a silicon nitride film was formed to a thickness of approximately 200 nm over the first silicon oxynitride film. The silicon nitride film was formed by a plasma CVD method under the following conditions: the flow rates of an $SiH_4$ gas, an $H_2$ gas, and an $NH_3$ gas were 30 sccm, 800 sccm, and 300 sccm, respectively, the power supply was 600 W, the pressure was 60 Pa, and the substrate temperature was 330° C.

Next, the second silicon oxynitride film was formed to a thickness of approximately 200 nm over the silicon nitride film. The second silicon oxynitride film was formed by a plasma CVD method under the following conditions: the flow rates of an $SiH_4$ gas and an $N_2O$ gas were 50 sccm and 1200 sccm, respectively, the power supply was 120 W, the pressure was 70 Pa, and the substrate temperature was 330° C.

Then, a silicon nitride oxide film was formed to a thickness of approximately 140 nm over the second silicon oxynitride film. The silicon nitride oxide film was formed by a plasma CVD method under the following conditions: the flow rates of an $SiH_4$ gas, an $H_2$ gas, an $N_2$ gas, an $NH_3$ gas, and an $N_2O$ gas were 110 sccm, 800 sccm, 800 sccm, 800 sccm, and 70 sccm, respectively, the power supply was 320 W, the pressure was 100 Pa, and the substrate temperature was 330° C.

After that, the third silicon oxynitride film was formed to a thickness of approximately 100 nm over the silicon nitride oxide film. The third silicon oxynitride film was formed by a plasma CVD method under the following conditions: the flow rates of an $SiH_4$ gas and an $N_2O$ gas were 10 sccm and 1200 sccm, respectively, the supplied power was 30 W, the pressure was 22 Pa, and the substrate temperature was 330° C.

After that, heat treatment was performed at 450° C. for 1 hour in a nitrogen atmosphere.

Then, the layer 110 to be separated was bonded to the substrate 121 with the bonding layer 122 (see FIG. 1C). An organic resin film was used as the substrate 121. An epoxy resin was used as the bonding layer 122.

[Cross-Sectional Observation]

Cross sections of the samples which were subjected to the heat treatment (the samples to which the substrates 121 were not attached) were observed. The cross sections were observed by scanning transmission electron microscopy (STEM).

Figure 13A:
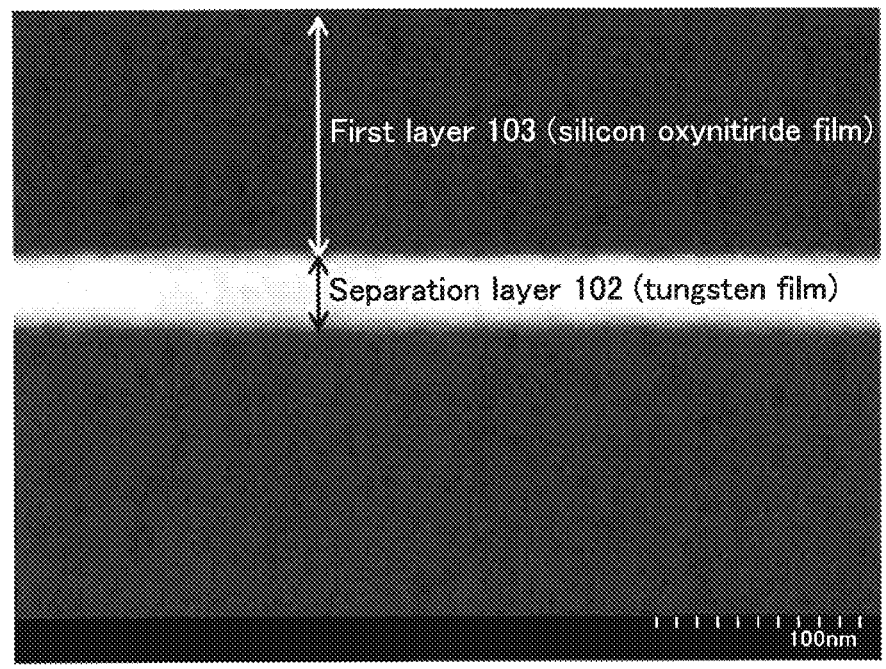
FIGS. 13A and 13B are cross-sectional TEM images according to Example 1.
Figure 13B:
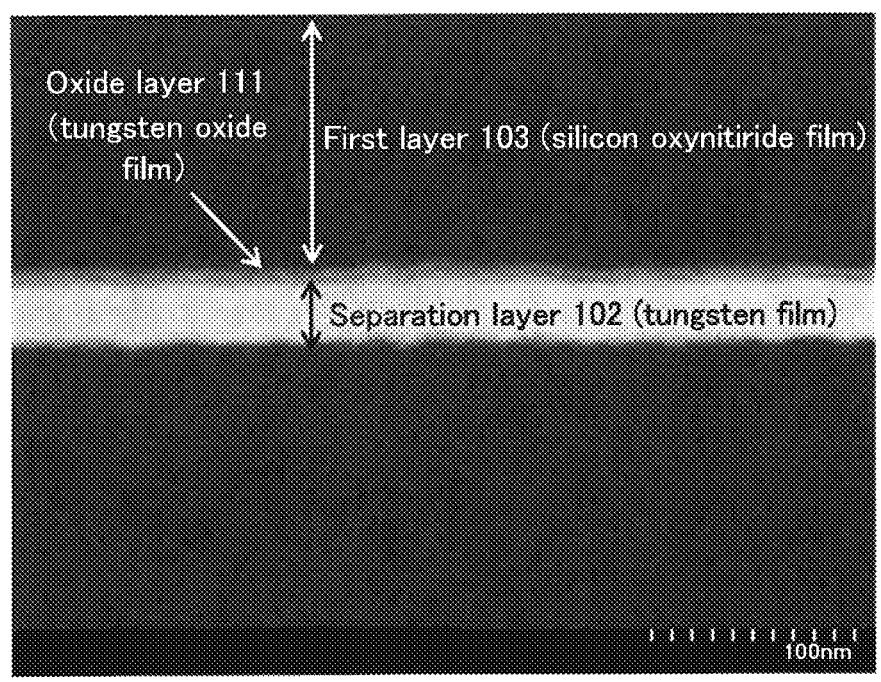

FIG. 13A is an observed cross-section of Sample 2, and FIG. 13B is an observed cross-section of Comparative Sample 1.

In Sample 2, a tungsten oxide film was not observed between the separation layer 102 (a tungsten film) and the first layer 103 (a silicon oxynitride film). Similarly, in Sample 1, a tungsten oxide film was not observed.

In contrast, in Comparative Sample 1, an approximately 10-nm-thick tungsten oxide film was observed between the tungsten film and the silicon oxynitride film. Similarly, in Comparative Sample 2, the tungsten oxide film was observed between the tungsten film and the silicon oxynitride film.

All samples were the same in that an $N_2O$ gas was used for the plasma treatment, but Comparative Sample 1 and Comparative Sample 2 are different from Sample 1 and Sample 2 in that an $SiH_4$ gas was not used for the plasma treatment. This indicates that by using an $N_2O$ gas and an $SiH_4$ gas for the plasma treatment, oxidation of the tungsten film is suppressed, whereby an oxide layer is prevented from being formed thick at the interface between the separation layer and the layer to be separated.

[Separation Test]

Figure 14A:
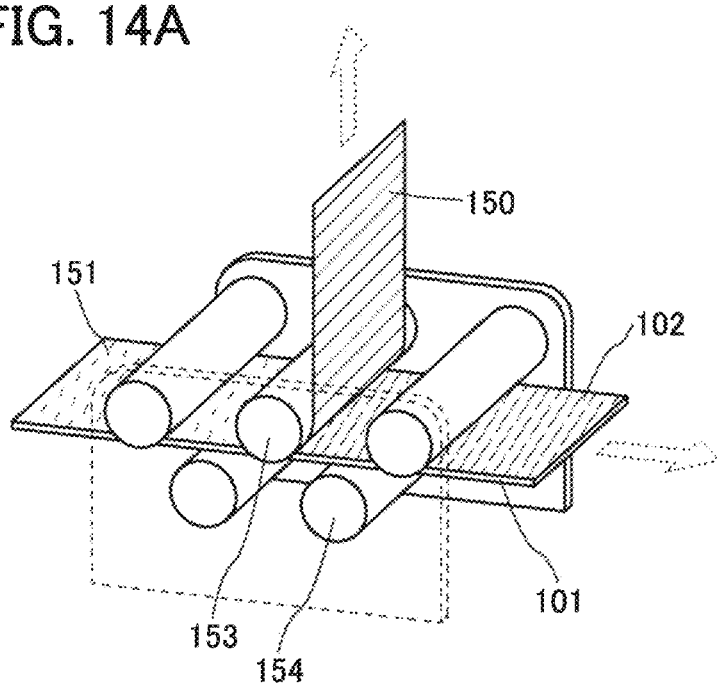
FIGS. 14A to 14C show a device used for measurement of force required for separation according to Example 1.

The force required to separate the layer 110 to be separated from the formation substrate 101 was evaluated in each of the samples of Example 1. A jig illustrated in FIG. 14A was used for the measurement. The jig includes a plurality of guide rollers 154 and a plurality of support rollers 153. A tape 151 is attached onto a layer 150 including a layer to be separated that is formed over the formation substrate 101, and an end portion of the tape 151 is partly separated in advance. Then, the formation substrate 101 is fixed to the jig so that the tape 151 is held by the support rollers 153, and the tape 151 and the layer 150 are positioned perpendicular to the formation substrate 101. The force required for separating was measured as follows: the tape 151 was pulled at a rate of 20 mm/min in a direction perpendicular to the formation substrate 101 to separate the layer 150 from the formation substrate 101, and the pulling force in the perpendicular direction was measured. During the separation, the formation substrate 101 moves in the plane direction along the guide rollers 154 with the separation layer 102 exposed. The support rollers 153 and the guide rollers 154 are rotatable so that the formation substrate 101 and the layer 150 are not affected by friction during the move.

For the separation test, a compact table-top universal tester (EZ-TEST EZ-S-50N) manufactured by Shimadzu Corporation was used, and an adhesive tape/adhesive sheet testing method based on standard number JIS Z0237 of Japanese Industrial Standards (JIS) was employed. Each sample had a size of 126 mm×25 mm.

Table 1 shows gases and time used for plasma treatment, force required for separation, and whether or not the oxide layer 111 was able to be observed in each sample in Example 1. The force required for the separation is the average value obtained by measurement at 6 points of each sample.

TABLE 1

| | Gases used for plasma treatment (sccm) | | | Treatment time (sec) | Force required for separation (N) | Oxide layer 111 |
|---|---|---|---|---|---|---|
| | $N_2O$ | $SiH_4$ | $NH_3$ | | | |
| Sample 1 | 1200 | 5 | — | 300 | 0.127 | unobservable |
| Sample 2 | 1200 | 5 | 250 | 300 | 0.073 | unobservable |
| Comparative Sample 1 | 100 | — | — | 240 | 0.074 | observable |
| Comparative Sample2 | 1200 | — | 250 | 240 | 0.074 | observable |

In the case where the force required for separation is greater than or equal to 0.14 N, the separated layer 110 tends to remain on the formation substrate 101 side after the separation. In contrast, in the case where the force is less than 0.14 N, favorable separation can be performed without the separated layer 110 remaining on the formation substrate 101.

As shown in Table 1, the force required for the separation was small so that each of the samples in Example 1 can be separated without remaining the layer 110 to be separated on the formation substrate 101. An $N_2O$ gas and an $SiH_4$ gas were used for the plasma treatment of Sample 1, whereas an $NH_3$ gas was used together with the $N_2O$ gas and the $SiH_4$ gas for the plasma treatment of Sample 2. This indicates that by using both the $N_2O$ gas and the $SiH_4$ gas for plasma treatment, the force required for the separation can be reduced.

[Measurement of Transmittance]

Transmittance of the layer 150 $i$ which was separated from the formation substrate 101 (see FIG. 14B) of each of the samples in Example 1 was measured.

Figure 15:
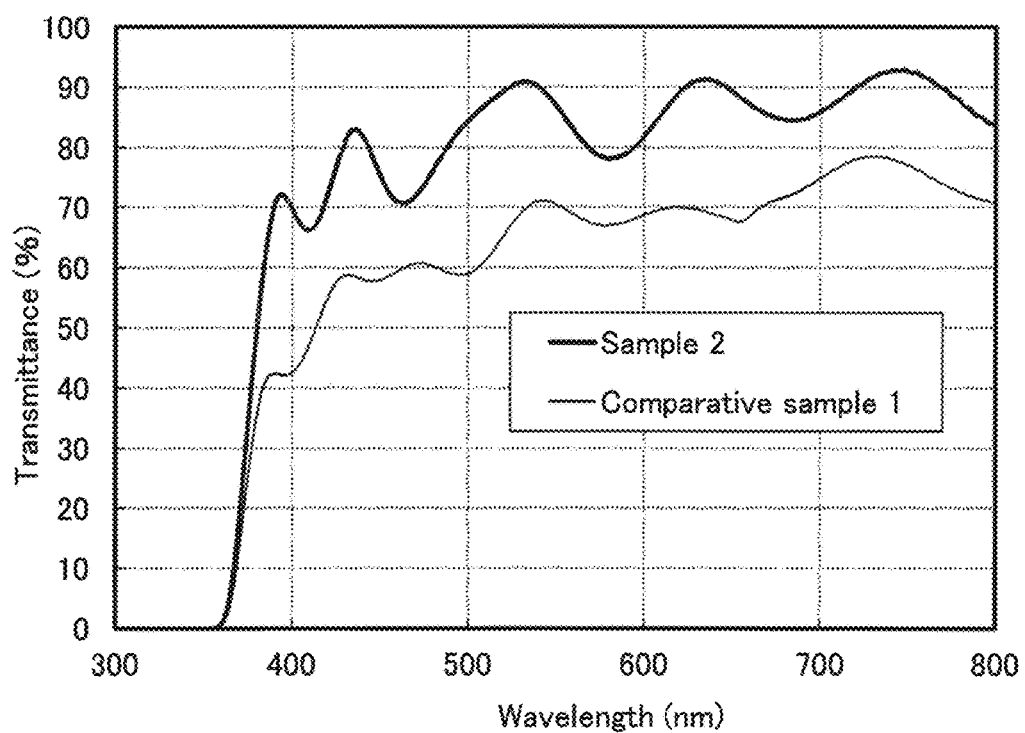
FIG. 15 shows transmittance of samples according to Example 1.

FIG. 15 shows transmittance (%) of light in a wavelength range of 300 nm to 800 nm of each of Sample 2 and Comparative Sample 1.

The visible light transmittance of Sample 2 in which the tungsten oxide film was not observed is higher than that of Comparative Sample 1 in which the tungsten oxide film was observed in cross sectional observation. Specifically, the average value of the transmittance of light in a wavelength range of 450 nm to 700 nm of Comparative Sample 1 is about 67%, whereas that of Sample 2 is about 84%. This suggests that the decrease in light extraction efficiency of the light emitting device and the display device can be suppressed by forming a thin oxide layer such that the cross section thereof is difficult to observe with an electron microscope or the like.

[XPS Analysis Results]

Figure 14B:
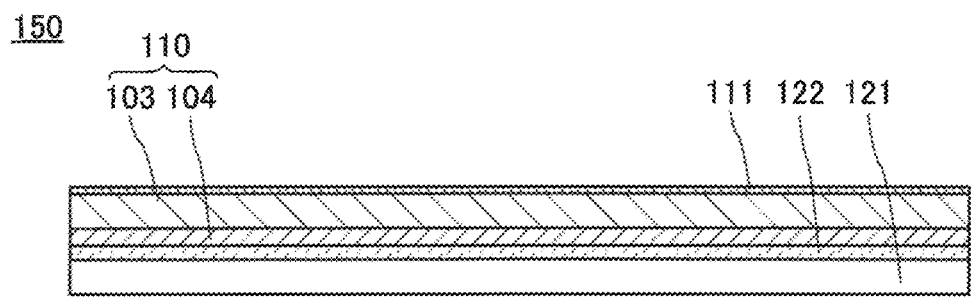

The composition analysis by XPS was performed on a separation surface of the layer 150 which was separated from the formation substrate 101 in each of the samples of Example 1 (see FIG. 14B).

Figure 16:
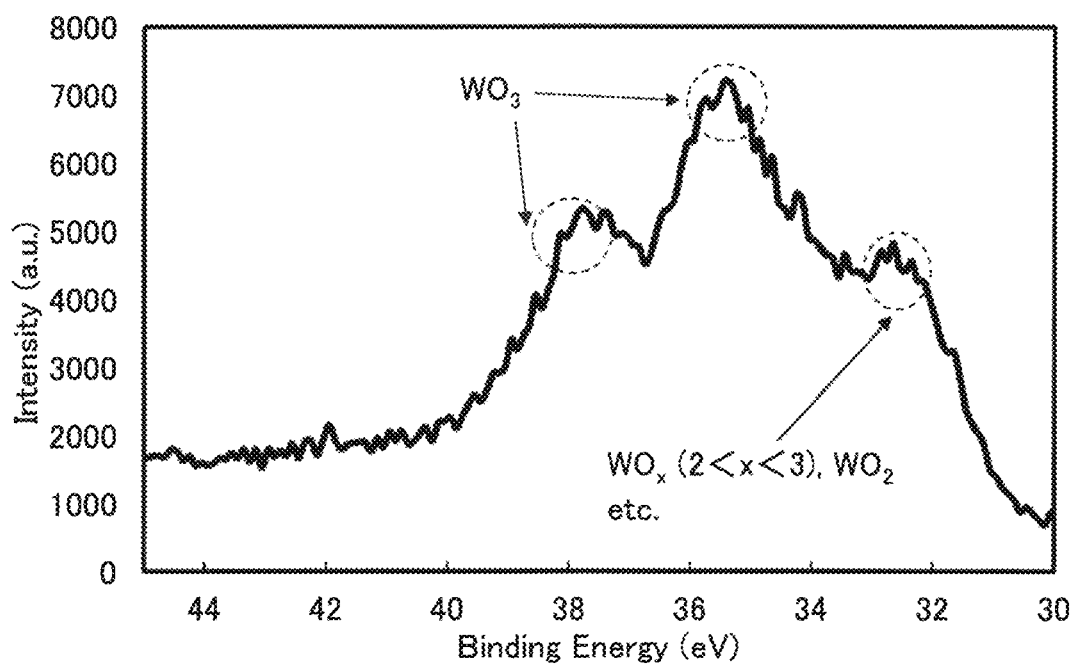
FIG. 16 shows an XPS analysis result of a sample according to Example 1.
Figure 17A:
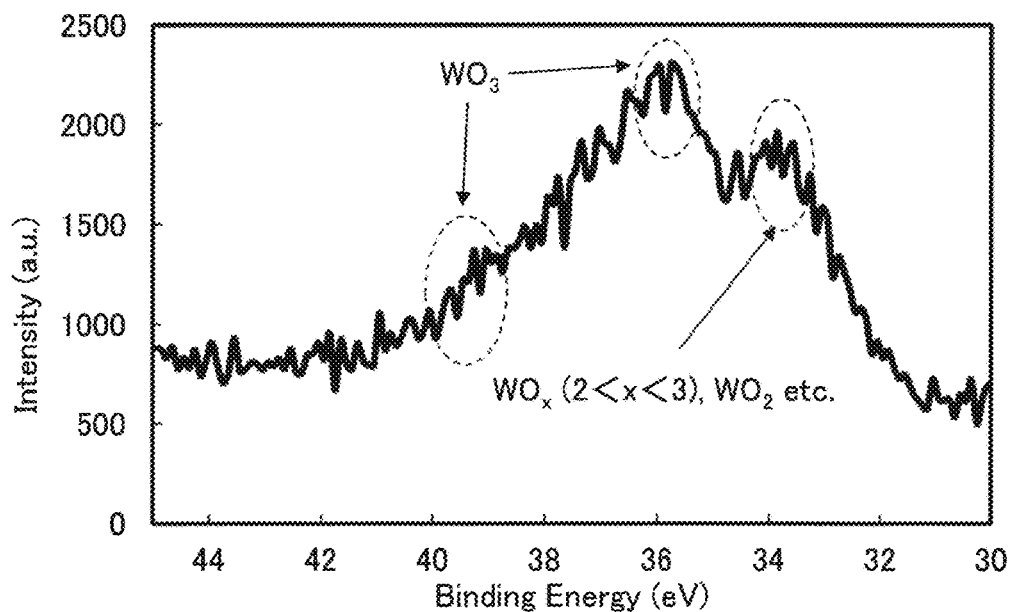
FIGS. 17A and 17B show XPS analysis results of samples according to Example 1.
Figure 17B:
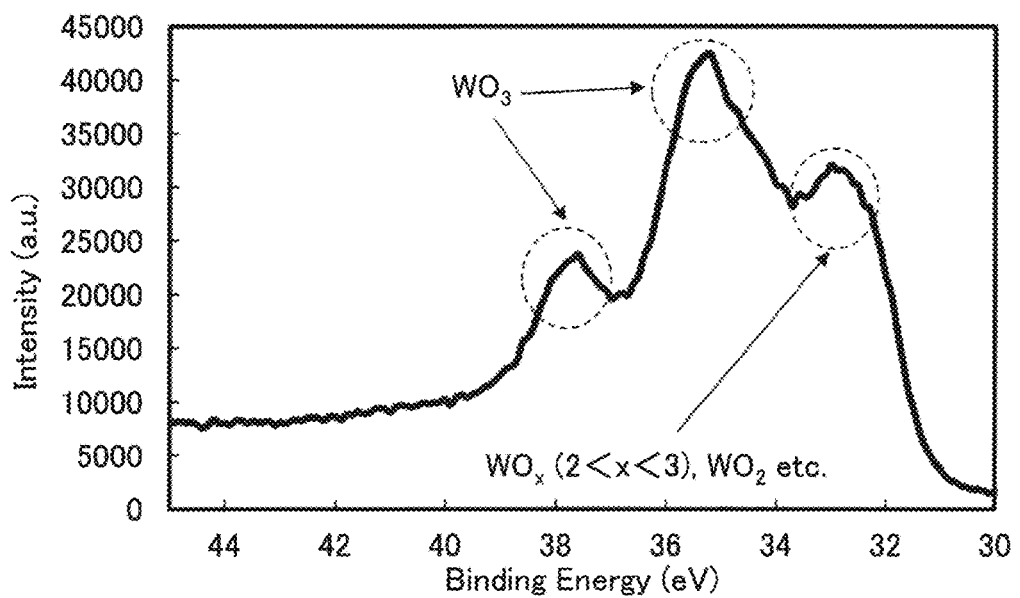

FIGS. 16, 17A, and 17B show of the peaks attributed to the W4f orbitals. FIGS. 16, 17A, and 17B are results of Sample 1, Sample 2, and Comparative Sample 1, respectively.

The peaks derived from $WO_3$ and the peak derived from $WO_x$ (2<x<3), $WO_2$, tungsten nitride, or the like were observed in each of the samples.

In the XPS spectrum of Sample 1, the peak in the range of greater than or equal to 32.5 eV and less than or equal to 33.5 eV (corresponding to the peak having the highest intensity derived from $WO_x$ (2<x<3), $WO_2$, tungsten nitride, or the like) has 0.67 times the intensity of the peak in the range from greater than or equal to 34.5 eV and less than or equal to 35.5 eV (corresponding to the peak with the highest intensity derived from $WO_3$).

In the XPS spectrum of Sample 2, the peak in the range of greater than or equal to 33.5 eV and less than or equal to 34.5 eV (corresponding to the peak having the highest intensity derived from $WO_x$ (2<x<3), $WO_2$, tungsten nitride, or the like) has 0.76 times the intensity of the peak in the range from greater than or equal to 35.5 eV and less than or equal to 36.5 eV (corresponding to the peak with the highest intensity derived from $WO_3$).

In the XPS spectrum of Comparative Sample 1, the peak in the range of greater than or equal to 32.5 eV and less than or equal to 33.5 eV (corresponding to the peak having the highest intensity derived from $WO_x$ (2<x<3), $WO_2$, tungsten nitride, or the like) has 0.76 times the intensity of the peak in the range from greater than or equal to 34.5 eV and less than or equal to 35.5 eV (corresponding to the peak with the highest intensity derived from $WO_3$).

The intensity of peaks derived from $WO_x$ (2<x<3), $WO_2$, tungsten nitride, or the like of Sample 2 and Comparative Sample 1 with respect to the intensity of a peak derived from $WO_3$ is higher than that of Sample 1. This indicates that Sample 2 and Comparative Sample 1 contain larger amount of tungsten oxide having a small oxidation number, which is formed by the reduction of $WO_3$ with hydrogen supplied to the oxide layer. Alternatively, this indicates that a larger amount of tungsten nitride is generated due to nitrogen supplied to the oxide layer in Sample 2 and Comparative Sample 1.

In the XPS spectrum of Sample 1, the peak in the range of greater than or equal to 32.5 eV and less than or equal to 33.5 eV has lower intensity than the peak in the range of greater than or equal to 37.5 eV and less than or equal to 38.5 eV (corresponding to the peak with the second highest intensity derived from $WO_3$).

In the XPS spectrum of Sample 2, the peak in the range of greater than or equal to 33.5 eV and less than or equal to 34.5 eV has higher intensity than the peak in the range of greater than or equal to 38.5 eV and less than or equal to 39.5 eV (corresponding to the peak with the second highest intensity derived from $WO_3$).

In the XPS spectrum of Comparative Sample 1, the peak in the range of greater than or equal to 32.5 eV and less than or equal to 33.5 eV has higher intensity than the peak in the range of greater than or equal to 37.5 eV and less than or equal to 38.5 eV (corresponding to the peak with the second highest intensity derived from $WO_3$).

Because the amount of remaining tungsten compound in Sample 2 was very small, the position of the peak with the second highest intensity derived from $WO_3$ was difficult to be identified due to noise. Therefore, the position of the peak with the second highest intensity derived from $WO_3$ in Sample 2 was identified based on the relative positions of the peak of Sample 1 and that of Comparative Sample 1. The position of the peak with the second highest intensity derived from $WO_3$ in each of Sample 1 and Comparative Sample 1 was at a position of approximately +3 eV from the peak with the highest intensity derived from $WO_3$, or at a position of approximately +7 eV from the peak with the highest intensity derived from $WO_x$ (2<x<3), $WO_2$, tungsten nitride, or the like. Accordingly, the peak in Sample 2 in the range of greater than or equal to 33.5 eV and less than or equal to 34.5 eV corresponding to these positions was used as the position of the peak with the second highest intensity derived from $WO_3$.

Sample 2 and Comparative Sample 1 are different from Sample 1 in that the peak derived from $WO_x$ (2<x<3), $WO_2$, tungsten nitride, or the like has higher intensity than that of the peak with the second highest intensity derived from $WO_3$. This indicates that a larger amount of tungsten oxide or tungsten nitride with a small oxidation number exists in Sample 2 and Comparative Sample 1.

The force required for separation of Sample 2 and Comparative Sample 1 is smaller than that of Sample 1. The above results show that the force required for separation of Sample 2 and Comparative Sample 1 decreases because the presence of a large amount of tungsten oxide and tungsten nitride with a small oxidation numbers reduces the mechanical strength of the oxide layer.

[Resistance Measurement]

The resistance of the separation surface of the layer 150 that was separated from the formation substrate 101 was measured.

Figure 14C:
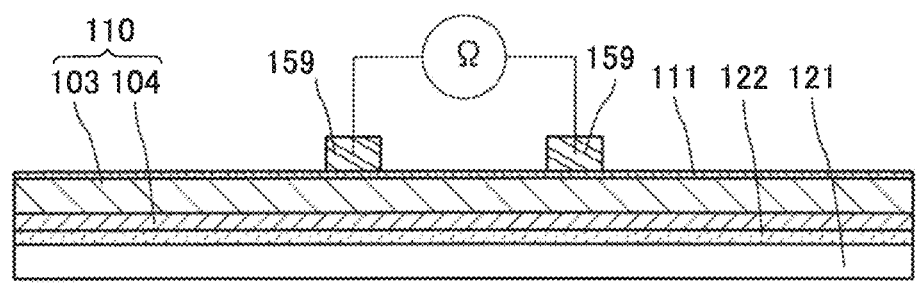

In this example, titanium electrodes 159 were formed on the separation surface of the layer 150 as illustrated in FIG. 14C, and current-voltage characteristics of the separation surface were measured to evaluate the resistance between the electrodes. The width and length of the titanium electrode 159 were 1 mm and 70.9 mm, respectively. In this example, Sample 2 and Comparative Sample 1 were evaluated. Note that the resistance is the average value obtained by measurement at 6 points of each sample.

FIG. 18 shows the current-voltage characteristics of Sample 2. The resistance between the electrodes is $1.69 \times 10^{12} \Omega$. This value is higher than that of Comparative Sample 1 ($7.16 \times 10^5 \Omega$). This indicates that, in one embodiment of the present invention, the separation surface of the layer 150 has a high insulating property. Therefore, it is shown that parasitic capacitance is hardly generated, whereby the fluctuation in characteristics of elements such as a transistor or the like can be suppressed.

[SIMS Analysis]

Hydrogen and nitrogen concentrations in the depth direction of each of Sample 2 and Comparative Sample 1 after the heat treatment, which were measured by SIMS, are described.

Figure 19A:
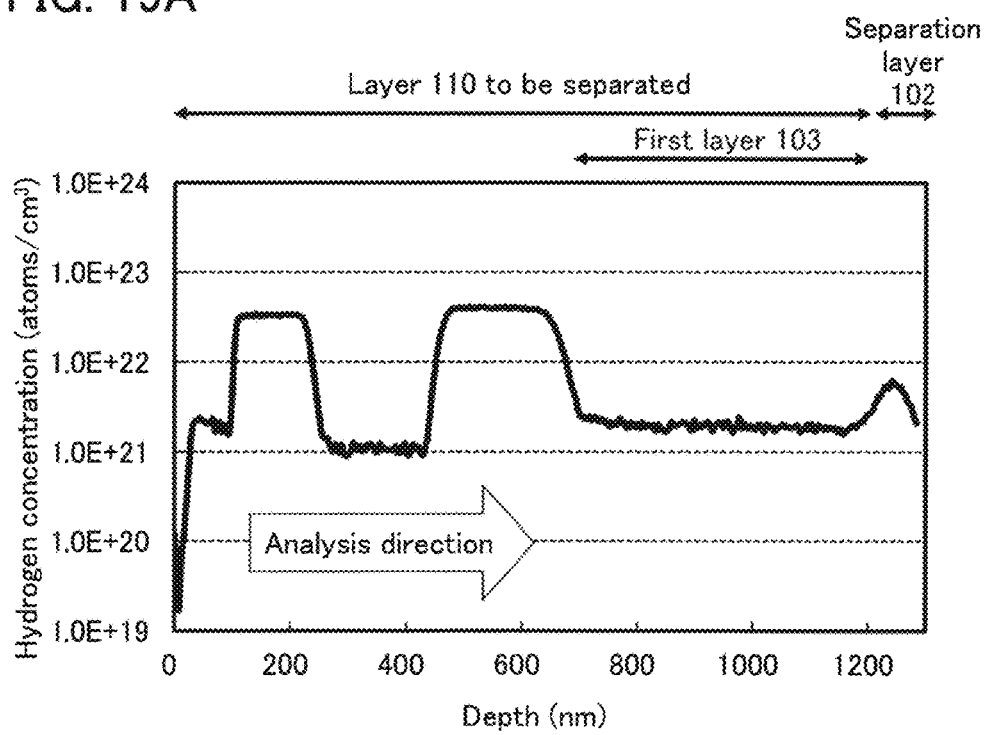
FIGS. 19A and 19B show SIMS analysis results according to Example 1.
Figure 19B:
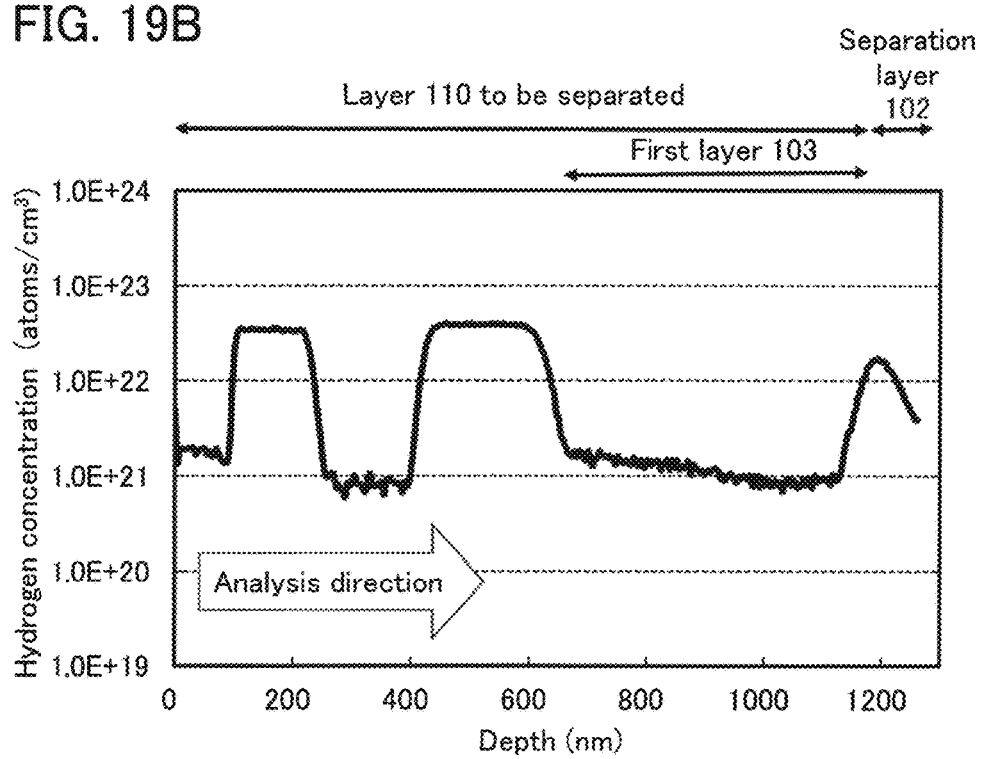
Figure 20A:
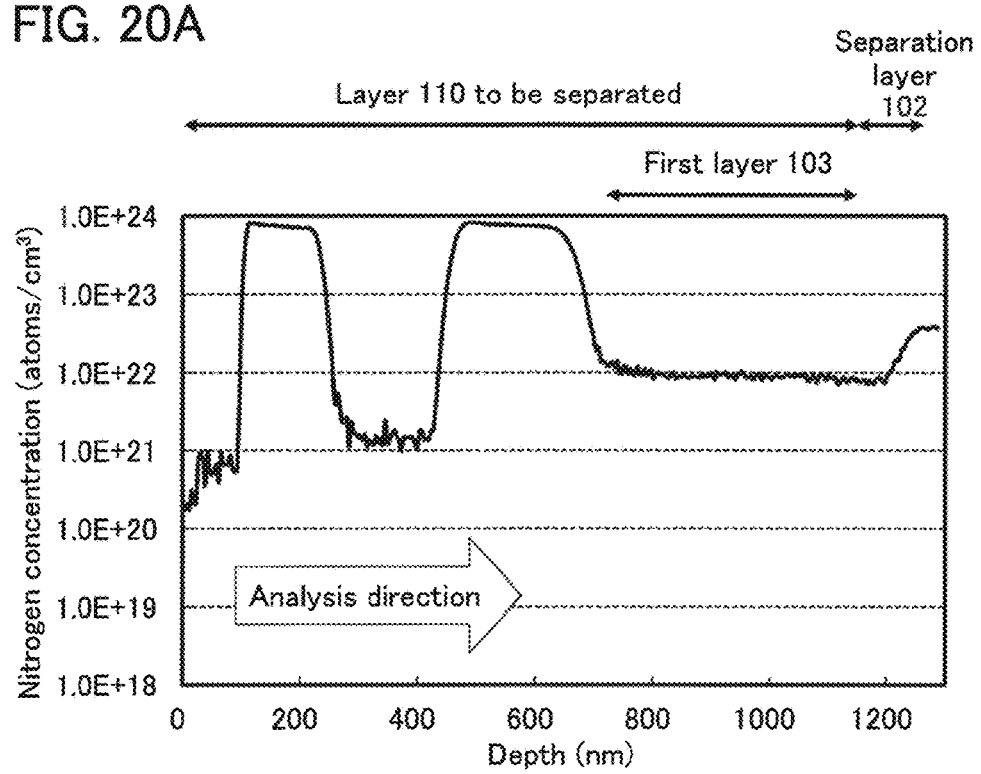
FIGS. 20A and 20B show SIMS analysis results according to Example 1.
Figure 20B:
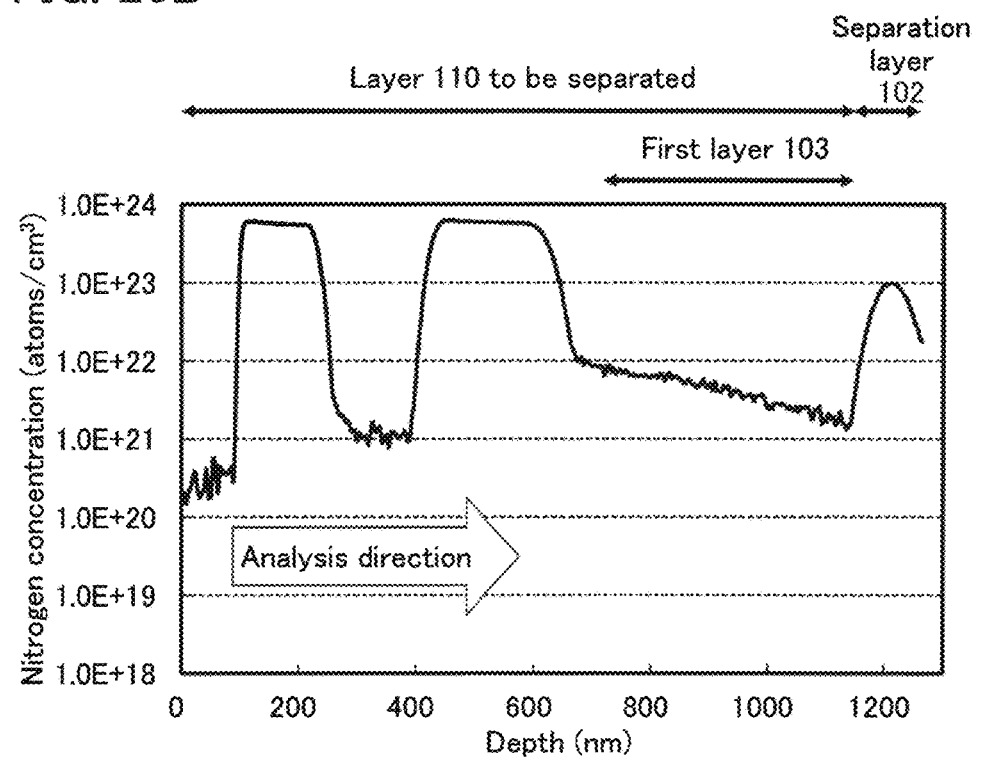

FIG. 19A shows a hydrogen concentration profile of Sample 2, and FIG. 19B shows that of Comparative Sample 1. FIG. 20A shows the nitrogen concentration profile of Sample 2, and FIG. 20B shows that of Comparative Sample 1. The analysis was performed from the layer 110 to be separated side. The oxide layer 111 is not illustrated because the thickness of the oxide layer 111 is extremely small in view of the scales of the horizontal axes in FIGS. 19A and 19B and FIGS. 20A and 20B. The oxide layer 111 is positioned between the first layer 103 and the separation layer 102 as shown in FIG. 1B.

First, the hydrogen concentration profiles of Comparative Sample 1 and Sample 2 are compared with reference to FIGS. 19A and 19B. In Comparative Sample 1, it is found that the hydrogen concentration of the first layer 103 decreases from the second layer 104 side to the separation layer 102 side. In contrast, such a decrease is not observed in Sample 2, and the hydrogen concentration was substantially constant in the range from $1.0 \times 10^{21}$ atoms/$cm^3$ to $1.0 \times 10^{22}$ atoms/$cm^3$. In addition, a region with a hydrogen concentration higher than that of the first layer 103 is observed between the first layer 103 and the separation layer 102 (in the oxide layer 111 or the vicinity thereof). The hydrogen concentration of the region of Comparative Sample 1 is higher than that of Sample 2.

Next, the nitrogen concentration profiles of Comparative Sample 1 and Sample 2 are compared with reference to FIGS. 20A and 20B. In Comparative Sample 1, in a manner similar to the hydrogen concentration, it was found that the nitrogen concentration of the first layer 103 decreases from the second layer 104 side to the separation layer 102 side. In contrast, such a decrease is not observed in Sample 2, and the nitrogen concentration was substantially constant in a range from $5.0 \times 10^{20}$ atoms/$cm^3$ to $1.0 \times 10^{23}$ atoms/$cm^3$. In addition, a region with a nitrogen concentration higher than that of the first layer 103 is observed between the first layer 103 and the separation layer 102 (in the oxide layer 111 or the vicinity thereof). The nitrogen concentration of the region of Comparative Sample 1 is higher than that of Sample 2.

The above results indicate that the amount of hydrogen and that of nitrogen that are necessary to be supplied to the oxide layer 111 from the first layer 103 of Sample 2 is smaller than those of Comparative Sample 1. This is because hydrogen and nitrogen are supplied to the oxide layer 111 in advance by plasma treatment in the case of Sample 2. Because the amount of hydrogen and that of nitrogen that are necessary to be supplied from the first layer 103 to the oxide layer 111 is small, the thickness of the first layer 103 can be small. Thus, the productivity can be increased. Furthermore, the manufacturing cost can be reduced.

[Example 2]

In this example, the effect of the thickness of the first layer 103 is explained.

First, a method for manufacturing samples is described with reference to FIGS. 1A to 1E. Three samples (Samples A to C) were prepared, and the samples had the first layers 103 with different thickness.

[First Step]

First, the separation layer 102 was formed over the formation substrate 101. The structure of the formation substrate 101 and the deposition conditions of the separation layer 102 are the same as those in Example 1.

[Second Step]

Next, plasma treatment was performed on the surface of the separation layer 102 (see the arrows indicated by dotted lines in FIG. 1A).

In this example, plasma treatment was performed under an atmosphere containing an $N_2O$ gas, an $SiH_4$ gas, and an $NH_3$ gas. The plasma treatment was performed for 240 seconds under the following conditions: the flow rate of the $N_2O$ gas was 1200 sccm, the flow rate of the $SiH_4$ gas was 5 sccm, the flow rate of the $NH_3$ gas was 250 sccm, the power supply was 500 W, the pressure was 70 Pa, and the substrate temperature was 330° C.

Next, the layer 110 to be separated was formed over the separation layer 102. The structure of the layer 110 to be separated was a stack in which a first silicon oxynitride film (corresponding to the first layer 103), the silicon nitride film (corresponding to the second layer 104), the second silicon oxynitride film, the silicon nitride oxide film, and the third silicon oxynitride film were stacked in this order from the separation layer 102 side.

As the layer 110 to be separated, first, the first silicon oxynitride film was formed over the separation layer 102. The first silicon oxynitride film was formed by a plasma CVD method under the following conditions: the flow rates of an $SiH_4$ gas and an $N_2O$ gas were 75 sccm and 1200 sccm, respectively, the power supply was 120 W, the pressure was 70 Pa, and the substrate temperature was 330° C.

The thickness of the first silicon oxynitride film was set to about 600 nm in Sample A, about 400 nm in Sample B, and about 200 nm in Sample C.

A silicon nitride film with a thickness of about 200 nm, a second silicon oxynitride film with a thickness of about 200 nm, a silicon nitride oxide film with a thickness of about 140 nm, and a third silicon oxynitride film with a thickness of about 100 nm were stacked in this order over the first silicon oxynitride film. The deposition conditions of each layer are the same as those of Example 1.

After that, heat treatment was performed at 450° C. for 1 hour in a nitrogen atmosphere.

Then, the layer 110 to be separated was bonded to the substrate 121 with the bonding layer 122 (see FIG. 1C).

The force required for separating the layer to be separated from the formation substrate in each sample fabricated under the above-described conditions was measured. The force required for separation of Samples A and B was 0.066 N, and that of Sample C was 0.075 N.

Plasma treatment using only a $N_2O$ gas tends to reduce the yield of separation when the thickness of the first layer 103 is small. This is probably because the amount of hydrogen and that of nitrogen supplied from the first layer 103 to the oxide layer 111 is insufficient. In contrast, it was found in the present Example that a decrease in separability can be suppressed even when the thickness of the first layer 103 is reduced, and both high separability and high productivity can be achieved. This is probably because the amounts of hydrogen and nitrogen which are necessary to be supplied from the first layer 103 to the oxide layer 111 can be reduced. In other words, this indicates that hydrogen and nitrogen can be supplied to the oxide layer 111 by plasma treatment using an $N_2O$ gas, an $SiH_4$ gas, and an $NH_3$ gas.

This application is based on Japanese Patent Application serial no. 2014-151486 filed with Japan Patent Office on Jul. 25, 2014, the entire contents of which are hereby incorporated by reference.

What is claimed is:

1. A semiconductor device comprising:
   a first flexible substrate;
   an oxide layer over the first flexible substrate;
   an insulating film over the oxide layer;
   a light-emitting element over the insulating film; and
   a second flexible substrate over the light-emitting element,
   wherein a hydrogen concentration of the insulating film is substantially within a range from $1.0 \times 10^{21}$ atoms/cm$^3$ to $1.0 \times 10^{22}$ atoms/cm$^3$.

2. The semiconductor device according to claim 1, wherein the oxide layer comprises tungsten oxide.

3. The semiconductor device according to claim 1, further comprising a bonding layer between the first flexible substrate and the oxide layer,
   wherein an average transmittance of a stack including the first flexible substrate, the bonding layer, the oxide layer, and the insulating film with respect to light with a wavelength from 450 nm to 700 nm is greater than or equal to 70%.

4. An electronic device comprising the semiconductor device according to claim 1.

5. The semiconductor device according to claim 1, wherein a thickness of the oxide layer is greater than or equal to 1 nm and less than 5 nm.

6. The semiconductor device according to claim 1, wherein a resistivity of the oxide layer is greater than or equal to $1.0 \times 10^4$ Ω·m and less than or equal to $1.0 \times 10^{15}$ Ω·m.

7. The semiconductor device according to claim 1, wherein the insulating film is any one of a silicon oxide film, a silicon nitride film, a silicon oxynitride film, and a silicon nitride oxide film.

8. A semiconductor device comprising:
   a first flexible substrate;
   an oxide layer over the first flexible substrate;
   an insulating film over the oxide layer;
   a light-emitting element over the insulating film; and
   a second flexible substrate over the light-emitting element,
   wherein a nitrogen concentration of the insulating film is substantially within a range from $5.0 \times 10^{20}$ atoms/cm$^3$ to $1.0 \times 10^{23}$ atoms/cm$^3$.

9. The semiconductor device according to claim 8, wherein the oxide layer comprises tungsten oxide.

10. The semiconductor device according to claim 8, further comprising a bonding layer between the first flexible substrate and the oxide layer,
    wherein an average transmittance of a stack including the first flexible substrate, the bonding layer, the oxide layer, and the insulating film with respect to light with a wavelength from 450 nm to 700 nm is greater than or equal to 70%.

11. An electronic device comprising the semiconductor device according to claim 8.

12. The semiconductor device according to claim 8, wherein a thickness of the oxide layer is greater than or equal to 1 nm and less than 5 nm.

13. The semiconductor device according to claim 8, wherein a resistivity of the oxide layer is greater than or equal to $1.0 \times 10^4$ Ω·m and less than or equal to $1.0 \times 10^{15}$ Ω·m.

14. The semiconductor device according to claim 8, wherein the insulating film is any one of a silicon oxide film, a silicon nitride film, a silicon oxynitride film, and a silicon nitride oxide film.

\* \* \* \* \*